US007300740B2

(12) United States Patent
Yamasaki et al.

(10) Patent No.: US 7,300,740 B2
(45) Date of Patent: *Nov. 27, 2007

(54) LITHOGRAPHIC PRINTING PLATE PRECURSOR AND LITHOGRAPHIC PRINTING METHOD

(75) Inventors: Sumiaki Yamasaki, Shizuoka (JP); Akihiro Endo, Shizuoka (JP)

(73) Assignee: Fujifilm Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 11/362,030

(22) Filed: Feb. 27, 2006

(65) Prior Publication Data

US 2006/0194149 A1 Aug. 31, 2006

(30) Foreign Application Priority Data

Feb. 28, 2005 (JP) ...................... P . 2005-053542
Feb. 28, 2005 (JP) ...................... P . 2005-054293

(51) Int. Cl.
*G03C 1/76* (2006.01)
*G03C 1/492* (2006.01)
*G03C 1/494* (2006.01)
*G03F 7/00* (2006.01)
*G03F 5/18* (2006.01)

(52) U.S. Cl. .............................. 430/270.1; 430/281.1; 430/288.1; 430/302; 430/309; 430/434; 430/435; 430/494

(58) Field of Classification Search ............ 430/270.1, 430/281.1, 288.1, 302, 309, 434, 435, 494
See application file for complete search history.

(56) References Cited

U.S. PATENT DOCUMENTS

2004/0197701 A1* 10/2004 Mitsumoto et al. ...... 430/270.1
2005/0008971 A1* 1/2005 Mitsumoto et al. ...... 430/270.1
2005/0074692 A1* 4/2005 Makino et al. .......... 430/270.1
2005/0244746 A1* 11/2005 Makino et al. .......... 430/270.1

FOREIGN PATENT DOCUMENTS

EP 1 170 123 A2 * 1/2002
EP 1403043 A2 3/2004
EP 1 520 694 A2 * 4/2005
EP 1 594 003 A1 * 11/2005
EP 1634898 A2 3/2006
JP 2-304441 A 12/1990
JP 3-56177 A 3/1991
JP 7-159838 A 6/1995
JP 8-320551 A 12/1996
JP 10-282679 A 10/1998
JP 11-30858 A 2/1999

* cited by examiner

*Primary Examiner*—Geraldina Visconti
(74) *Attorney, Agent, or Firm*—Birch, Stewart, Kolasch & Birch, LLP

(57) ABSTRACT

A lithographic printing plate precursor capable of forming an image without alkali development, comprising a hydrophilic support and a laser-sensitive photopolymerizable layer, wherein the photopolymerizable layer or other layer included in the lithographic printing plate precursor contains a copolymer containing at least a repeating unit having at least one ethylenically unsaturated bond and a repeating unit having at least two functional groups capable of interacting with a surface of the support or a copolymer containing at least a repeating unit having at least two ethylenically unsaturated bonds and a repeating unit having at least one functional group capable of interacting with a surface of the support.

11 Claims, No Drawings

LITHOGRAPHIC PRINTING PLATE PRECURSOR AND LITHOGRAPHIC PRINTING METHOD

FIELD OF THE INVENTION

The present invention relates to a lithographic printing plate precursor capable of undergoing a so-called direct plate-making, which can be directly plate-made by scanning of laser beam based on digital signals, for example, a computer, and a lithographic printing method using the lithographic printing plate precursor.

BACKGROUND OF THE INVENTION

Heretofore, negative-working lithographic printing plate precursors have been widely known and various kinds of photosensitive layers (image-recording layers) have also been known. The photosensitive layers include, for example, a diazo resin-containing type, a photopolymerization type and a photo-crosslinking type. In order to prepare a lithographic printing plate, it is ordinarily conducted that a transparent negative original (a lith film) is placed on such a lithographic printing plate precursor and the lithographic printing plate precursor was exposed imagewise using an ultraviolet ray. However, such operations require a great deal of time and effort. In recent years, with the progress of image-forming techniques, a computer-to-plate technique has been developed wherein the plate-making is conducted by laser exposure based on digitized image data, for example, a computer, directly to the lithographic printing plate precursor, without using a lith film. Lithographic printing plate precursors of high-sensitive laser recording system used for the technique have also been developed.

For the photosensitive layer used in the lithographic printing plate precursor of laser recording system, the photopolymerization type is most suitable from the standpoint of high-sensitivity. However, since adhesion of the sensitive layer of photopolymerization type (photopolymerizable layer) to a support is not necessarily strong, disadvantages occur in that a solid image portion fails and that a fine line or a highlight portion becomes thin or drops out, when a lithographic printing plate prepared therefrom is subjected to printing of high-speed and a large volume. Therefore, the adhesion between the photosensitive layer and the support is an important factor in the lithographic printing plate precursor of high-sensitive photopolymerization type, and a large number of investigations and developments have been made.

For instance, it is known to provide a polymer containing a polymerizable group having an ethylenically unsaturated bond and a phosphoric acid group between a photosensitive layer of polymerization type and a support (refer to JP-A-2-304441 (the term "JP-A" as used herein means an "unexamined published Japanese patent application")). Also, techniques are known wherein a functional group capable of causing an addition reaction with a radical is provided on a surface of support by a covalent bond to impart adhesion to a photosensitive layer of photopolymerization type (refer to JP-A-3-56177, JP-A-7-159838 and JP-A-8-320551).

Further, it is also known to provide a layer containing a compound prepared by hydrolysis and dehydration condensation of a silane coupling agent having an ethylenic double bond and a compound having an alkyleneoxide chain and an acryloyl group or a methacryloyl group in its molecule between a photosensitive layer and a support (refer to JP-A-10-282679).

Moreover, a technique of incorporating a phosphoric ester compound having a (meth)acryloyl group into a photosensitive layer to improve adhesion to a support is known (refer to JP-A-11-30858).

SUMMARY OF THE INVENTION

However, these hereto known techniques are still insufficient in any one of fine line reproducibility, printing durability, stain resistance and on-machine developing property from the practical stand point. Therefore, further improvements have been required.

The present invention aims to respond to such requirements. More specifically, an object of the invention is to provide a lithographic, printing plate precursor which is capable of forming an image without alkali development after laser exposure, and which is excellent in all of the fine line reproducibility, printing durability, stain resistance and on-machine developing property.

As a result of various investigations, the inventor has found that the above-described object can be achieved by incorporating a copolymer having a specific group into a photopolymerizable layer or other layer.

Specifically, the present invention includes the following items.

1. A lithographic printing plate precursor capable of forming an image without alkali development comprising a hydrophilic support having thereon a laser-sensitive photopolymerizable layer, wherein the photopolymerizable layer or other layer contains (AI) a copolymer containing at least (a101) a repeating unit having at least one ethylenically unsaturated bond and (a102) a repeating unit having at least two functional groups capable of interacting with a surface of the support or (AII) a copolymer containing at least (a201) a repeating unit having at least two ethylenically unsaturated bonds and (a202) a repeating unit having at least one functional group capable of interacting with a surface of the support.
2. The lithographic printing plate precursor as described item 1 above, wherein the copolymer further contains (a3) a repeating unit having at least one hydrophilic functional group.
3. The lithographic printing plate precursor as described in item 1 or 2 above, wherein the photopolymerizable layer contains an infrared absorbing agent.
4. The lithographic printing plate precursor as described in any one of items 1 to 3 above, wherein the photopolymerizable layer contains a microcapsule.
5. The lithographic printing plate precursor as described in any one of items 1 to 4 above, wherein the other layer is an undercoat layer provided between the support and the photopolymerizable layer and the undercoat layer contains the copolymer.
6. A lithographic printing method comprising after loading the lithographic printing plate precursor as described in any one of items 1 to 5 above on a printing machine and conducting imagewise laser exposure thereto or after conducting imagewise laser exposure to the lithographic printing plate precursor as described in any one of items 1 to 5 above and loading it on a printing machine, supplying printing ink and dampening water to the lithographic printing plate precursor to remove a laser unexposed area of the photopolymerizable layer of the lithographic printing plate precursor and conducting printing.

According to the present invention, a lithographic printing plate precursor which is capable of forming an image without alkali development after laser exposure, and which is excellent in all of the fine line reproducibility, printing durability, stain resistance and on-machine developing property is provided.

DETAILED DESCRIPTION OF THE INVENTION

The present invention will be described in greater detail below.

The lithographic printing plate precursor according to the invention is a lithographic printing plate precursor capable of forming an image without alkali development comprising a support having thereon a laser-sensitive photopolymerizable layer, and the photopolymerizable layer or other layer contains (AI) a copolymer (hereinafter also referred to as a "specific copolymer (AI)") containing (a101) a repeating unit having at least one ethylenically unsaturated bond and (a102) a repeating unit having at least two functional groups capable of interacting with a surface of the support or (AII) a copolymer (hereinafter also referred to as a "specific copolymer (AII)") containing (a201) a repeating unit having at least two ethylenically unsaturated bonds and (a202) a repeating unit having at least one functional group capable of interacting with a surface of the support. In the specification, the "specific copolymer (AI)" and the "specific copolymer (AII)" are sometimes collectively referred to as a "specific copolymer".

According to the specific copolymer for use in the invention, due to the inclusion of a repeating unit having at least two functional groups capable of interacting with a surface of a support, adhesion to the support is improved, and both increase in printing durability in the image area and improvement in prevention of ink adherence in the non-image area are achieved. On the other hand, due to the inclusion of a repeating unit having at least two ethylenically unsaturated bonds, reactivity of the specific polymer increases at the laser exposure and strong adhesion between the photopolymerizable layer and the support occurs to obtain high printing durability.

It is preferred for the specific copolymer according to the invention to further contain (a3) a repeating unit having at least one hydrophilic functional group.

[Specific Copolymer]

The specific copolymer according to the invention will be described in more detail below. As the specific copolymer (AI) according to the invention, a copolymer containing repeating units represented by formula (I) shown below is preferable.

$$-(A_{11})_x-(A_{12})_y-(A_{13})_z- \quad (I)$$

In formula (I), $A_{11}$ represents a repeating unit having at least one ethylenically unsaturated bond, $A_{12}$ represents a repeating unit having at least two functional groups capable of interacting with a surface of a support, and $A_{13}$ represents a repeating unit having at least one hydrophilic group. x, y and z each represents a copolymerization ratio.

In formula (I), the repeating unit represented by formula $A_{11}$ is preferably represented by the following formula (AI):

(A1)

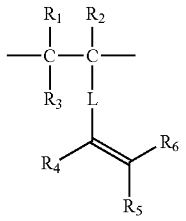

In the formula, $R_1$ to $R_3$ each independently represents a hydrogen atom, an alkyl group having from 1 to 6 carbon atoms or a halogen atom. $R_4$ to $R_6$ each independently represents a hydrogen atom, an alkyl group having from 1 to 6 carbon atoms, a halogen atom, an acyl group or an acyloxy group. Alternatively, $R_4$ and $R_5$ or $R_5$ and $R_6$ may be combined with each other to form a ring. L represents a divalent connecting group selected from —CO—, —O—, —NH—, a divalent aliphatic group, a divalent aromatic group and a combination thereof.

Specific examples of the combination of groups represented by L are set forth below. In each of the specific examples shown below, the left side connects to the main chain and the right side connects to the ethylenic unsaturated bond.

L1: —CO—NH-divalent aliphatic group-O—CO—

L2: —CO-divalent aliphatic group-O—CO—

L3: —CO—O-divalent aliphatic group-O—CO—

L4: —divalent aliphatic group-O—CO—

L5: —CO—NH-divalent aromatic group-O—CO—

L6: —CO-divalent aromatic group-O—CO—

L7: —divalent aromatic group-O—CO—

L8: —CO-divalent aliphatic group-CO—O-divalent aliphatic group-O—CO—

L9: —CO-divalent aliphatic group-O—CO-divalent aliphatic group-O—CO—

L10: —CO-divalent aromatic group-CO—O-divalent aliphatic group-O—CO—

L11: —CO-divalent aromatic group-O—CO-divalent aliphatic group-O—CO—

L12: —CO-divalent aliphatic group-CO—O-divalent aromatic group-O—CO—

L13: —CO-divalent aliphatic group-O—CO-divalent aromatic group-O—CO—

L14: —CO-divalent aromatic group-CO—O-divalent aromatic group-O—CO—

L15: —CO-divalent aromatic group-O—CO-divalent aromatic group-O—CO—

L16: —CO—O-divalent aromatic group-O—CO—NH-divalent aliphatic group-O—CO—

L17: —CO—O-divalent aliphatic group-O—CO—NH-divalent aliphatic group-O—CO—

The divalent aliphatic group includes an alkylene group, a substituted alkylene group, an alkenylene group, a substituted alkenylene group, an alkinylene group, a substituted alkinylene group and a polyalkyleneoxy group. Among them, an alkylene group, a substituted alkylene group, an alkenylene group and a substituted alkenylene group are preferable, and an alkylene group and a substituted alkylene group are more preferable.

Of the divalent aliphatic groups, a chain structure is more preferable than a cyclic structure, and further a straight-chain structure is more preferable than a branched chain structure. A number of carbon atoms included in the divalent aliphatic group is preferably from 1 to 20, more preferably from 1 to 15, still more preferably from 1 to 12, yet still more preferably from 1 to 10, and most preferably from 1 to 8.

Examples of the substituent for the divalent aliphatic group include a halogen atom (e.g., F, Cl, Br or I), a hydroxy group, a carboxy group, an amino group, a cyano group, an aryl group, an alkoxy group, an aryloxy group, an acyl group, an alkoxycarbonyl group, an aryloxycarbonyl group, an acyloxy group, a monoalkylamino group, a dialkylamino group, a monoarylamino group and a diarylamino group.

The divalent aromatic group includes an arylene group and a substituted arylene group. It preferably includes a phenylene group, a substituted phenylene group, a naphthylene group and a substituted naphthylene group.

Examples of the substituent for the divalent aromatic group include an alkyl group in addition to the substituents described for the divalent aliphatic group described above.

Of L1 to L17 described above, L1, L3, L5, L7 and L17 are preferable.

In formula (I), the repeating unit represented by $A_{12}$ has a feature of having at least two functional groups (hereinafter also referred to as a "specific functional group") capable of interacting with a surface of a support.

The specific functional group includes, for example, a group capable of making a bond or interaction, for example, a covalent bond, an ionic bond, a hydrogen bond, polar interaction or van der Waals interaction with metal, metal oxide, a hydroxy group or the like present on the support subjected to an anodizing treatment or a hydrophilizing treatment.

Specific examples of the specific functional group are set forth below.

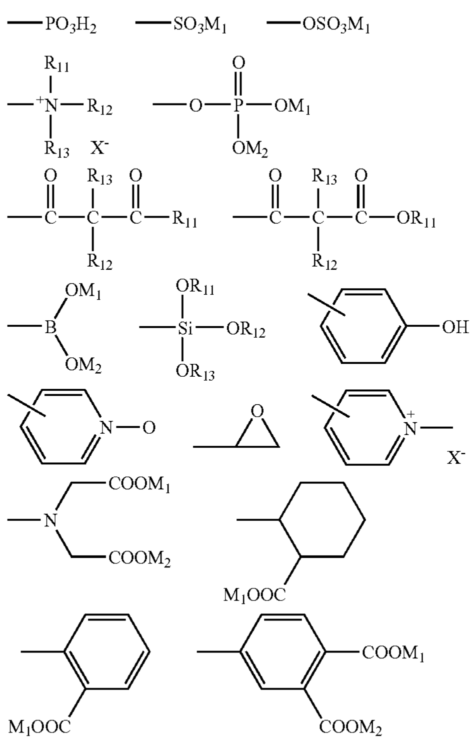

In the above-formulae, $R_{11}$ to $R_{13}$ each independently represents a hydrogen atom, an alkyl group, an aryl group, an alkynyl group or an alkenyl group; $M_1$ and $M_2$ each independently represents a hydrogen atom, a metal atom or an ammonium group; and $X^-$ represents a counter anion.

Of the specific functional groups, an onium salt group, for example, an ammonium group or a pyridinium group, a phosphoric ester group, a phosphonic acid group, a boric acid group and a β-diketone group, for example, an acetylacetone group.

Specific examples of the repeating unit represented by $A_{12}$ having at least two specific functional groups are set forth below.

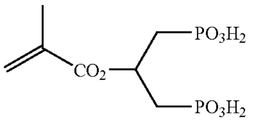

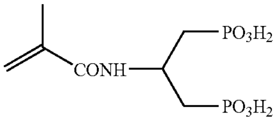

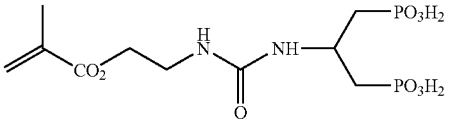

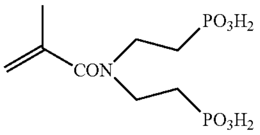

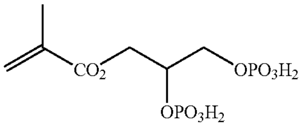

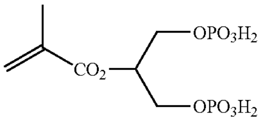

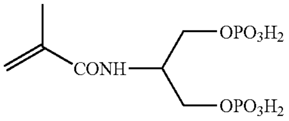

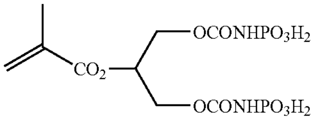

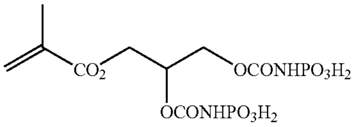

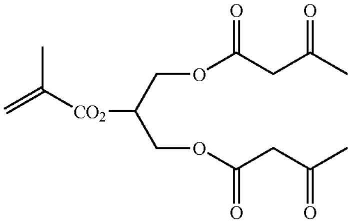

-continued

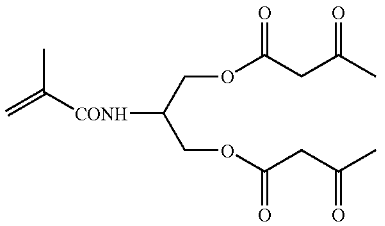

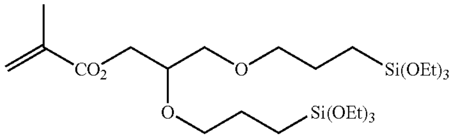

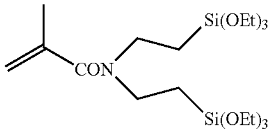

In formula (I), the repeating unit represented by formula $A_{13}$ is preferably represented by the following formula (A3):

(A3)

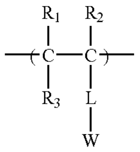

In the formula, $R_1$ to $R_3$ and L have the same meanings as those defined in formula (A1) above, respectively. W represents a group shown below.

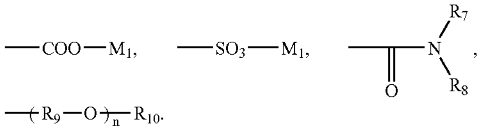

wherein $M_1$ has the same meaning as that defined in the specific functional group above. $R_7$ and $R_8$ each independently represents a hydrogen atom or a straight-chin or branched chain alkyl group having from 1 to 6 carbon atoms. $R_9$ represents a straight-chin or branched chain alkylene group having from 1 to 6 carbon atoms, and preferably an ethylene group. $R_{10}$ represents a hydrogen atom or an alkyl group having from 1 to 12 carbon atoms. n represents an integer from 1 to 100, and preferably from 1 to 30.

Of the groups represented by W, a carboxylic acid (salt) group or a sulfonic acid (salt) group is preferable, and a sulfonic acid (salt) group is particularly preferable in view of a stain-preventing property.

The specific copolymer (AI) according to the invention may be a copolymer containing one or more repeating units derived from other monomers described below in addition to the above-described repeating units represented by $A_{11}$, $A_{12}$ and $A_{13}$ as long as the effects of the invention is not damaged.

(Other Monomers)

(1) Acrylate or methacrylate having an aliphatic hydroxy group, for example, 2-hydroxyethyl acrylate or 2-hydroxyethyl methacrylate.

(2) Acrylate, for example, methyl acrylate, ethyl acrylate, propyl acrylate, amyl acrylate, benzyl acrylate, 2-chloroethyl acrylate, glycidyl acrylate, N-dimethylaminoethyl acrylate, polyethylene glycol monoacrylate or polypropylene glycol monoacrylate.

(3) Methacrylate, for example, methyl methacrylate, ethyl methacrylate, propyl methacrylate, amyl methacrylate, cyclohexyl methacrylate, benzyl methacrylate, 2-chloroethyl methacrylate, glycidyl methacrylate, N-dimethylaminoethyl methacrylate, polyethylene glycol monomethacrylate or polypropylene glycol monomethacrylate.

(4) Acrylamide or methacrylamide, for example, acrylamide, methacrylamide, N-methylolacrylamide, N-ethylacrylamide, N-hexylmethacrylamide, N-cyclohexylacrylamide, N-hydroxyethylacrylamide, N-phenylacrylamide, N-nitrophenylacrylamide or N-ethyl-N-phenylacrylamide.

(5) Vinyl ether, for example, ethyl vinyl ether, 2-chloroethyl vinyl ether, hydroxyethyl vinyl ether, propyl vinyl ether, butyl vinyl ether or phenyl vinyl ether.

(6) Vinyl ester, for example, vinyl acetate, vinyl chloroacetate, vinyl butyrate or vinyl benzoate (7) Styrene, for example, styrene, α-methylstyrene, methylstyrene or chloromethylstyrene.

(8) Vinyl ketone, for example, methyl vinyl ketone, ethyl vinyl ketone, propyl vinyl ketone or phenyl vinyl ketone.

(9) Olefin, for example, ethylene, propylene, isobutylene, butadiene or isoprene.

(10) N-vinylpyrrolidone, N-vinylcarbazole, 4-vinylpyridine, acrylonitrile or methacrylonitrile.

(11) Unsaturated imide, for example, maleimide, N-acryloylacrylamide, N-acetylmethacrylamide, N-propionylmethacrylamide or N-(p-chlorobenzoyl)methacrylamide.

A molecular weight of the specific copolymer (AI) is preferably in a range from 500 to 100,000, more preferably in a range from 700 to 50,000, in terms of a weight average molecular weight. A content of the repeating unit represented by $A_{11}$ is preferably from 1 to 80% by mole, more preferably from 2 to 50% by mole, based on the total copolymerization monomers. A content of the repeating unit represented by $A_{12}$ is preferably from 1 to 80% by mole, more preferably from 2 to 40% by mole, based on the total copolymerization monomers. A content of the repeating unit represented by $A_{13}$ is preferably from 10 to 95% by mole, more preferably from 20 to 90% by mole, based on the total copolymerization monomers.

Specific examples of the specific copolymer (AI) for use in the invention are set forth below, but the invention should not be construed as being limited thereto.

I-1

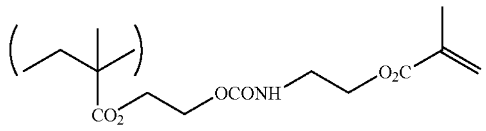

-continued
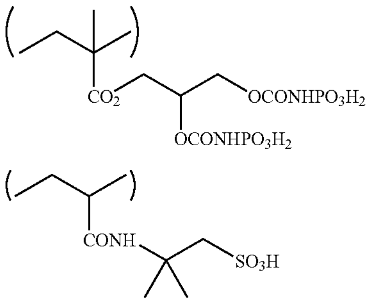
I-2
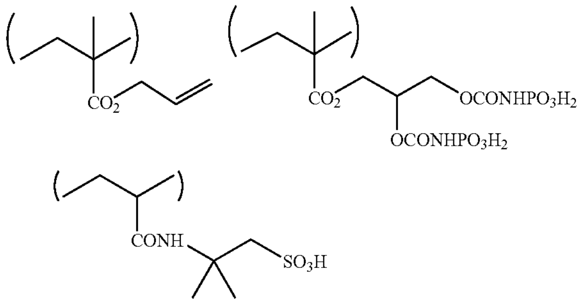
I-3
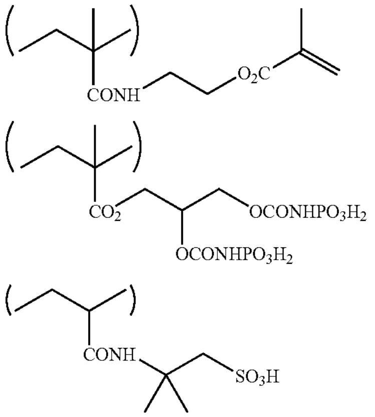
I-4
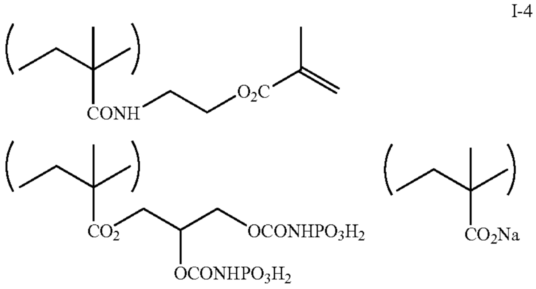
I-5
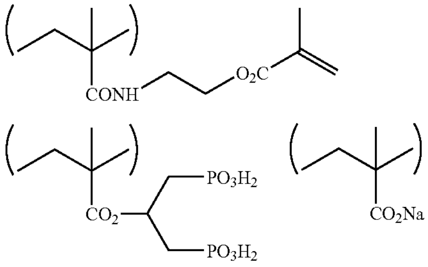
-continued
I-6
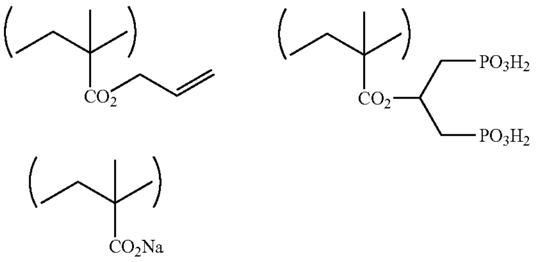
I-7
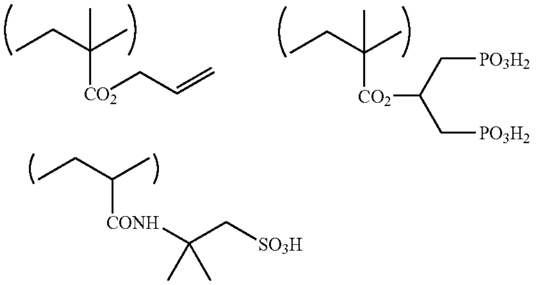
I-8
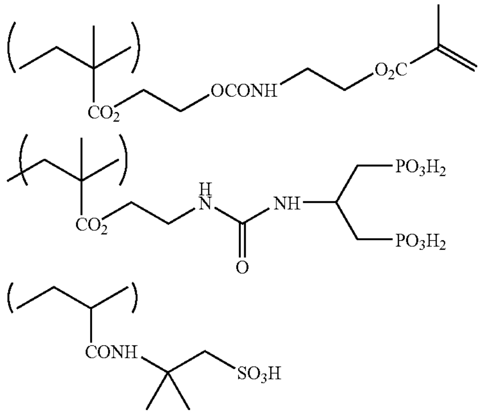
I-9
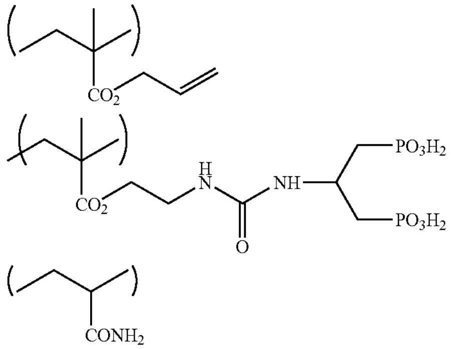
I-10
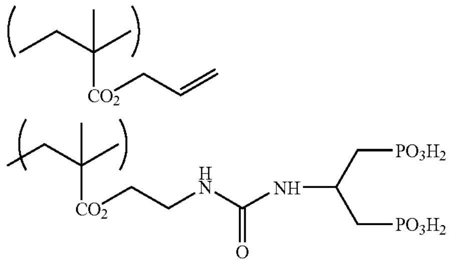

-continued
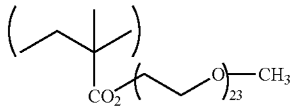
I-11
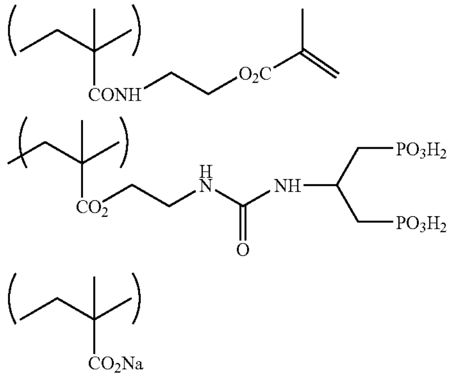
I-12
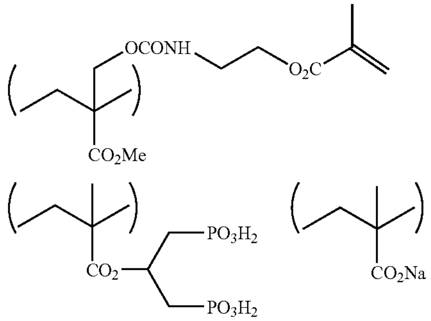
I-13
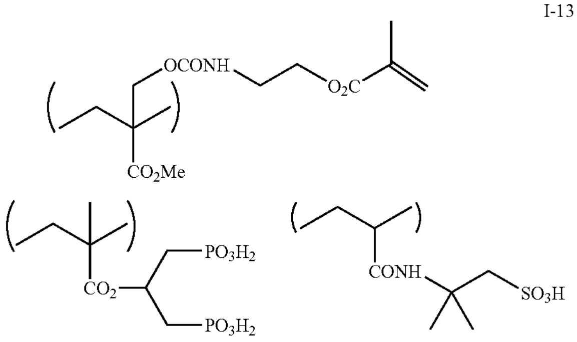
I-14
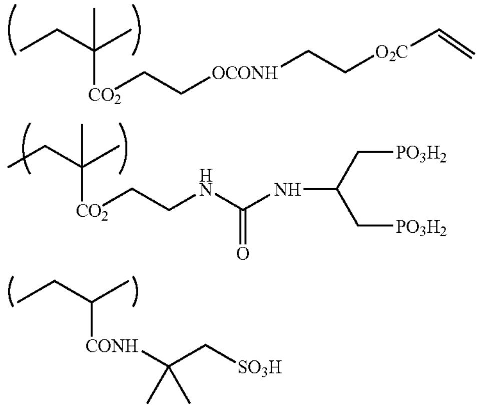
-continued
I-15
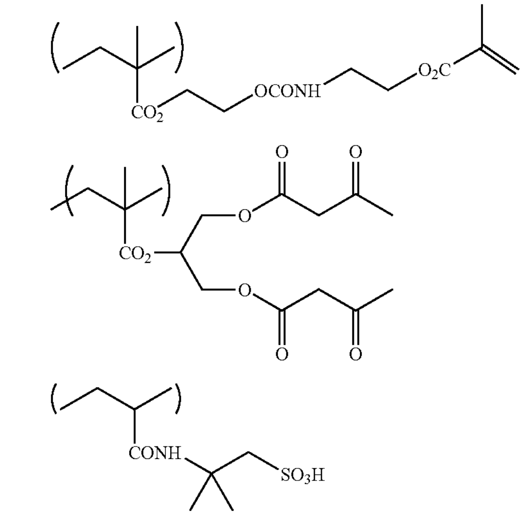
I-16
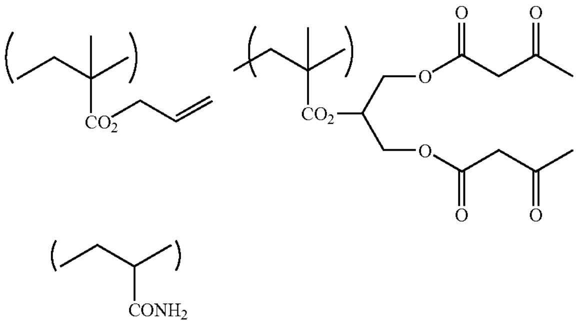
I-17
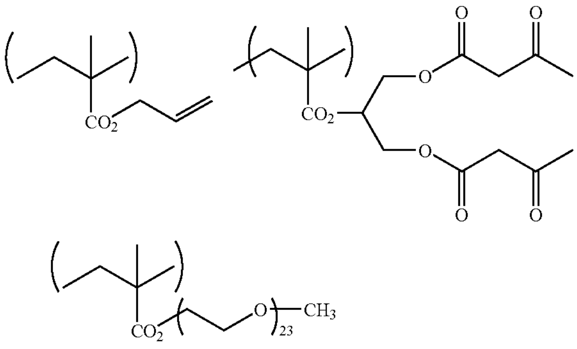
I-18
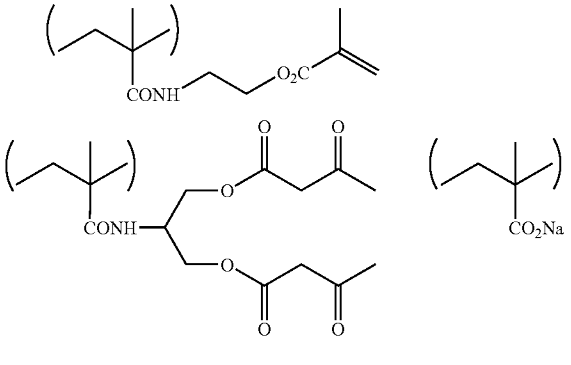

-continued
I-19
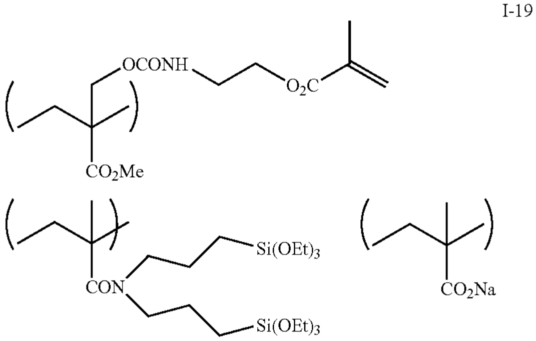
I-20
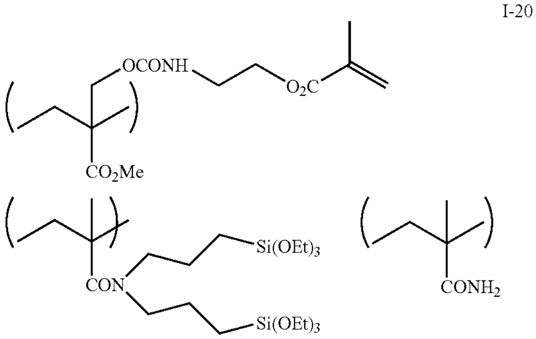
I-21
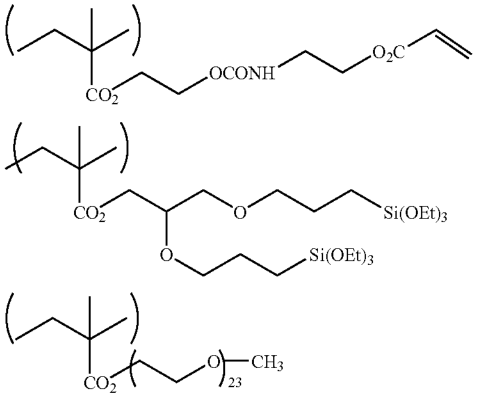
I-22
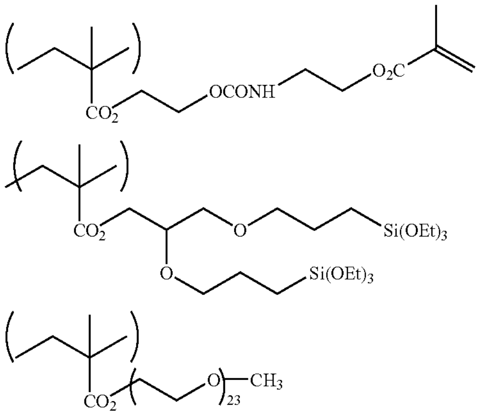
I-23
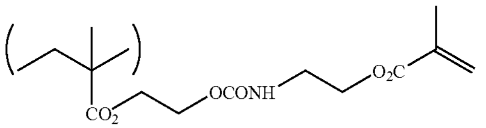
-continued
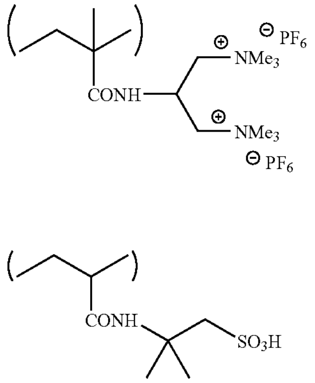
I-24
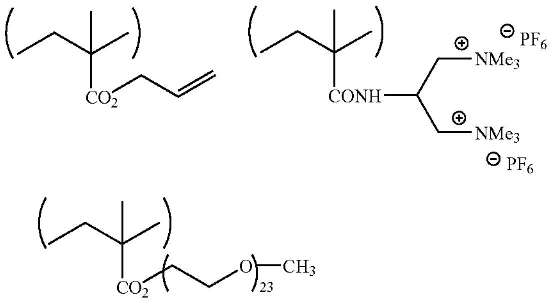
I-25
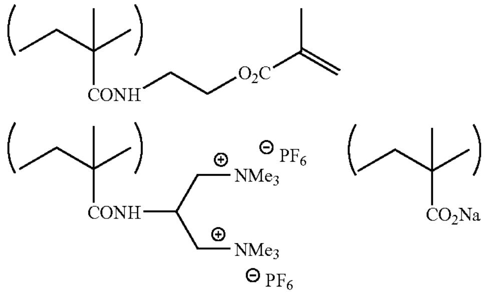
I-26
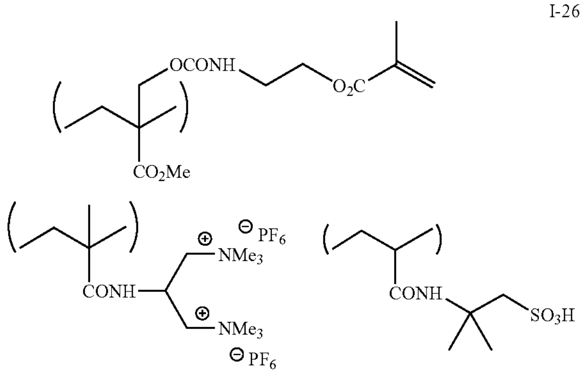
I-27
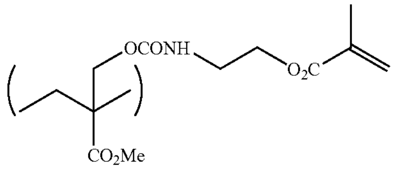

-continued

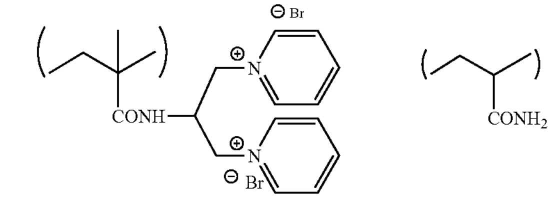

I-28

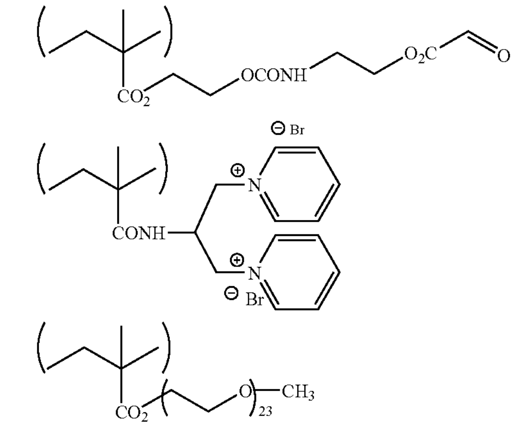

I-29

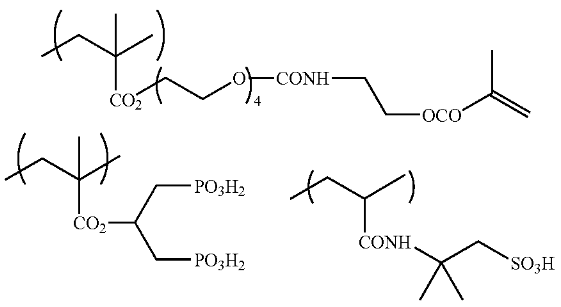

I-30

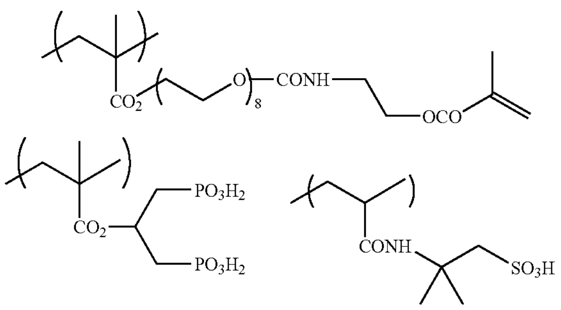

As the specific copolymer (AII) according to the invention, a copolymer containing repeating units represented by formula (II) shown below is preferable.

$$-(A_{21})_x-(A_{22})_y-(A_{23})_z- \quad \text{(II)}$$

In formula (II), $A_{21}$ represents a repeating unit having at least two ethylenically unsaturated bonds, $A_{22}$ represents a repeating unit having at least one functional group capable of interacting with a surface of a support, and $A_{23}$ represents a repeating unit having at least one hydrophilic group. x, y and z each represents a copolymerization ratio.

In formula (II), the ethylenically unsaturated bond in the repeating unit represented by formula $A_{21}$ is preferably represented by any one of formulae (a11), (a12) and (a13) shown below, and is present at least two per repeating unit.

(a11)

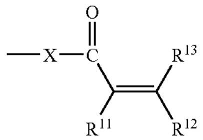

(a12)

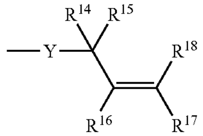

(a13)

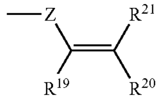

In the formulae, X and Y each independently represents an oxygen atom, a sulfur atom or $-N(R^{22})-$. $R^{11}$ to $R^{22}$ each independently represents a hydrogen atom or a monovalent substituent. Z represents an oxygen atom, a sulfur atom, $-N(R^{22})-$ or a phenylene group.

In formula (a11), $R^{11}$ to $R^{13}$ each independently represents a hydrogen atom or a monovalent substituent. $R^{11}$ preferably includes, for example, a hydrogen atom or a monovalent organic group, for example, an alkyl group which may have a substituent. Among them, a hydrogen atom, a methyl group, an alkoxymethyl or an estermethyl group is preferable. $R^{12}$ and $R^{13}$ each independently includes, for example, a hydrogen atom, a halogen atom, an amino group, a dialkylamino group, a carboxy group, an alkoxycarbonyl group, a sulfo group, a nitro group, a cyano group, an alkyl group which may have a substituent, an aryl group which may have a substituent, an alkoxy group which may have a substituent, an aryloxy group which may have a substituent, an alkylamino group which may have a substituent, an arylamino group which may have a substituent, an alkylsulfonyl group which may have a substituent and an arylsulfonyl group which may have a substituent. Among them, a hydrogen atom, a carboxy group, an alkoxycarbonyl group, an alkyl group which may have a substituent or an aryl group which may have a substituent is preferable. Examples of the substituent introduced include a methoxycarbonyl group, an ethoxycarbonyl group, an isopropoxycarbonyl group, a methyl group, an ethyl group and a phenyl group. X represents an oxygen atom, a sulfur atom or $-N(R^{22})-$, and $R^{22}$ includes, for example, an alkyl group which may have a substituent.

In formula (a12), $R^{14}$ to $R^{18}$ each independently represents a hydrogen atom or a monovalent substituent. $R^{14}$ to $R^{18}$ each independently includes, for example, a hydrogen atom, a halogen atom, an amino group, a dialkylamino group, a carboxy group, an alkoxycarbonyl group, a sulfo group, a nitro group, a cyano group, an alkyl group which may have a substituent, an aryl group which may have a substituent, an alkoxy group which may have a substituent, an aryloxy group which may have a substituent, an alkylamino group which may have a substituent, an arylamino group which may have a substituent, an alkylsulfonyl group which may have a substituent and an arylsulfonyl group which may have a substituent. Among them, a hydrogen atom, a carboxy group, an alkoxycarbonyl group, an alkyl group which may have a substituent or an aryl group which may have a substituent is preferable. Examples of the substituent introduced include those described in Formula (a11).

Y represents an oxygen atom, a sulfur atom or —N($R^{22}$)—, and $R^{22}$ has the same meaning as $R^{22}$ defined in Formula (a11).

In formula (II), the repeating unit represented by formula $A_{22}$ is specifically represented by the following formula (A2):

(A2)

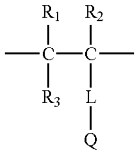

In the formula (A2), $R_1$ to $R_3$ each independently represents a hydrogen atom, an alkyl group having from 1 to 6 carbon atoms or a halogen atom. L represents a divalent connecting group selected from —CO—, —O—, —NH—, a divalent aliphatic group, a divalent aromatic group and a combination thereof.

Specific examples of the combination of groups represented by L are set forth below. In each of the specific examples shown below, the left side connects to the main chain and the right side connects to the ethylenic unsaturated bond.

L1: —CO—NH-divalent aliphatic group-O—CO—

L2: —CO-divalent aliphatic group-O—CO—

L3: —CO—O-divalent aliphatic group-O—CO—

L4: —divalent aliphatic group-O—CO—

L5: —CO—NH-divalent aromatic group-O—CO—

L6: —CO-divalent aromatic group-O—CO—

L7: —divalent aromatic group-O—CO—

L8: —CO-divalent aliphatic group-CO—O-divalent aliphatic group-O—CO—

L9: —CO-divalent aliphatic group-O—CO-divalent aliphatic group-O—CO—

L10: —CO-divalent aromatic group-CO—O-divalent aliphatic group-O—CO—

L11: —CO-divalent aromatic group-O—CO-divalent aliphatic group-O—CO—

L12: —CO-divalent aliphatic group-CO—O-divalent aromatic group-O—CO—

L13: —CO-divalent aliphatic group-O—CO-divalent aromatic group-O—CO—

L14: —CO-divalent aromatic group-CO—O-divalent aromatic group-O—CO—

L15: —CO-divalent aromatic group-O—CO-divalent aromatic group-O—CO—

L16: —CO—O-divalent aromatic group-O—CO—NH-divalent aliphatic group-O—CO—

L17: —CO—O-divalent aliphatic group-O—CO—NH-divalent aliphatic group-O—CO—

The divalent aliphatic group includes an alkylene group, a substituted alkylene group, an alkenylene group, a substituted alkenylene group, an alkinylene group, a substituted alkinylene group and a polyalkyleneoxy group. Among them, an alkylene group, a substituted alkylene group, an alkenylene group and a substituted alkenylene group are preferable, and an alkylene group and a substituted alkylene group are more preferable.

Of the divalent aliphatic groups, a chain structure is more preferable than a cyclic structure, and further a straight-chain structure is more preferable than a branched chain structure. A number of carbon atoms included in the divalent aliphatic group is preferably from 1 to 20, more preferably from 1 to 15, still more preferably from 1 to 12, yet still more preferably from 1 to 10, and most preferably from 1 to 8.

Examples of the substituent for the divalent aliphatic group include a halogen atom (e.g., F, Cl, Br or I), a hydroxy group, a carboxy group, an amino group, a cyano group, an aryl group, an alkoxy group, an aryloxy group, an acyl group, an alkoxycarbonyl group, an aryloxycarbonyl group, an acyloxy group, a monoalkylamino group, a dialkylamino group, a monoarylamino group and a diarylamino group.

The divalent aromatic group includes an arylene group and a substituted arylene group. It preferably includes a phenylene group, a substituted phenylene group, a naphthylene group and a substituted naphthylene group.

Examples of the substituent for the divalent aromatic group include an alkyl group in addition to the substituents described for the divalent aliphatic group described above.

Of L1 to L17 described above, L1, L3, L5, L7 and L17 are preferable.

In formula (A2), Q represents a functional group capable of interacting with a surface of a support. The functional group capable of interacting with a surface of a support represented by Q has the same meaning as the functional group (specific functional group) capable of interacting with a surface of a support described in the repeating unit represented by $A_{12}$ with respect to the specific copolymer (AI) hereinbefore.

In formula (A2), L represents a divalent connecting group selected from —CO—, —O—, —NH—, a divalent aliphatic group, a divalent aromatic group and a combination thereof.

Specific examples of the combination of groups represented by L include groups set forth below in addition to the specific examples of the combination of groups for L in formula (A1). In each of the specific examples shown below, the left side connects to the main chain.

L18: —CO—NH—

L19: —CO—O—

L20: -divalent aromatic group-

In formula (II), the repeating unit represented by $A_{23}$ is preferably same as the repeating unit represented by formula (A3) preferably described for the repeating unit represented by $A_{13}$ with respect to the specific copolymer (AI) hereinbefore.

The specific copolymer (AII) according to the invention may be a copolymer containing one or more repeating units derived from the other monomers described with respect to the specific copolymer (AI) hereinbefore in addition to the above-described repeating units represented by $A_{21}$, $A_{22}$ and $A_{23}$ as long as the effects of the invention is not damaged.

A molecular weight of the specific copolymer (AII) is preferably in a range from 500 to 100,000, more preferably in a range from 700 to 50,000, in terms of a weight average molecular weight. A content of the repeating unit represented by $A_{21}$ is preferably from 1 to 80% by mole, more preferably from 2 to 50% by mole, based on the total copolymerization monomers. A content of the repeating unit represented by $A_{22}$ is preferably from 1 to 80% by mole, more preferably from 2 to 40% by mole, based on the total copolymerization monomers. A content of the repeating unit represented by $A_{23}$ is preferably from 10 to 95% by mole, more preferably from 20 to 90% by mole, based on the total copolymerization monomers.
Specific examples of the specific copolymer (AII) for use in the invention are set forth below, but the invention should not be construed as being limited thereto.
II-1
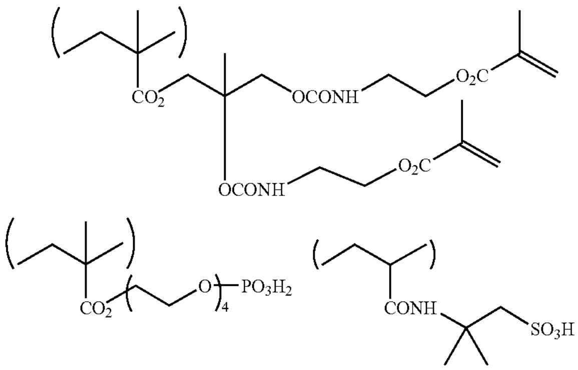
II-2
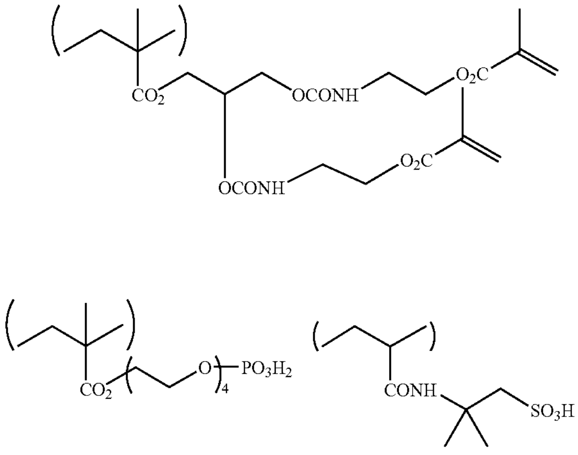
II-3
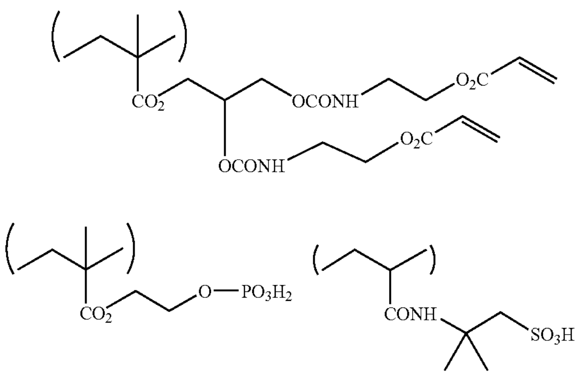
-continued
II-4
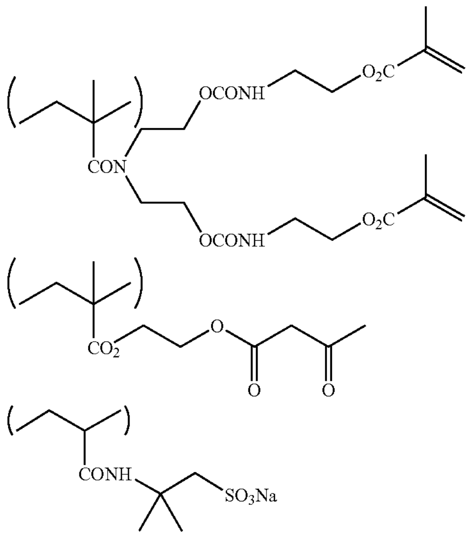
II-5
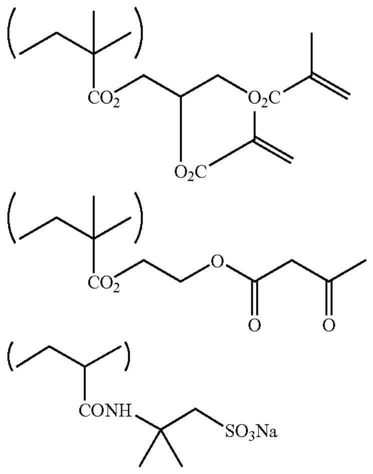
II-6
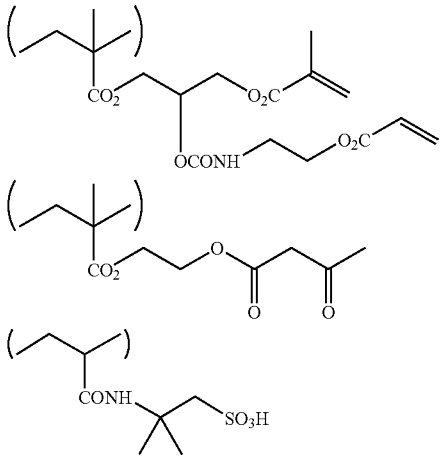
II-7
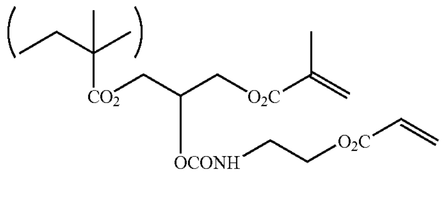

-continued
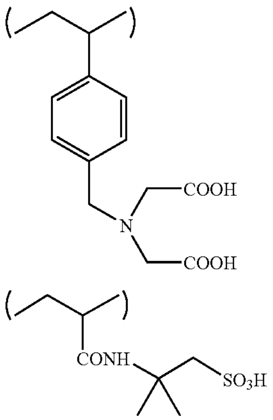
II-8
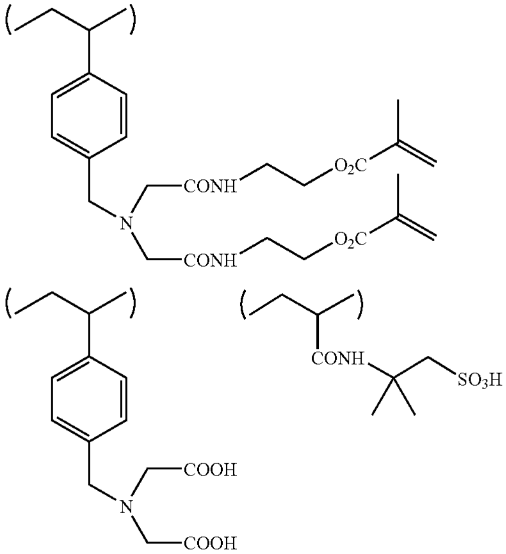
II-9
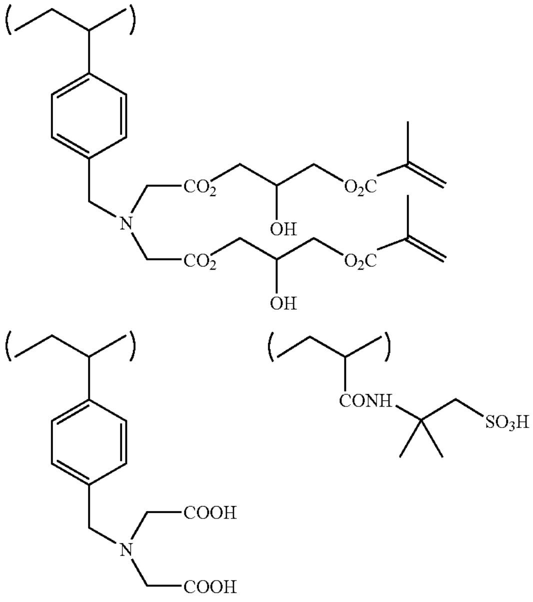
-continued
II-10
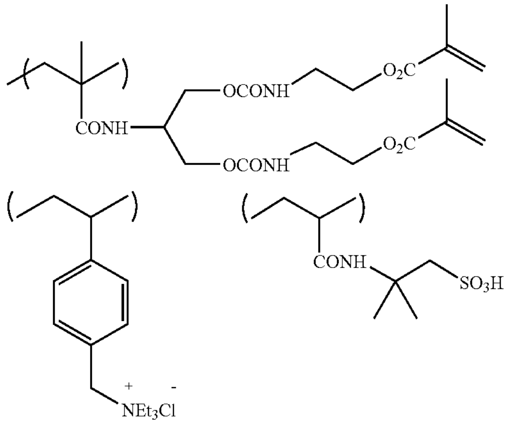
II-11
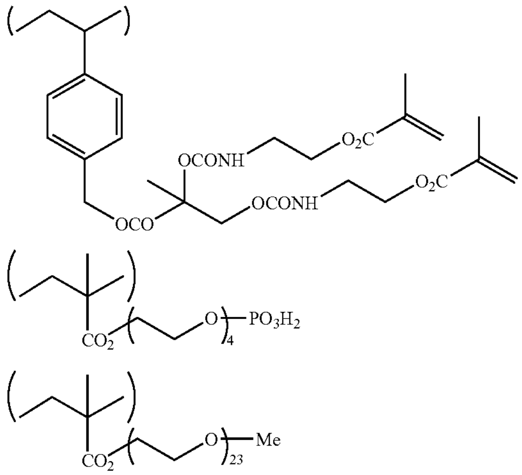
II-12
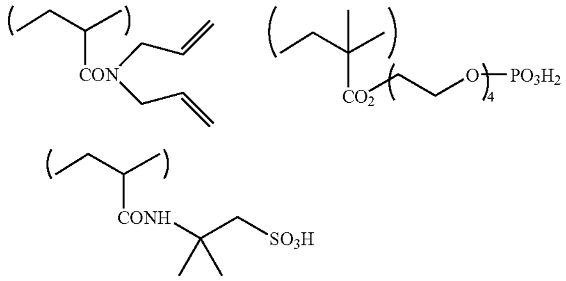
II-13
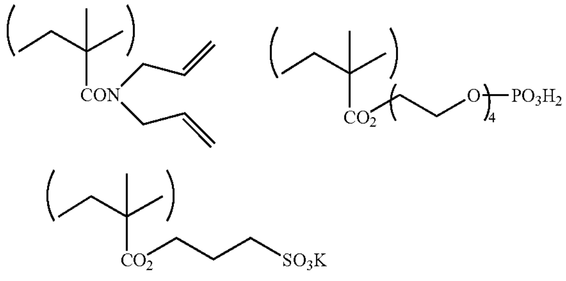

-continued
II-14
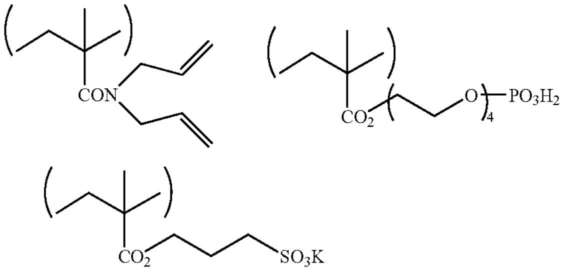
II-15
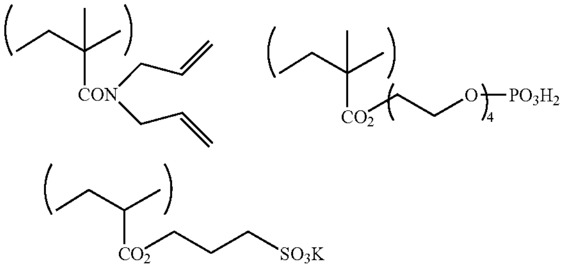
II-16
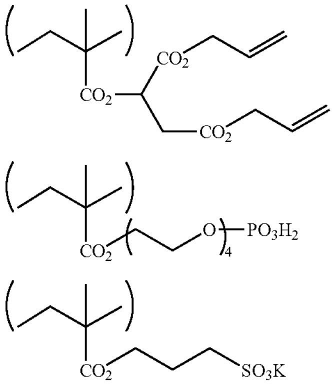
II-17
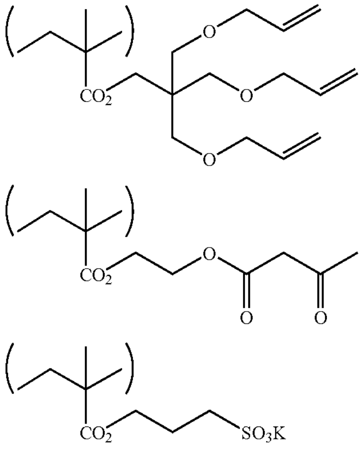
II-18
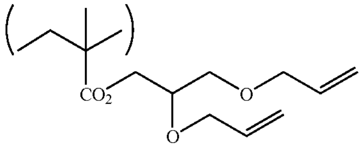
-continued
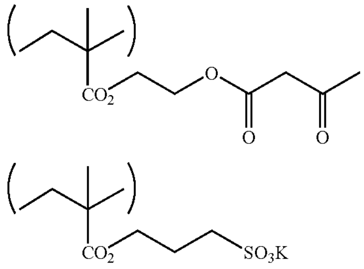
II-19
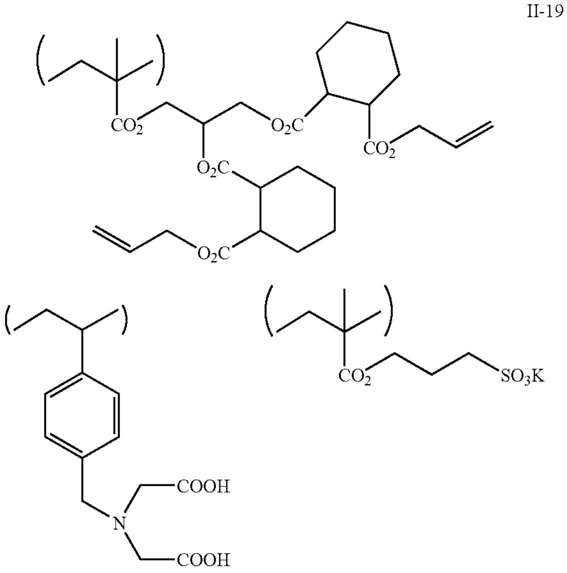
II-20
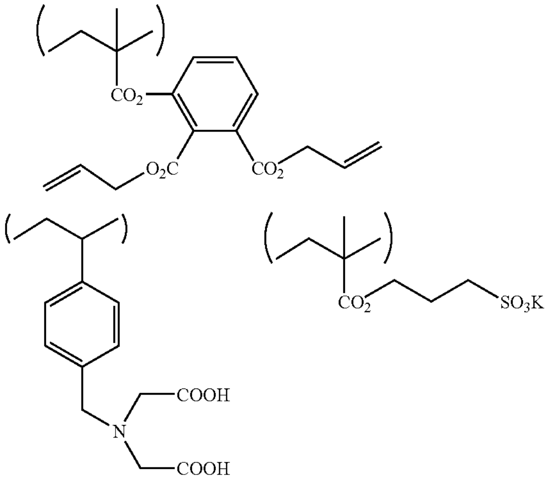
II-21
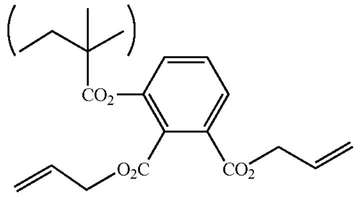

-continued

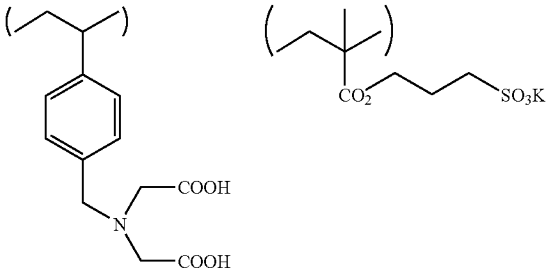

II-22

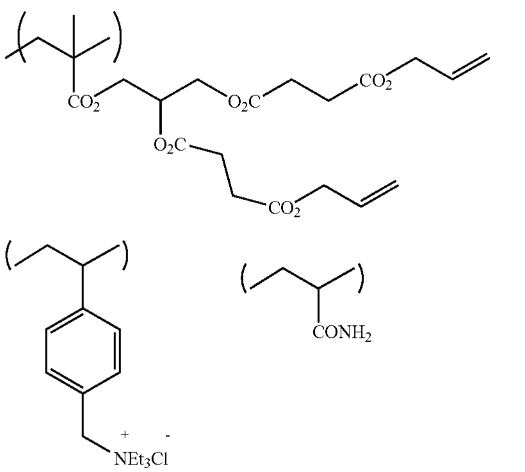

II-23

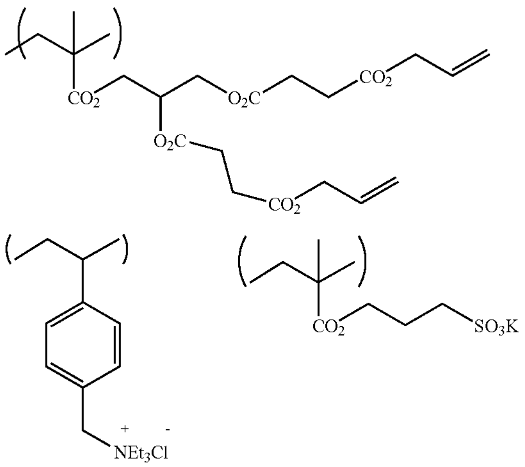

II-24

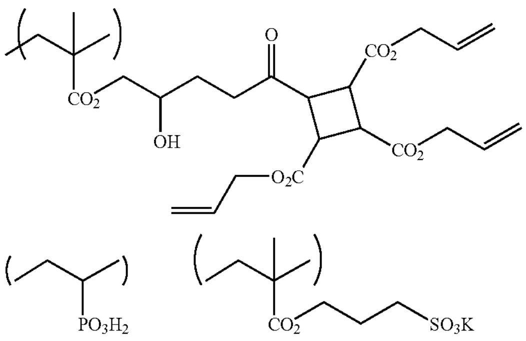

-continued

II-25

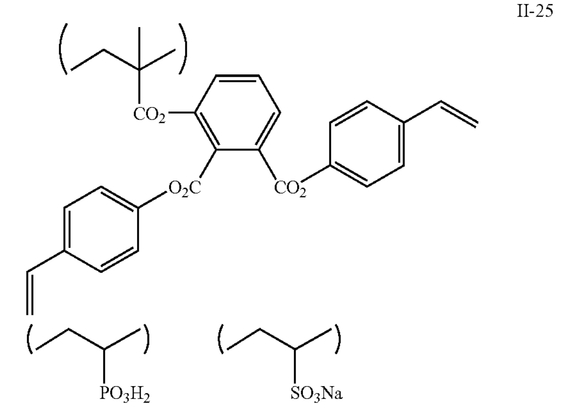

II-26

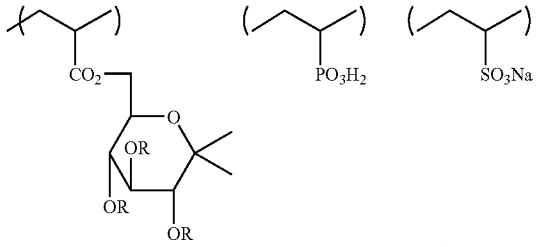

R = 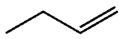 or 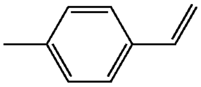

II-27

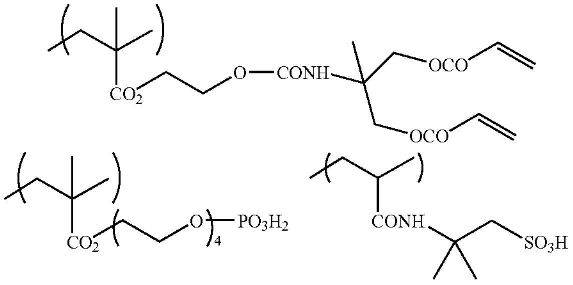

The specific copolymer according to the invention can be easily synthesized according to known techniques, for example, a method of copolymerizing monomers corresponding to the respective repeating units or a method of introducing a desired functional group by a polymer reaction.

With respect to a type of usage of the specific copolymer according to the invention, the specific copolymer can be contained in the photopolymerizable layer or other layer than the photopolymerizable layer. As the other layer, a layer adjacent to the support or the photopolymerizable layer is preferable. Among others, the use of the specific copolymer in an undercoat layer (intermediate layer) provided between the support and the photopolymerizable layer is particularly preferable in order to sufficiently achieve the effects of the invention. By incorporating the specific copolymer into the undercoat layer, stronger adhesion between the support and the photopolymerizable layer is obtained in the exposed area and removal of the photopolymerizable layer from the support becomes easy in the unexposed area so that the developing property and stain resistance can be improved. It is also advantageous in that in the case of infrared ray exposure, since the undercoat layer acts as a heat insulating layer, heat generated upon the exposure by an infrared laser does not diffuse into the support but is efficiently utilized so that increase in sensitivity can be achieved.

In the case of using the specific copolymer in the undercoat layer according to the invention, the specific copolymer is ordinarily dissolved in a solvent for the use. Examples of the solvent include water and an organic solvent, for example, methanol, ethanol, propanol, isopropanol, ethylene glycol, hexylene glycol, tetrahydrofuran, dimethylformamide, 1-methoxy-2-propanol, dimethylacetamide or dimethylsolfoxide. Particularly, water and an alcohol are preferably used. The solvents may be used as a mixture.

Concentration of the specific copolymer in the coating solution for undercoat layer is preferably from 0.001 to 10% by weight, more preferably from 0.01 to 5% by weight, and still more preferably from 0.05 to 1% by weight. To the undercoat layer is added a surfactant described hereinafter, if desired. In order to coat the coating solution for undercoat layer on a support, various known methods can be used. Examples of the method include bar coater coating, spin coating, spray coating, curtain coating, dip coating, air knife coating, blade coating and roll coating.

A coating amount (solid content) of the undercoat layer is preferably from 0.1 to 200 mg/$m^2$, and more preferably from 1 to 50 mg/$m^2$.

[Photopolymerizable Layer]

The lithographic printing plate precursor according to the invention has a laser-sensitive photopolymerizable layer on a hydrophilic support. Constituting components of the photopolymerizable layer will be described below.

<(A) Infrared Absorbing Agent>

In the case of conducting image formation of the lithographic printing plate precursor of the invention using as a light source, a laser emitting an infrared ray of 760 to 1,200 nm, ordinarily, an infrared absorbing agent is used. The infrared absorbing agent has a function of converting an infrared ray absorbed to heat and a function of being excited by an infrared ray to perform electron transfer/energy transfer to a polymerization initiator (radical generator) described hereinafter. The infrared absorbing agent for use in the invention includes a dye and pigment each having an absorption maximum in a wavelength range of 760 to 1,200 nm.

As the dye, commercially available dyes and known dyes described in literatures, for example, *Senryo Binran* (Dye Handbook) compiled by The Society of Synthetic Organic Chemistry, Japan (1970) can be utilized. Specifically, the dyes includes azo dyes, metal complex azo dyes, pyrazolone azo dyes, naphthoquinone dyes, anthraquinone dyes, phthalocyanine dyes, carbonium dyes, quinoneimine dyes, methine dyes, cyanine dyes, squarylium dyes, pyrylium salts and metal thiolate complexes.

Preferred examples of the dye include cyanine dyes described, for example, in JP-A-58-125246, JP-A-59-84356 and JP-A-60-78787; methine dyes described, for example, in JP-A-58-173696, JP-A-58-181690 and JP-A-58-194595; naphthoquinone dyes described, for example, in JP-A-58-112793, JP-A-58-224793, JP-A-59-48187, JP-A-59-73996, JP-A-60-52940 and JP-A-60-63744; squarylium dyes described, for example, in JP-A-58-112792; and cyanine dyes described, for example, in British Patent 434,875.

Also, near infrared absorbing sensitizers described in U.S. Pat. No. 5,156,938 are preferably used. Further, substituted arylbenzo(thio)pyrylium salts described in U.S. Pat. No. 3,881,924, trimethinethiapyrylium salts described in JP-A-57-142645 (corresponding to U.S. Pat. No. 4,327,169), pyrylium compounds described in JP-A-58-181051, JP-A-58-220143, JP-A-59-41363, JP-A-59-84248, JP-A-59-84249, JP-A-59-146063 and JP-A-59-146061, cyanine dyes described in JP-A-59-216146, pentamethinethiopyrylium salts described in U.S. Pat. No. 4,283,475, and pyrylium compounds described in JP-B-5-13514 (the term "JP-B" as used herein means an "examined Japanese patent publication") and JP-B-5-19702 are also preferably used. Other preferred examples of the dye include near infrared absorbing dyes represented by formulae (I) and (II) described in U.S. Pat. No. 4,756,993.

Other preferred examples of the infrared absorbing dye according to the invention include specific indolenine cyanine dyes described in JP-A-2002-278057 as illustrated below.

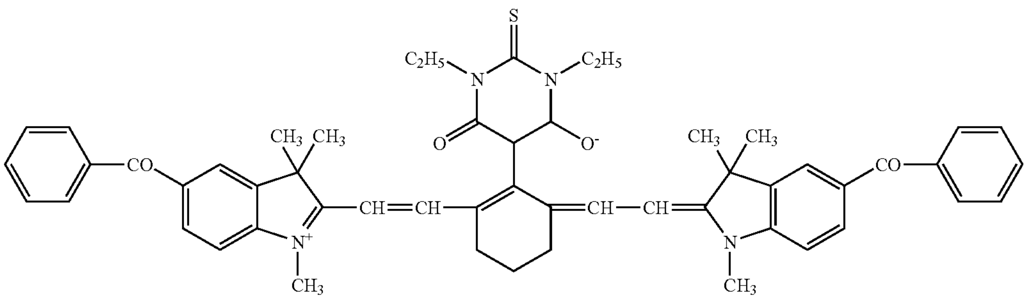

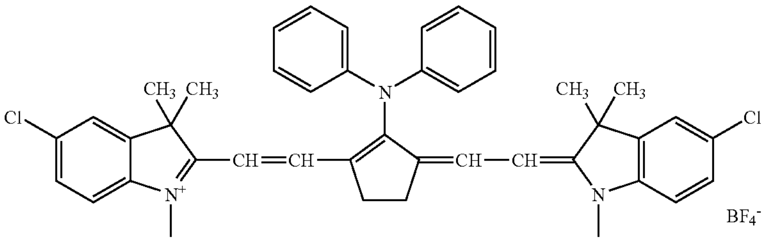

-continued

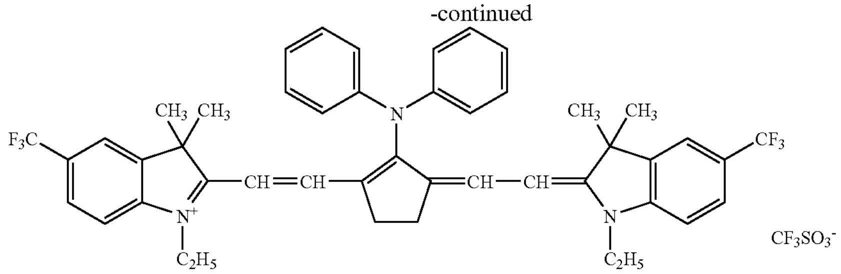

In particular, among the dyes, cyanine dyes, squarylium dyes, pyrylium dyes, nickel thiolate complexes and indolenine cyanine dyes are preferred. Cyanine dyes and indolenine cyanine dyes are more preferred. As a particularly preferred example of the dye, a cyanine dye represented by formula (i) shown below is exemplified. Formula (i)

(i)

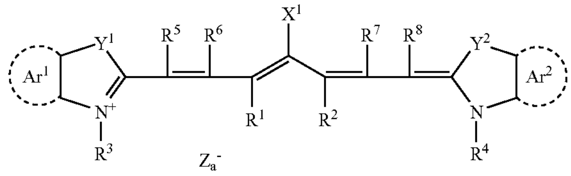

In formula (i), $X^1$ represents a hydrogen atom, a halogen atom, —$NPh_2$, $X^2$-$L^1$ or a group shown below.

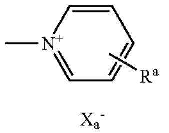

In the above, $X^2$ represents an oxygen atom, a nitrogen atom or a sulfur atom, and $L^1$ represents a hydrocarbon group having from 1 to 12 carbon atoms, an aromatic cyclic group containing a hetero atom or a hydrocarbon group having from 1 to 12 carbon atoms and containing a hetero atom. The hetero atom means a nitrogen atom, a sulfur atom, an oxygen atom, a halogen atom or a selenium atom. $Xa^-$ has the same meaning as $Za^-$ defined hereinafter, and $R^a$ represents a hydrogen atom or a substituent selected from an alkyl group, an aryl group, a substituted or unsubstituted amino group and a halogen atom.

In formula (i), $R^1$ and $R^2$ each independently represents a hydrocarbon group having from 1 to 12 carbon atoms. In view of the preservation stability of a coating solution for photopolymerizable layer, it is preferred that $R^1$ and $R^2$ each represents a hydrocarbon group having two or more carbon atoms, and particularly preferably, $R^1$ and $R^2$ are combined with each other to form a 5-membered or 6-membered ring.

In formula (i), $Ar^1$ and $Ar^2$, which may be the same or different, each represents an aromatic hydrocarbon group which may have a substituent. Preferred examples of the aromatic hydrocarbon group include a benzene ring and a naphthalene ring. Also, preferred examples of the substituent include a hydrocarbon group having 12 or less carbon atoms, a halogen atom and an alkoxy group having 12 or less carbon atoms. $Y^1$ and $Y^2$, which may be the same or different, each represents a sulfur atom or a dialkylmethylene group having 12 or less carbon atoms. $R^3$ and $R^4$, which may be the same or different, each represents a hydrocarbon group having 20 or less carbon atoms which may have a substituent. Preferred examples of the substituent include an alkoxy group having 12 or less carbon atoms, a carboxy group and a sulfo group. $R^5$, $R^6$, $R^7$ and $R^8$, which may be the same or different, each represents a hydrogen atom or a hydrocarbon group having 12 or less carbon atoms. From the standpoint of the availability of raw materials, a hydrogen atom is preferred. $Za^-$ represents a counter anion. However, $Za^-$ is not necessary when the cyanine dye represented by formula (i) has an anionic substituent in the structure thereof so that neutralization of charge is not needed. Preferred examples of the counter anion for $Za^-$ include a halogen ion, a perchlorate ion, a tetrafluoroborate ion, a hexafluorophosphate ion and a sulfonate ion, and particularly preferred examples thereof include a perchlorate ion, a hexafluorophosphate ion and an arylsulfonate ion in view of the preservation stability of a coating solution for photopolymerizable layer.

Specific examples of the cyanine dye represented by formula (i) which can be preferably used in the invention include those described in paragraphs [0017] to [0019] of JP-A-2001-133969.

Further, other particularly preferable examples include the specific indolenine cyanine dyes described in JP-A-2002-278057 described above.

Examples of the pigment used in the invention include commercially available pigments and pigments described in Colour Index (C.I.), *Saishin Ganryo Binran* (Handbook of Newest Pigments) compiled by Pigment Technology Society of Japan (1977), *Saishin Ganryo Oyou Gijutsu* (Newest Application Technologies of Pigments), CMC Publishing Co., Ltd. (1986) and *Insatsu Ink Gijutsu* (Printing Ink Technology), CMC Publishing Co., Ltd. (1984).

Examples of the pigment include black pigments, yellow pigments, orange pigments, brown pigments, red pigments, purple pigments, blue pigments, green pigments, fluorescent pigments, metal powder pigments and polymer-bonded dyes. Specific examples of the pigment used include insoluble azo pigments, azo lake pigments, condensed azo pigments, chelated azo pigments, phthalocyanine pigments, anthraquinone pigments, perylene and perynone pigments, thioindigo pigments, quinacridone pigments, dioxazine pigments, isoindolinone pigments, quinophthalone pigments, dying lake pigments, azine pigments, nitroso pigments, nitro pigments, natural pigments, fluorescent pigments, inorganic pigments and carbon black. Of the pigments, carbon black is preferred.

The pigment may be used without undergoing surface treatment or may be used after conducting the surface treatment. For the surface treatment, a method of coating a resin or wax on the pigment surface, a method of attaching a surfactant to the pigment surface and a method of bonding a reactive substance (for example, a silane coupling agent, an epoxy compound or a polyisocyanate) to the pigment surface. The surface treatment methods are described in *Kinzoku Sekken no Seishitsu to Oyo* (Properties and Applications of Metal Soap), Saiwai Shobo, *Insatsu Ink Gijutsu* (Printing Ink Technology), CMC Publishing Co., Ltd. (1984), and *Saishin Ganryo Oyo Gijutsu* (Newest Application Technologies of Pigments), CMC Publishing Co., Ltd. (1986).

A particle size of the pigment is preferably in a range from 0.01 to 10 μm, more preferably in a range from 0.05 to 1 μm, particularly preferably in a range from 0.1 to 1 μm. In the above-described range, good stability of the pigment dispersion in a coating solution for photopolymerizable layer and good uniformity of the photopolymerizable layer can be obtained.

As a method for dispersing the pigment, a known dispersion technique for use in the production of ink or toner can be used. Examples of the dispersing machine include an ultrasonic dispersing machine, a sand mill, an attritor, a pearl mill, a super-mill, a ball mill, an impeller, a disperser, a KD mill, a colloid mill, a dynatron, a three roll mill and a pressure kneader. The dispersing methods are described in detail in *Saishin Ganryo Oyo Gijutsu* (Newest Application Technologies of Pigments), CMC Publishing Co., Ltd. (1986).

The infrared absorbing agent may be added together with other components to one layer or may be added to a different layer separately provided. With respect to an amount of the infrared absorbing agent added, in the case of preparing a negative-working lithographic printing plate precursor, the amount is so controlled that absorbance of the photopolymerizable layer at the maximum absorption wavelength in the wavelength region of 760 to 1,200 nm measured by reflection measurement is ordinarily in a range of 0.3 to 1.2, preferably in a range of 0.4 to 1.1. In the above-described range, the polymerization reaction proceeds uniformly in the thickness direction of the photopolymerizable layer and good film strength of the image area and good adhesion of the image area to the support are achieved.

The absorbance of the photopolymerizable layer can be controlled depending on the amount of the infrared absorbing agent added to the photopolymerizable layer and the thickness of the photopolymerizable layer. The measurement of the absorbance can be carried out in a conventional manner. The method for measurement includes, for example, a method of forming a photopolymerizable layer having a thickness appropriately determined in the range of coating amount after drying required for the lithographic printing plate precursor on a reflective support, for example, an aluminum plate, and measuring reflection density of the photopolymerizable layer by an optical densitometer or a spectrophotometer according to a reflection method using an integrating sphere.

An amount of the infrared absorbing agent added is preferably from 0.1 to 50% by weight, more preferably from 0.5 to 30% by weight, particularly preferably from 1 to 20% by weight, based on the total solid content of the photopolymerizable layer.

<(B) Polymerization Initiator>

The polymerization initiator for use in the photopolymerizable layer according to the invention can be appropriately selected from various kinds of known photopolymerization initiators or combination systems of two or more photopolymerization initiators (photopolymerization initiation systems) described in patents and literature depending on a wavelength of a light source to be used.

In the case of using as the light source, a blue semiconductor laser, an Ar laser, a second harmonic of an infrared semiconductor laser or an SHG-YAG laser, various photopolymerization initiators (systems) have been proposed. For instance, a certain kind of photo-reducing dyes, for example, Rose Bengal, Eosin or Erythrosine as described in U.S. Pat. No. 2,850,445, and a combination system comprising a dye and an initiator, for example, a composite initiator system comprising a dye and an amine as described in JP-B-44-20189, a combination system of a hexaarylbiimidazole, a radical generator and a dye as described in JP-B-45-37377, a combination system of a hexaarylbiimidazole and a p-dialkylaminobenzylidene kotone as described in JP-B-47-2528 and JP-A-54-155292, a combination system of a cyclic cis-α-dicarbonyl compound and a dye as described in JP-A-48-84183, a combination system of a cyclic triazine and a merocyanine dye as described in JP-A-54-151024, a combination system of a 3-ketocoumarin and an activator as described in JP-A-52-112681 and JP-A-58-15503, a combination system of a biimidazole, a styrene derivative and a thiol as described in JP-A-59-140203, a combination system of an organic peroxide and a dye as described in JP-A-59-1504, JP-A-59-140203, JP-A-59-189340, JP-A-62-174203, JP-B-62-1641 and U.S. Pat. No. 4,766,055, a combination system of a dye and an active halogen compound as described in JP-A-63-178105, JP-A-63-258903 and JP-A-3-264771, a combination system of a dye and a borate compound as described in JP-A-62-143044, JP-A-62-150242, JP-A-64-13140, JP-A-64-13141, JP-A-64-13142, JP-A-64-13143, JP-A-64-13144, JP-A-64-17048, JP-A-1-229003, JP-A-1-298348 and JP-A-1-138204, a combination system of a dye having a rhodanine ring and a radical generator as described in JP-A-2-179643 and JP-A-2-244050, a combination system of a titanocene and a 3-ketocoumarin dye as described in JP-A-63-221110, a combination system of a titanocene, a xanthene dye and an addition-polymerizable ethylenically unsaturated compound having an amino group or a urethane group as described in JP-A-4-221958 and JP-A-4-219756, a combination system of a titanocene and a specific merocyanine dye as described in JP-A-6-295061, and a combination system of a titanocene and a dye having a benzopyran ring as described in JP-A-8-334897 are exemplified.

Particularly preferred photopolymerization initiators (systems) for use in the photopolymerizable layer (photosensitive layer) of the lithographic printing plate precursor of the invention contain at least one kind of titanocene compounds. The titanocene compound used as the photopolymerization initiator (system) in the invention may be any titanocene compound capable of generating an active radical, when exposed to light in the coexistence with a sensitizing dye described hereinafter. The titanocene compound used can be appropriately selected from known compounds described, for example, in JP-A-59-152396, JP-A-61-151197, JP-A-63-41483, JP-A-63-41484, JP-A-2-249, JP-A-2-291, JP-A-3-27393, JP-A-3-12403 and JP-A-6-41170.

Specific examples thereof include dicyclopentadienyl-Ti-dichloride, dicyclopentadienyl-Ti-bisphenyl, dicyclopentadienyl-Ti-bis-2,3,4,5,6-pentafluorophen-1-yl (hereinafter also referred to as "T-1"), dicyclopentadienyl-Ti-bis-2,3,5,6-tetrafluorophen-1-yl, dicyclopentadienyl-Ti-bis-2,4,6-trifluorophen-1-yl, dicyclopentadienyl-Ti-bis-2,6-difluorophen-1-yl, dicyclopentadienyl-Ti-bis-2,4-difluorophen-1-yl, dimethylcyclopentadienyl-Ti-bis-2,3,4,5,6-pentafluorophen-1-yl, dimethylcyclopentadienyl-Ti-bis-2,3,5,6-tetrafluorophen-1-yl, dimethylcyclopentadienyl-Ti-bis-2,4-difluorophen-1-yl and bis(cyclopentadienyl)-bis-(2,6-difluoro-3-(pyr-1-1yl)phenyl)titanium.

The titanocene compound can be subjected to various chemical modifications for further improving characteristics of the photopolymerizable layer. Methods, for example, connection to a sensitizing dye or a radical-generating part, for example, an addition polymerizable unsaturated compound, introduction of a hydrophilic moiety, introduction of a substituent for improving compatibility or restraining deposition of crystals, introduction of a substituent for improving an adhesion property or polymerization can be utilized.

With respect to a method of using the titanocene compound, a suitable method can be appropriately selected depending upon the designed performances of the lithographic printing plate precursor similar to the addition polymerizable compound described hereinafter. For instance, compatibility with the photopolymerizable layer can be enhanced by using two or more of the titanocene compounds in combination. As to an amount of the photopolymerization initiator, for example, titanocene compound used, a large amount of the photopolymerization initiator is ordinarily more advantageous in view of the sensitivity. A sufficient sensitivity can be obtained by using the photopolymerization initiator preferably in an amount from 0.1 to 50% by weight, more preferably from 0.5 to 30% by weight, particularly preferably from 1 to 20% by weight, based on the total solid content of the photopolymerizable layer. On the other hand, when the lithographic printing plate precursor is used under a yellow lamp or a white lamp, it is preferred that the amount of the titanocene compound is small in order to prevent the formation of fog due to light of approximately 500 nm. By using the titanocene compound in combination with a sensitizing dye, a sufficient sensitivity can be achieved even when the amount of the titanocene compound is reduced to as small as 6 parts by weight or less, further 1.9 parts by weight or less, still further 1.4 parts by weight or less, per 100 parts by weight of the nonvolatile component of the photopolymerizable layer.

As a polymerization initiator for initiating or advancing a curing reaction of the addition polymerizable compound described hereinafter used in the invention, a radical generator of a thermal decomposable type, which is decomposed by heat to generate a radical, is useful. In a system where such a radical generator is used together with the infrared absorbing agent described above, the infrared absorbing agent generates heat upon irradiation of an infrared laser and by the heat, a radical is formed, thereby enabling recording with such a combination use.

Examples of the radical generator include an onium salt, a triazine compound having a trihalomethyl group, a peroxide, an azo-type polymerization initiator, an azide compound, a quinonediazide, an oxime ester compound and a triaryl monoalkyl borate compound. Of the compounds, the onium salt and oxime ester compound are preferred because of high sensitivity. The onium salt that is preferably used as the polymerization initiator in the invention is described below. Preferred examples of the onium salt include an iodonium salt, a diazonium salt and a sulfonium salt. In the invention, the onium salt functions not as an acid generator but as an initiator of radical polymerization. The onium salts preferably used in the invention include onium salts represented by the following formulae (A) to (C).

$$Ar^{11}—I^{+}—Ar^{12} \quad (Z^{11})^{-} \tag{A}$$

$$Ar^{21}—N^{+}{\equiv}N \quad (Z^{21})^{-} \tag{B}$$

(C)

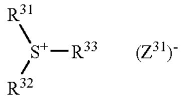

In formula (A), $Ar^{11}$ and $Ar^{12}$ each independently represents an aryl group having 20 or less carbon atoms, which may have a substituent. When the aryl group has a substituent, preferred examples of the substituent include a halogen atom, a nitro group, an alkyl group having 12 or less carbon atoms, an alkoxy group having 12 or less carbon atoms and an aryloxy group having 12 or less carbon atoms. $Z^{11-}$ represents a counter ion selected from a halogen ion, a perchlorate ion, a tetrafluoroborate ion, hexafluorophosphate ion, a carboxylate ion and a sulfonate ion, and is preferably a perchlorate ion, a hexafluorophosphate ion, a carboxylate ion or an arylsulfonate ion.

In formula (B), $Ar^{21}$ represents an aryl group having 20 or less carbon atoms, which may have a substituent. Preferred examples of the substituent include a halogen atom, a nitro group, an alkyl group having 12 or less carbon atoms, an alkoxy group having 12 or less carbon atoms, an aryloxy group having 12 or less carbon atoms, an alkylamino group having 12 or less carbon atoms, a dialkylamino group having 12 or less carbon atoms, an arylamino group having 12 or less carbon atoms and a diarylamino group having 12 or less carbon atoms. $Z^{21-}$ represents a counter ion having the same meaning as defined for $Z^{11-}$.

In formula (C), $R^{31}$, $R^{32}$ and $R^{33}$, which may be the same or different, each represents a hydrocarbon group having 20 or less carbon atoms, which may have a substituent. Preferred examples of the substituent include a halogen atom, a nitro group, an alkyl group having 12 or less carbon atoms, an alkoxy group having 12 or less carbon atoms and an aryloxy group having 12 or less carbon atoms. $Z^{31-}$ represents a counter ion having the same meaning as defined for $Z^{11-}$.

Specific examples of the onium salts, which can be preferably used as the polymerization initiator (radical generator) in the invention, include onium salts described in JP-A-2001-133969, JP-A-2001-343742, JP-A-2002-6482 and JP-A-2002-148790. Specific examples of the onium salts ([OI-1] to [OI-10]) represented by formula (A), the onium salts ([ON-1] to [ON-5]) represented by formula (B), and the onium salts ([OS-1] to [OS-11]) represented by formula (C), which can be preferably used in the invention, are set forth below but the invention should not be construed as being limited thereto.

[OI-1]
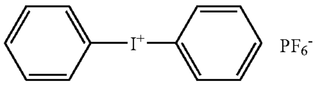
[OI-2]
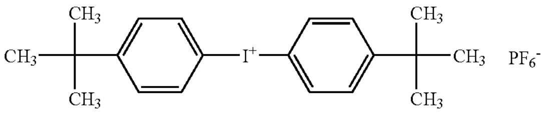
[OI-3]
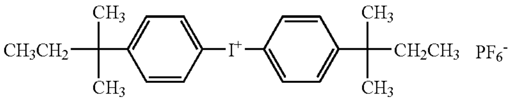
[OI-4]
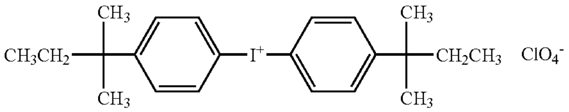
[OI-5]
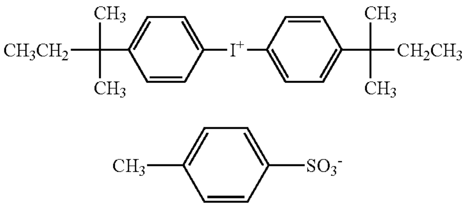
[OI-6]
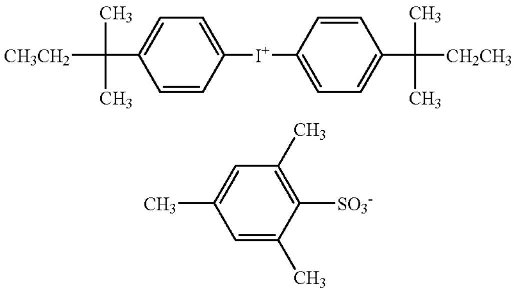
[OI-7]
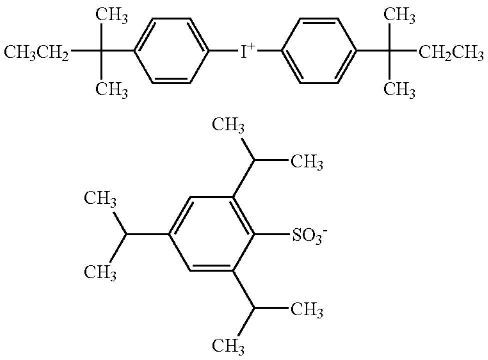
[OI-8]
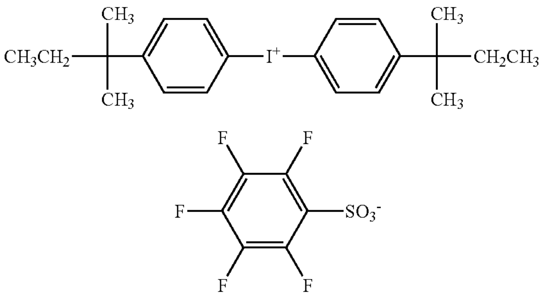
[OI-9]
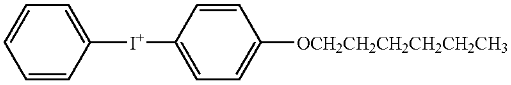
[OI-10]
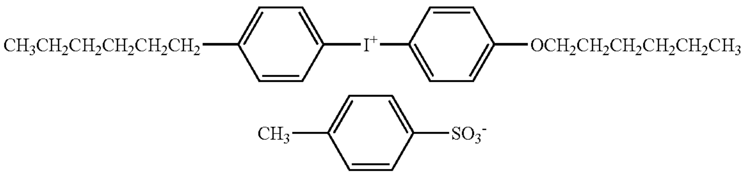
[ON-1]
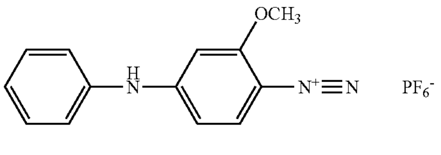
[ON-2]
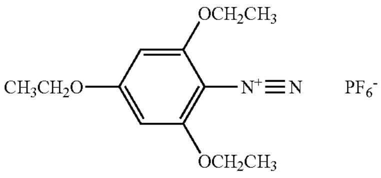

-continued
[ON-3]
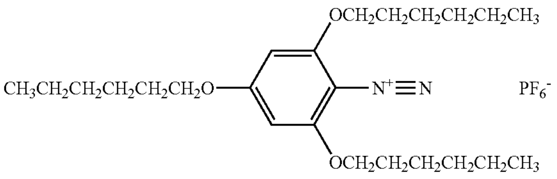
[ON-4]
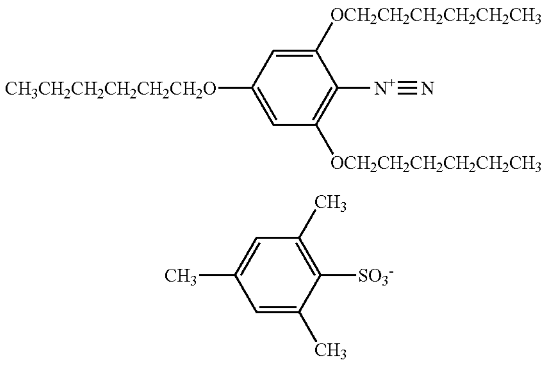
[ON-5]
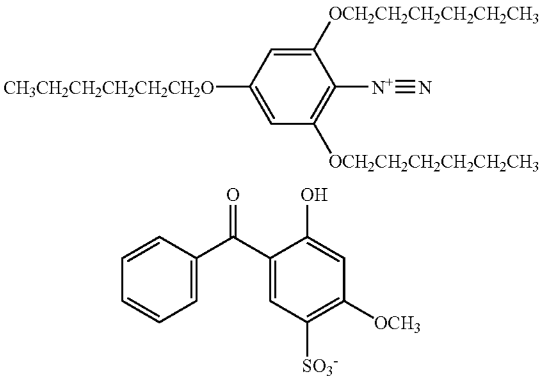
[OS-1]
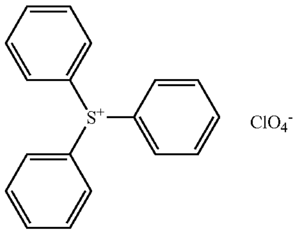
[OS-2]
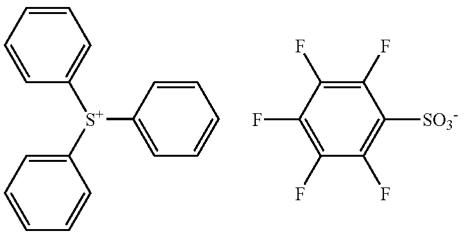
[OS-3]
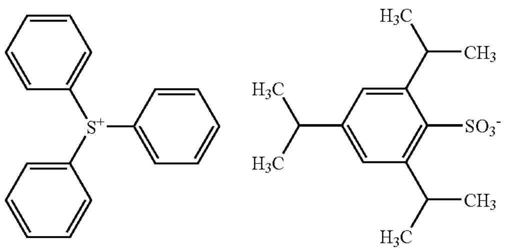
[OS-4]
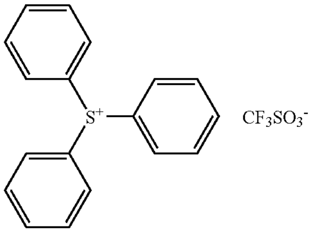
[OS-5]
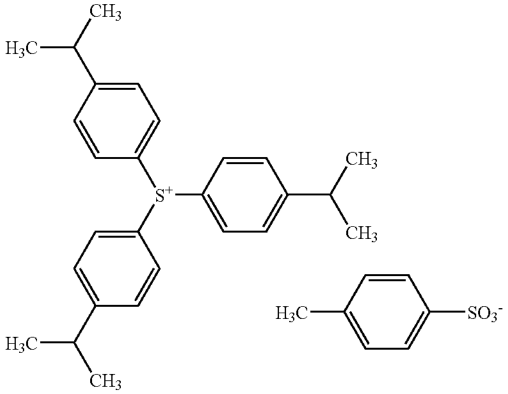

-continued

[OS-6]

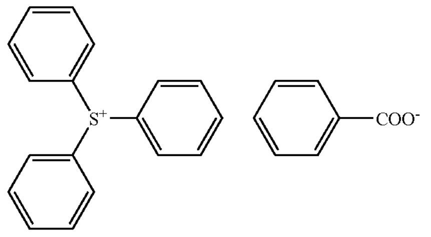

[OS-7]

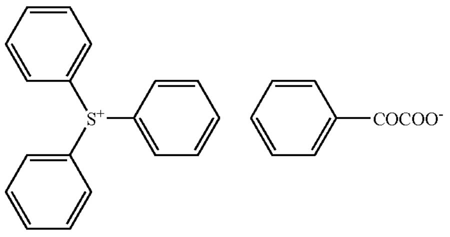

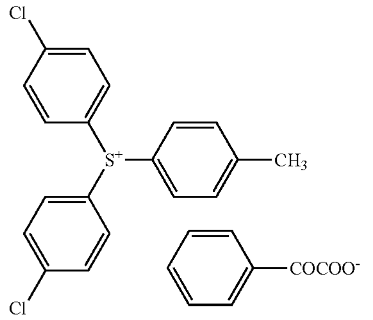

[OS-9]

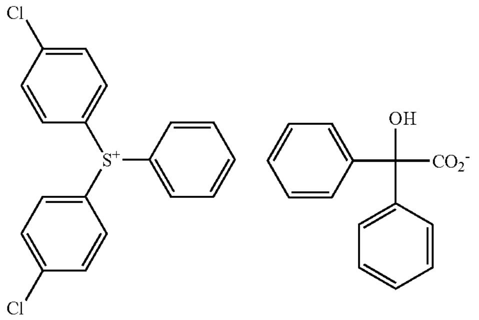

[OS-10]

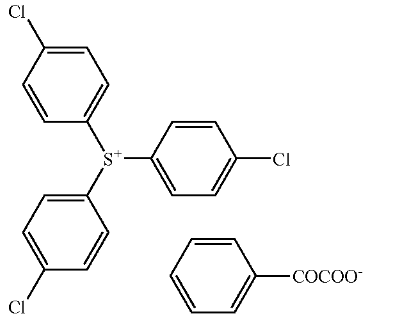

[OS-11]

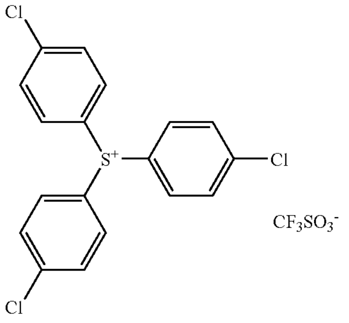

Specific examples of the triazine compound having a trihalomethyl group include 2,4,6-tris(monochloromethyl)-s-triazine, 2,4,6-tris(dichloromethyl)-s-triazine, 2,4,6-tris(trichloromethyl)-s-triazine, 2-methyl-4,6-bis(trichloromethyl)-s-triazine, 2-n-propyl-4,6-bis(trichloromethyl)-s-triazine, 2-(α,α,β-trichloroethyl)-4,6-bis(trichloromethyl)-s-triazine, 2-phenyl-4,6-bis(trichloromethyl)-s-triazine, 2-(p-methoxyphenyl)-4,6-bis(trichloromethyl)-s-triazine, 2-(p-trifluoromethylphenyl-4,6-bis(trichloromethyl)-s-triazine, 2-[4-(4-hydroxybenzoylamino)phenyl]-4,6-bis(trichloromethyl)-s-triazine, 2-[4-(N,N-diphenylamino)phenyl]-4,6-bis(trichloromethyl)-s-triazine, 2-(3,4-epoxyphenyl)-4,6-bis(trichloromethyl)-s-triazine, 2-(p-chlorophenyl)-4,6-bis(trichloromethyl)-s-triazine, 2-[1-(p-methoxyphenyl)-2,4-butadienyl]-4,6-bis(trichloromethyl)-s-triazine, 2-styryl-4,6-bis(trichloromethyl)-s-triazine, 2-(p-methoxystyryl-4,6-bis(trichloromethyl)-s-triazine, 2-(p-isopropyloxystyryl-4,6-bis(trichloromethyl)-s-triazine, 2-(p-tolyl)-4,6-bis(trichloromethyl)-s-triazine, 2-(4-methoxynaphthyl)-4,6-bis(trichloromethyl)-s-triazine, 2-phenylthio-4,6-bis(trichloromethyl)-s-triazine, 2-benzylthio-4,6-bis(trichloromethyl)-s-triazine, 2,4,6-tris(dibromomethyl)-s-triazine, 2,4,6-tris(tribromomethyl)-s-triazine, 2-methyl-4,6-bis(tribromomethyl)-s-triazine and 2-methoxy-4,6-bis(tribromomethyl)-s-triazine.

Examples of the triaryl monoalkyl borate compound include tetra-n-butylammonium triphenyl n-butyl borate.

The oxime ester compound which can be preferably used as the polymerization initiator in the invention is described below. Preferable examples of the oxime ester compound include compounds represented by the following formula (D).

(D)

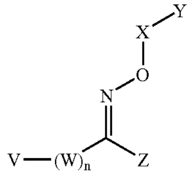

In formula (D), X represents a carbonyl group, a sulfone group or a sulfoxide group. Y represents a cyclic or chain alkyl group having from 1 to 12 carbon atoms, an alkenyl group, an alkynyl group, an aryl group having from 6 to 18 carbon atoms or a heterocyclic group. The aryl group includes an aromatic hydrocarbon group, for example, a benzene group, a naphthalene group, an anthracene group, a phenanthrene group, a pyrene group or a triphenylene group, and the heterocyclic group includes an aromatic group having at least one of a nitrogen atom, a sulfur atom and an oxygen atom in the cyclic structure thereof, for example, a pyrrole group, a furan group, a thiophene group, a selenophene group, a pyrazole group, an imidazole group, a triazole group, a tetrazole group, an oxazole group, a thiazole group, an indole group, a benzofuran group, a benzimidazole group, a benzoxazole group, a benzothiazole group, a pyridine group, a pyrimidine group, a pyrazine group, a triazine group, a quinoline group, a carbazole group, an acrydine group, a phenoxazine group and a phenothiazine group. The group represented by Y may be substituted with a halogen atom, a hydroxy group, a nitrile group, a nitro group, a carboxy group, an aldehyde group, an alkyl group, a thiol group, an aryl group, or a compound containing an alkenyl group, an alkynyl group, an ether group, an ester group, a urea group, an amino group, an amido group, a sulfido group, a disulfido group, a sulfoxido group, a sulfo group, a sulfone group, a hydrazine group, a carbonyl group, an imino group, a halogen atom, a hydroxy group, a nitrile group, a nitro group, a carboxy group, a carbonyl group, a urethane group, an alkyl group, a thiol group, an aryl group, a phosphoroso group, a phospho group or a carbonyl ether group.

In formula (D), Z has the same meaning as Y or represents a nirtile group, a halogen atom, a hydrogen atom or an amino group. The group represented by Z may be substituted with a halogen atom, a hydroxy group, a nitrile group, a nitro group, a carboxy group, an aldehyde group, an alkyl group, a thiol group, an aryl group, or a compound containing an alkenyl group, an alkynyl group, an ether group, an ester group, a urea group, an amino group, an amido group, a sulfido group, a disulfido group, a sulfoxido group, a sulfo group, a sulfone group, a hydrazine group, a carbonyl group, an imino group, a halogen atom, a hydroxy group, a nitrile group, a nitro group, a carboxy group, a carbonyl group, a urethane group, an alkyl group, a thiol group, an aryl group, a phosphoroso group, a phospho group or a carbonyl ether group.

In formula (D), W represents a divalent organic group, for example, a methylene group, a carbonyl group, a sulfoxido group, a sulfone group or an inino group. The methylene group and imino group may be each substituted with a group containing an alkyl group, an aryl group, an ester group, a nitrile group, a carbonyl ether group, a sulfo group, a sulfo ether group or an ether group. n represents an integer of 0 or 1.

In formula (D), V represents a cyclic or chain alkyl group having from 1 to 12 carbon atoms, an alkenyl group, an alkynyl group, an aryl group having from 6 to 18 carbon atoms, an alkoxy group or an aryloxy group. The aryl group includes an aromatic hydrocarbon group, for example, a benzene group, a naphthalene group, an anthracene group, a phenanthrene group, a pyrene group or a triphenylene group, and a hetero atom-containing aromatic group, for example, a pyrrole group, a furan group, a thiophene group, a selenophene group, a pyrazole group, an imidazole group, a triazole group, a tetrazole group, an oxazole group, a thiazole group, an indole group, a benzofuran group, a benzimidazole group, a benzoxazole group, a benzothiazole group, a pyridine group, a pyrimidine group, a pyrazine group, a triazine group, a quinoline group, a carbazole group, an acrydine group, a phenoxazine group and a phenothiazine group. The group represented by V may be substituted with a halogen atom, a hydroxy group, a nitrile group, a nitro group, a carboxy group, an aldehyde group, an alkyl group, a thiol group, an aryl group, or a compound containing an alkenyl group, an alkynyl group, an ether group, an ester group, a urea group, an amino group, an amido group, a sulfido group, a disulfido group, a sulfoxido group, a sulfo group, a sulfone group, a hydrazine group, a carbonyl group, an imino group, a halogen atom, a hydroxy group, a nitrile group, a nitro group, a carboxy group, a carbonyl group, a urethane group, an alkyl group, a thiol group, an aryl group, a phosphoroso group, a phospho group or a carbonyl ether group.

Alternatively, V and Z may be combined with each other to from a ring.

In the oxime ester compound represented by formula (D), it is preferred from the standpoint of sensitivity that X represents a carbonyl group, Y represents an aryl group or a benzoyl group, Z represents an alkyl group or an aryl group, W represents a carbonyl group and V represents an aryl group. It is more preferred that the aryl group represented by V has a thioether substituent.

The structure of N—O bond in formula (D) may be any one of E isomer and Z isomer.

Examples of the oxime ester compound preferably used in the invention include compounds described in *Progress in Organic Coatings,* 13, 123-150 (1985), *J. C. S. Perkin II,* 1653-1660 (1979), *Journal of Photopolymer Science and Technology,* 205-232 (1995), *J. C. S. Perkin II,* 156-162 (1979), JP-A-2000-66385 and JP-A-2000-80068.

Specific examples of the oxime ester compound preferably used in the invention are set forth below, but the invention should not be construed as being limited thereto.

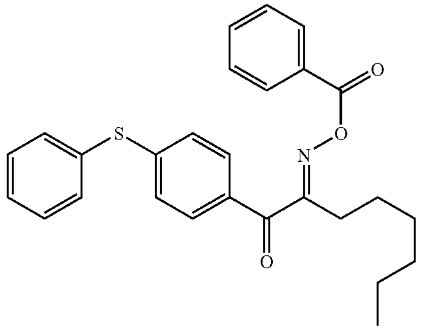

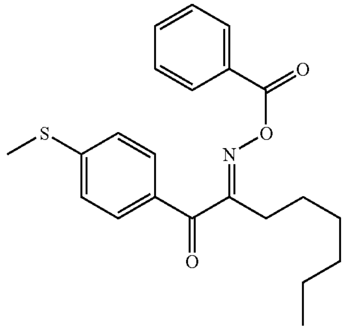

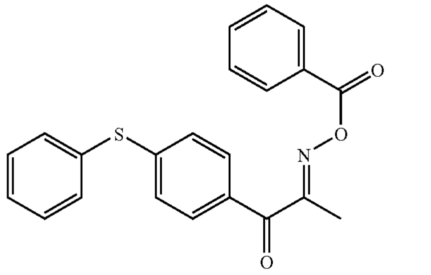

-continued
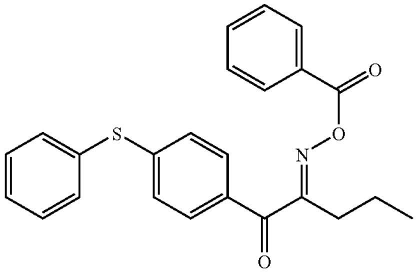
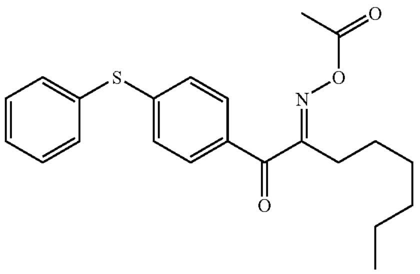
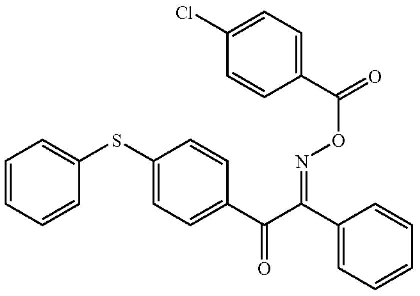
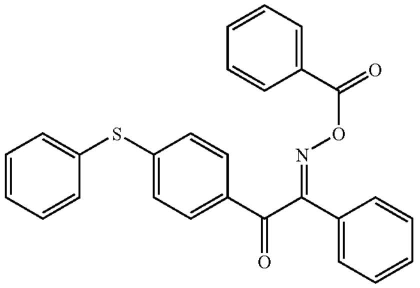
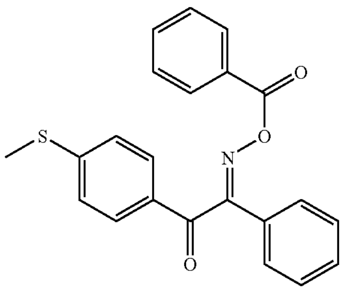
-continued
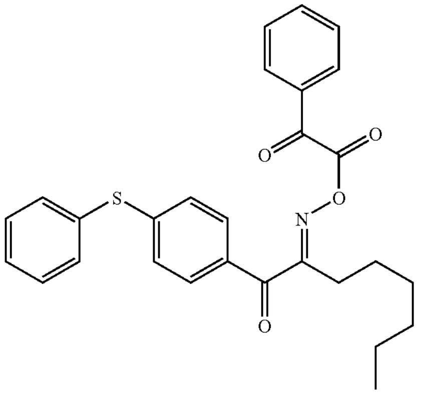
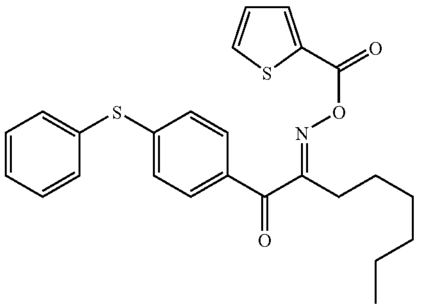
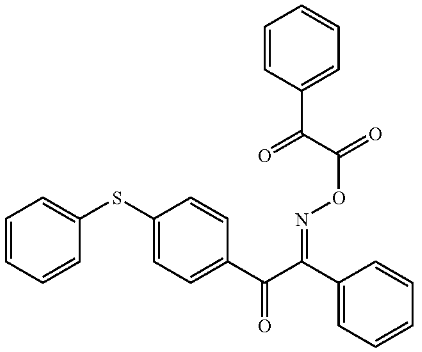
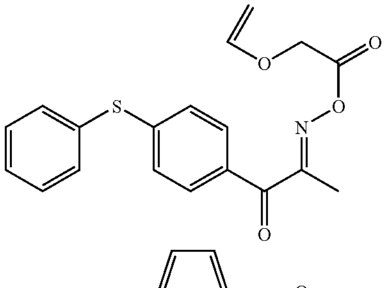
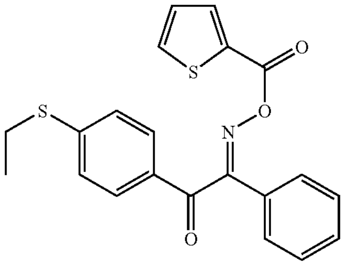

-continued
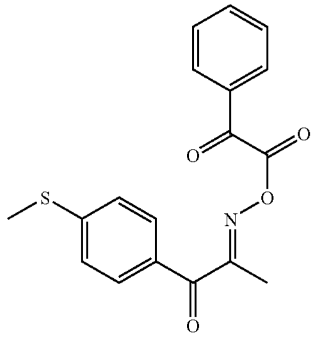
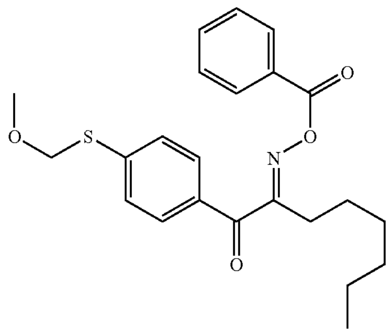
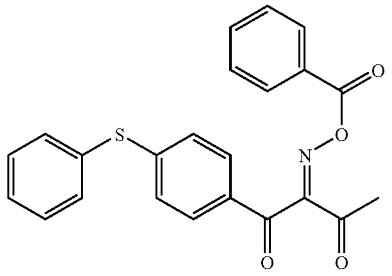
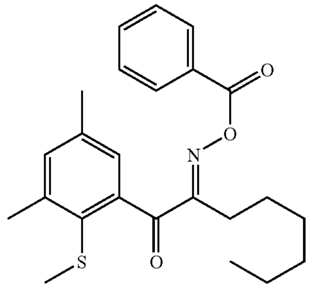
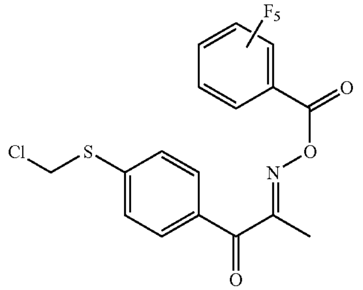
-continued
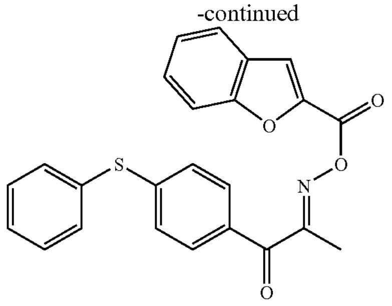
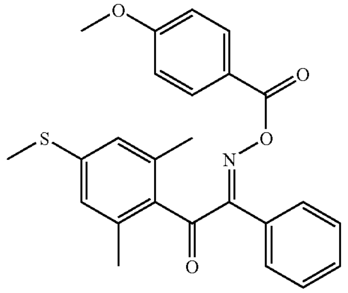
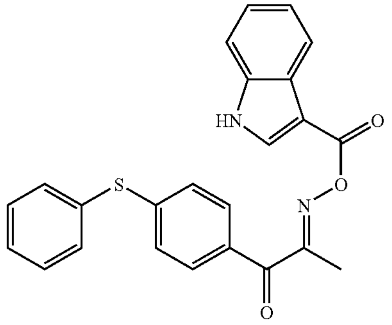
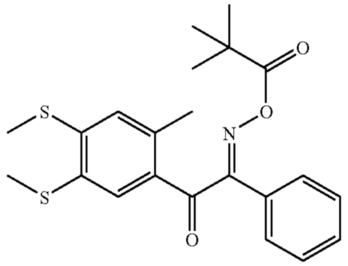
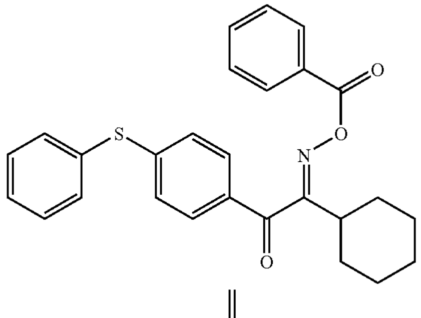
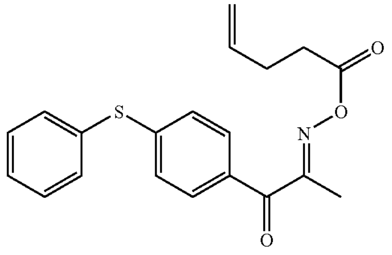

-continued
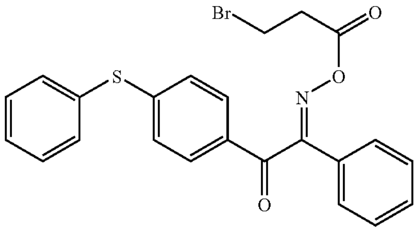
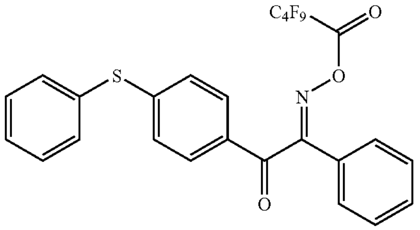
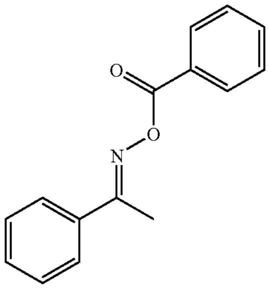
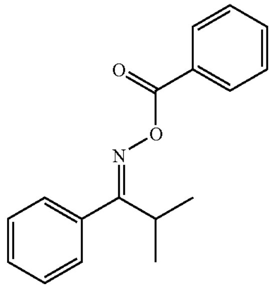
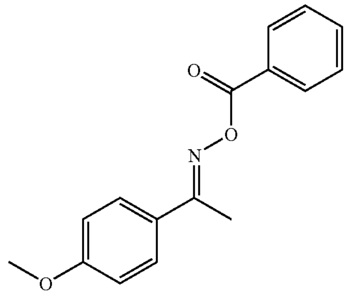
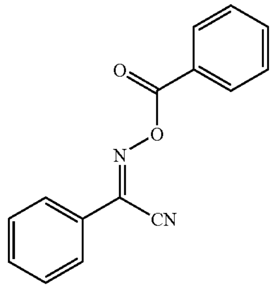
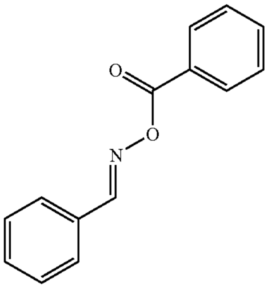
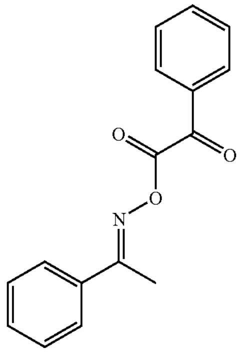
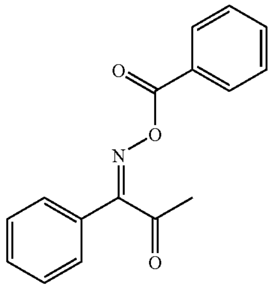
-continued
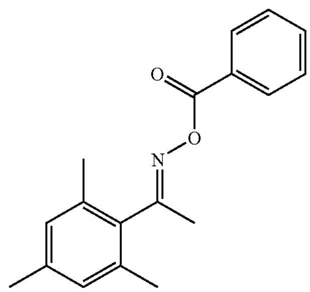
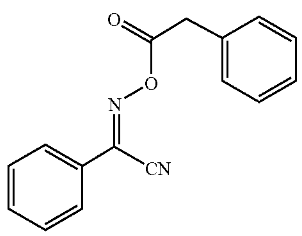
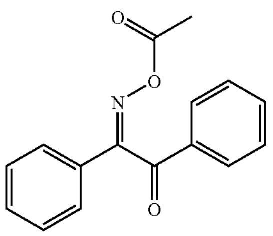
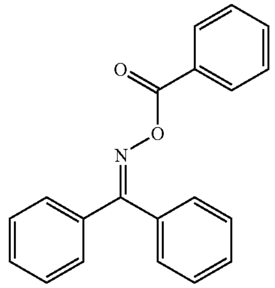
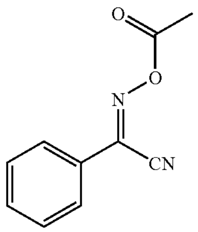
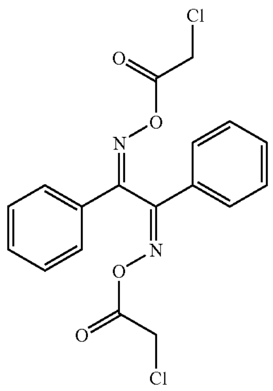
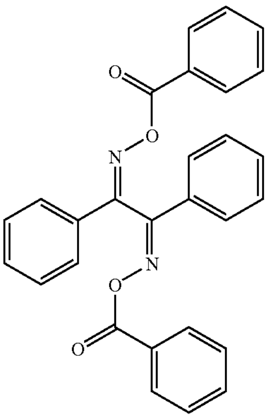
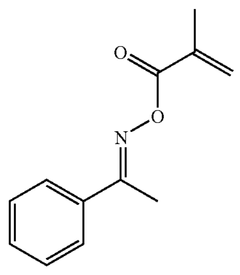
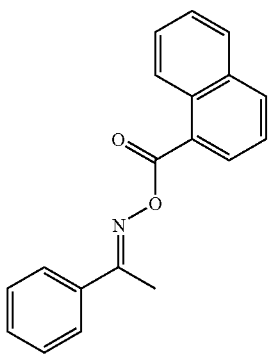

-continued
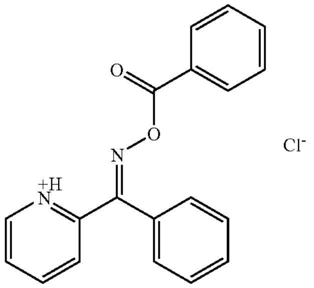
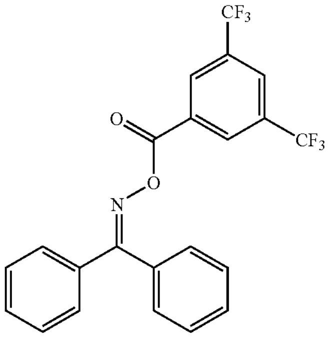
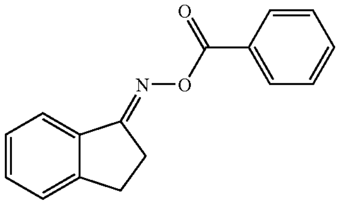
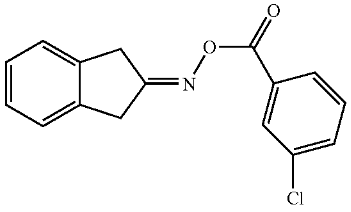
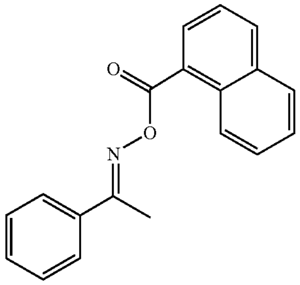
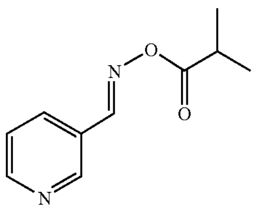
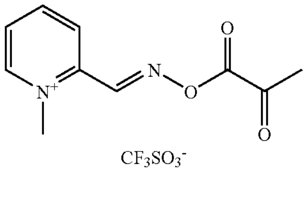
-continued
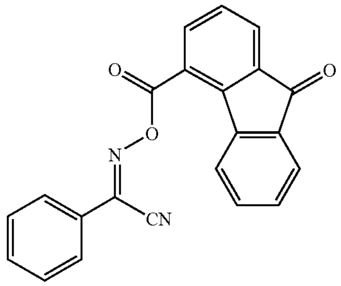
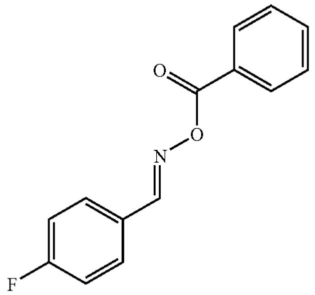
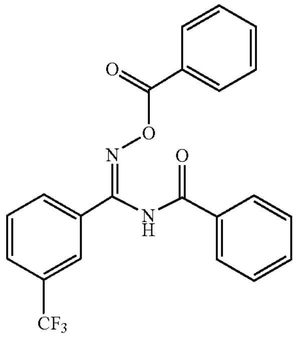
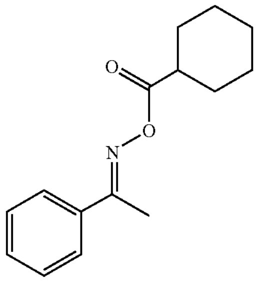
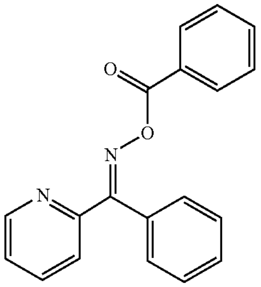
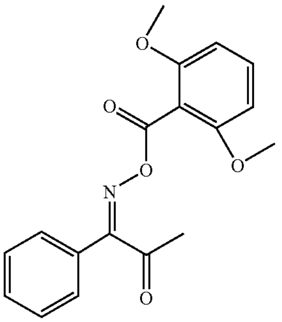
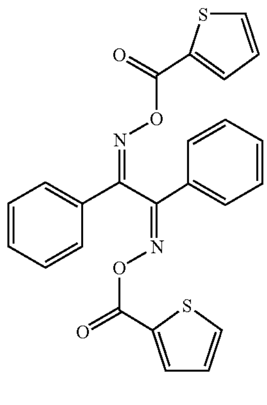
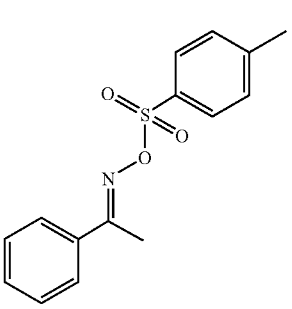

-continued
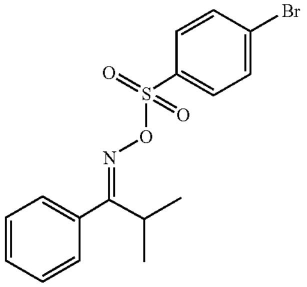
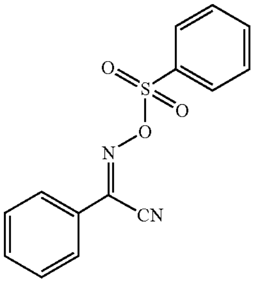
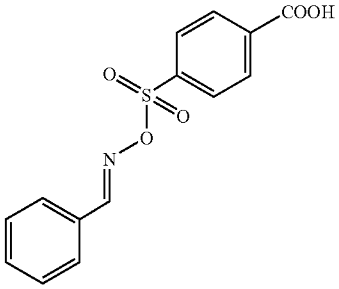
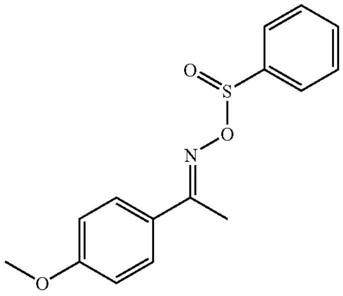
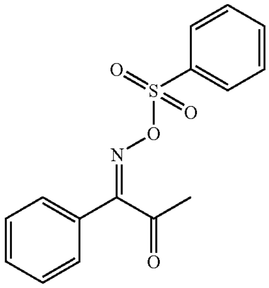
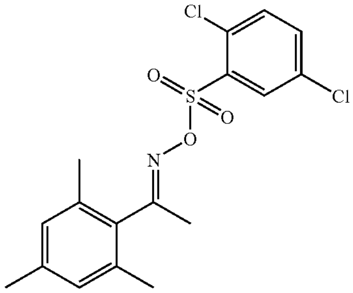
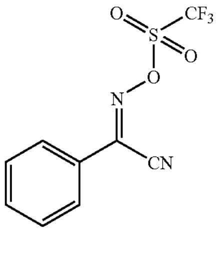
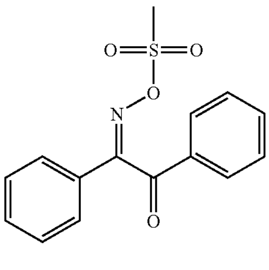
-continued
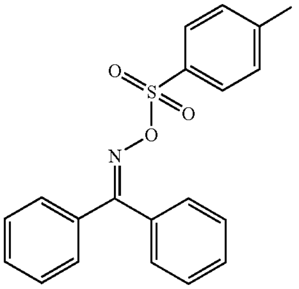
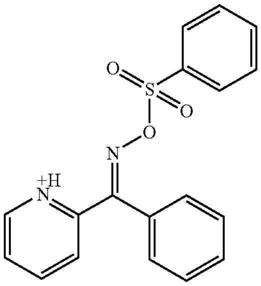
$CF_3SO_3^-$
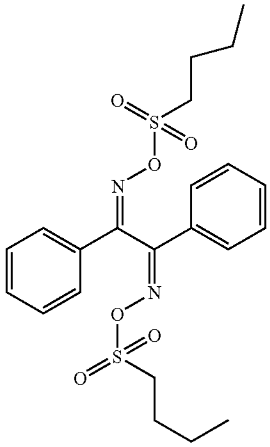
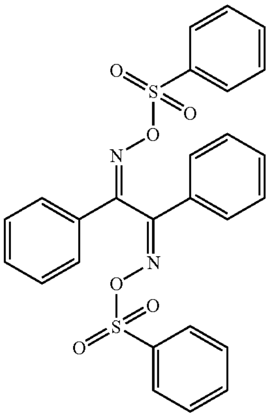
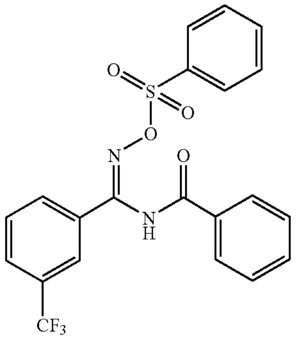
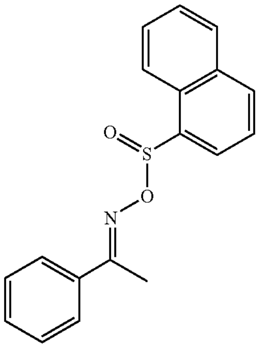
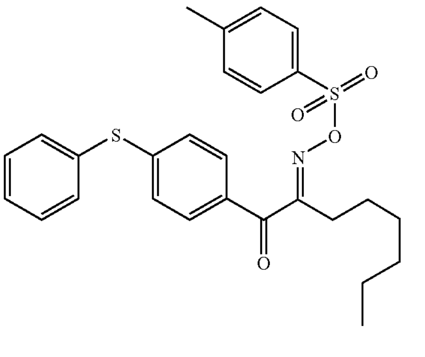

-continued
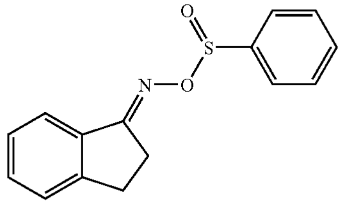
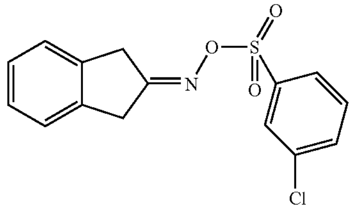
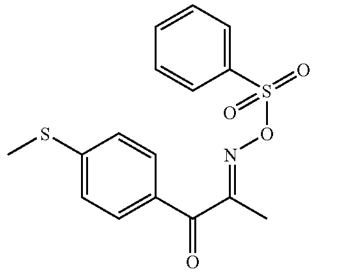
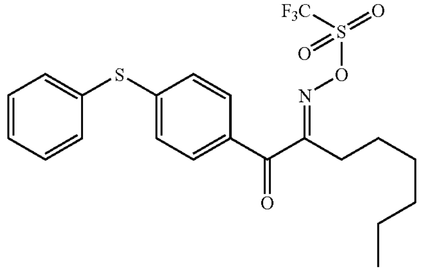
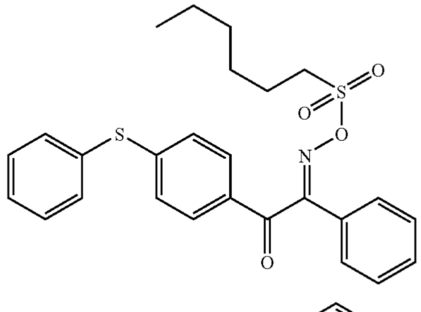
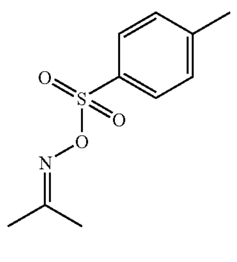
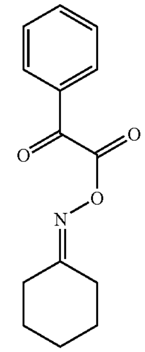
-continued
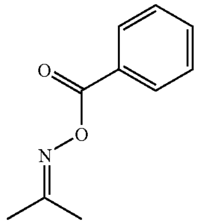
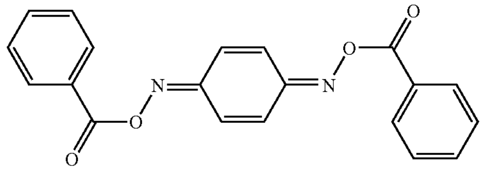
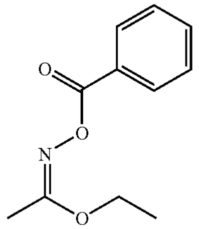
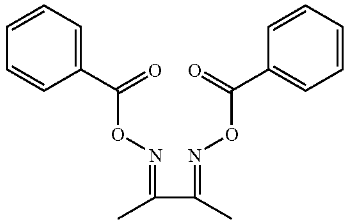
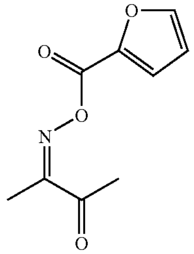
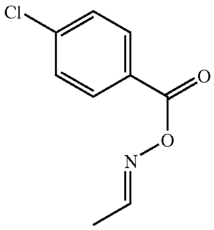
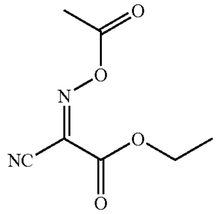
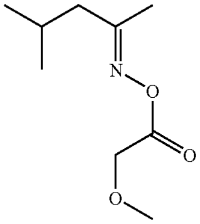
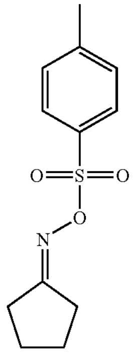
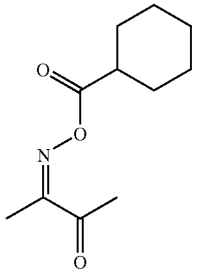

-continued

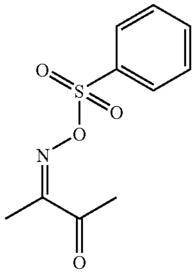

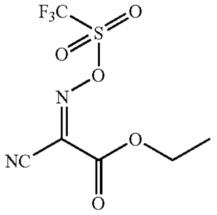

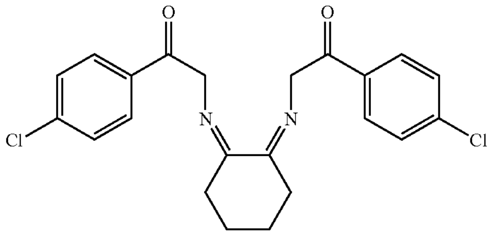

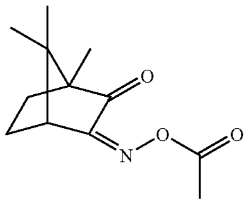

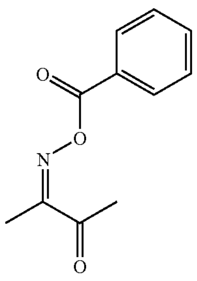

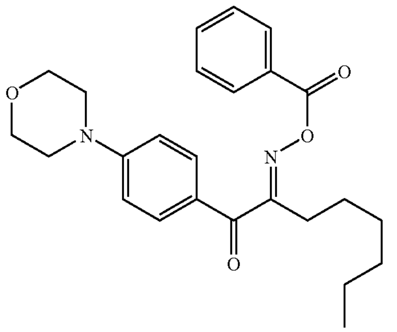

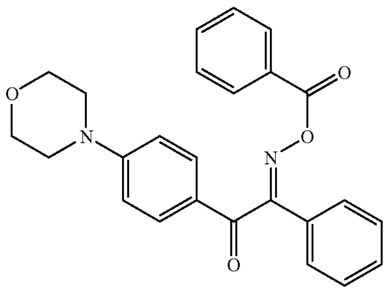

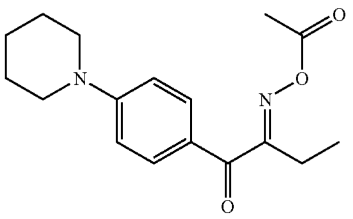

-continued

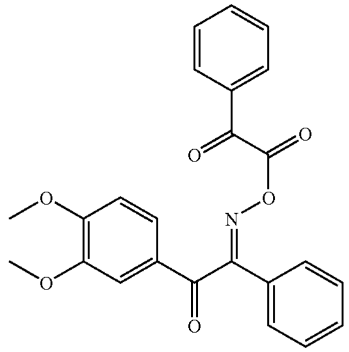

The polymerization initiator for use in the invention has preferably an absorption maximum wavelength of 400 nm or shorter, more preferably 360 nm or shorter. By adjusting the absorption wavelength in an ultraviolet region as above, handling of the lithographic printing plate precursor can be conducted under white light.

The polymerization initiator can be added preferably in an amount from 0.1 to 50% by weight, more preferably from 0.5 to 30% by weight, particularly preferably from 1 to 20% by weight, based on the total solid content of the photopolymerizable layer in view of the sensitivity and stain occurred in the non-image area at the printing. The polymerization initiators may be used individually or in combination of two or more thereof. Further, the polymerization initiator may be added together with other components to one layer or may be added to a different layer separately provided.

<Sensitizing Dye>

In the lithographic printing plate precursor of the invention, the photopolymerizable layer may contain a sensitizing dye. The sensitizing dye preferably has an absorption peak in a region of 350 to 850 nm. Examples of the sensitizing dye include a spectral sensitizing dye and a dye or pigment that absorbs light of a light source and interacts with the polymerization initiator as described below.

Preferred examples of the spectral sensitizing dye and dye include polynuclear aromatic compounds (e.g., pyrene, perylene or triphenylene), xanthenes (e.g., fluorescein, Eosine, Erythrosine, Rhodamine B or Rose Bengale), cyanines (e.g., thiacarbocyanine or oxacarbocyanine), merocyanines (e.g., merocyanine or carbomerocyanine), thiazines (e.g., Thionine, Methylene Blue or Toluidine Blue), acridines (e.g., Acridine Orange, chloroflavine or acriflavine), phthalocyanines (e.g., phthalocyanine or metal phthalocyanine), porphyrins (e.g., tetraphenylporphyrin or center metal-substituted porphyrin), chlorophylls (e.g., chlorophyll, chlorophyllin or center metal-substituted chlorophyll), metal complexes, anthraquinones (e.g., anthraquinone) and squaliums (e.g., squalium).

More preferred examples of the spectral sensitizing dye and dye include styryl dyes as described in JP-B-37-13034, cationic dyes as described in JP-A-62-143044, quinoxalinium salts as described in JP-B-59-24147, new Methylene Blue compounds as described in JP-A-64-33104, anthraquinones as described in JP-A-64-56767, benzoxanthene dyes as described in JP-A-2-1714, acridines as described in JP-A-2-226148 and JP-A-2-226149, pyrylium salts as described in JP-B-40-28499, cyanines as described in JP-B-46-42363, benzofuran dyes as described in JP-A-2-63053, conjugated ketone dyes as described in JP-A-2-85858 and JP-A-2-216154, dyes as described in JP-A-57-10605, azocinnamylidene derivatives as described in JP-B-2-30321, cyanine dyes as described in JP-A-1-287105, xanthene dyes as described in JP-A-62-31844, JP-A-62-31848 and JP-A-62-143043, aminostyryl ketones as described in JP-B-59-28325, merocycnine dyes as described in JP-B-61-9621, dyes as described in JP-A-2-179643, merocycnine dyes as described in JP-A-2-244050, merocycnine dyes as described in JP-B-59-28326, merocycnine dyes as described in JP-A-59-89803 and JP-A-8-129257, benzopyran dyes as described in JP-A-8-334897 and styryl compounds as described in 2001-100412 and 2003-221517.

An amount of the sensitizing dye added is preferably from 0.1 to 50% by weight, more preferably from 0.5 to 30% by weight, and particularly preferably from 1 to 20% by weight, based on the total solid content of the photopolymerizable layer.

<(C) Polymerizable Compound>

The polymerizable compound for use in the invention is an addition-polymerizable compound having at least one ethylenically unsaturated double bond and it is selected from compounds having at least one, preferably two or more, terminal ethylenically unsaturated double bonds. Such compounds are broadly known in the field of art and they can be used in the invention without any particular limitation. The compound has a chemical form, for example, a monomer, a prepolymer, specifically, a dimer, a trimer or an oligomer, or a copolymer thereof, or a mixture thereof. Examples of the monomer include unsaturated carboxylic acids (for example, acrylic acid, methacrylic acid, itaconic acid, crotonic acid, isocrotonic acid or maleic acid) and esters or amides thereof. Preferably, esters of an unsaturated carboxylic acid with an aliphatic polyhydric alcohol compound and amides of an unsaturated carboxylic acid with an aliphatic polyvalent amine compound are used. An addition reaction product of an unsaturated carboxylic acid ester or amide having a nucleophilic substituent, for example, a hydroxy group, an amino group or a mercapto group, with a monofunctional or polyfunctional isocyanate or epoxy, or a dehydration condensation reaction product of the unsaturated carboxylic acid ester or amide with a monofunctional or polyfunctional carboxylic acid is also preferably used. Furthermore, an addition reaction product of an unsaturated carboxylic acid ester or amide having an electrophilic substituent, for example, an isocyanato group or an epoxy group with a monofunctional or polyfunctional alcohol, amine or thiol, or a substitution reaction product of an unsaturated carboxylic acid ester or amide having a releasable substituent, for example, a halogen atom or a tosyloxy group with a monofunctional or polyfunctional alcohol, amine or thiol is also preferably used. In addition, compounds in which the unsaturated carboxylic acid described above is replaced by an unsaturated phosphonic acid, styrene, vinyl ether or the like can also be used.

Specific examples of the monomer, which is an ester of an aliphatic polyhydric alcohol compound with an unsaturated carboxylic acid, include acrylic acid esters, for example, ethylene glycol diacrylate, triethylene glycol diacrylate, 1,3-butanediol diacrylate, tetramethylene glycol diacrylate, propylene glycol diacrylate, neopentyl glycol diacrylate, trimethylolpropane triacrylate, trimethylolpropane tri(acryloyloxypropyl)ether, trimethylolethane triacrylate, hexanediol diacrylate, 1,4-cyclohexanediol diacrylate, tetraethylene glycol diacrylate, pentaerythritol diacrylate, pentaerythritol triacrylate, pentaerythritol tetraacrylate, dipentaerythritol diacrylate, dipentaerythritol hexaacrylate, sorbitol triacrylate, sorbitol tetraacrylate, sorbitol pentaacrylate, sorbitol hexaacrylate, tri(acryloyloxyethyl)isocyanurate, polyester acrylate oligomer or isocyanuric acid EO modified triacrylate;

methacrylic acid esters, for example, tetramethylene glycol dimethacrylate, triethylene glycol dimethacrylate, neopentyl glycol dimethacrylate, trimethylolpropane trimethacrylate, trimethylolethane trimethacrylate, ethylene glycol dimethacrylate, 1,3-butanediol dimethacrylate, hexanediol dimethacrylate, pentaerythritol dimethacrylate, pentaerythritol trimethacrylate, pentaerythritol tetramethacrylate, dipentaerythritol dimethacrylate, dipentaerythritol hexamethacrylate, sorbitol trimethacrylate, sorbitol tetramethacrylate, bis[p-(3-methacryloxy-2-hydroxypropoxy)phenyl]dimethylmethane or bis[p-(methacryloxyethoxy)phenyl]dimethylmethane;

itaconic acid esters, for example, ethylene glycol diitaconate, propylene glycol diitaconate, 1,3-butanediol diitaconate, 1,4-butanediol diitaconate, tetramethylene glycol diitaconate, pentaerythritol diitaconate or sorbitol tetraitaconate; crotonic acid esters, for example, ethylene glycol dicrotonate, tetramethylene glycol dicrotonate, pentaerythritol dicrotonate or sorbitol tetradicrotonate; isocrotonic acid esters, for example, ethylene glycol diisocrotonate, pentaerythritol diisocrotonate or sorbitol tetraisocrotonate; and maleic acid esters, for example, ethylene glycol dimaleate, triethylene glycol dimaleate, pentaerythritol dimaleate and sorbitol tetramaleate.

Other examples of the ester, which can be preferably used, include aliphatic alcohol esters described in JP-B-51-47334 and JP-A-57-196231, esters having an aromatic skeleton described in JP-A-59-5240, JP-A-59-5241 and JP-A-2-226149, and esters containing an amino group described in JP-A-1-165613.

The above-described ester monomers can also be used as a mixture.

Specific examples of the monomer, which is an amide of an aliphatic polyvalent amine compound with an unsaturated carboxylic acid, include methylene bisacrylamide, methylene bismethacrylamide, 1,6-hexamethylene bisacrylamide, 1,6-hexamethylene bismethacrylamide, diethylenetriamine trisacrylamide, xylylene bisacrylamide and xylylene bismethacrylamide. Other preferred examples of the amide monomer include amides having a cyclohexylene structure described in JP-B-54-21726.

Urethane type addition polymerizable compounds produced using an addition reaction between an isocyanate and a hydroxy group are also preferably used, and specific examples thereof include vinylurethane compounds having two or more polymerizable vinyl groups per molecule obtained by adding a vinyl monomer containing a hydroxy group represented by formula (A) shown below to a polyisocyanate compound having two or more isocyanate groups per molecule, described in JP-B-48-41708.

$$CH_2{=}C(R_4)COOCH_2CH(R_5)OH \qquad (A)$$

wherein $R_4$ and $R_5$ each independently represents H or $CH_3$.

Also, urethane acrylates described in JP-A-51-37193, JP-B-2-32293 and JP-B-2-16765, and urethane compounds having an ethylene oxide skeleton described in JP-B-58-49860, JP-B-56-17654, JP-B-62-39417 and JP-B-62-39418 are preferably used. Furthermore, a photopolymerizable composition having remarkably excellent photosensitive speed can be obtained by using an addition polymerizable compound having an amino structure or a sulfide structure in its molecule, described in JP-A-63-277653, JP-A-63-260909 and JP-A-1-105238.

Other examples include polyfunctional acrylates and methacrylates, for example, polyester acrylates and epoxy acrylates obtained by reacting an epoxy resin with (meth) acrylic acid, described in JP-A-48-64183, JP-B-49-43191 and JP-B-52-30490. Specific unsaturated compounds described in JP-B-46-43946, JP-B-1-40337 and JP-B-1-40336, and vinylphosphonic acid type compounds described in JP-A-2-25493 can also be exemplified. In some cases, structure containing a perfluoroalkyl group described in JP-A-61-22048 can be preferably used. Moreover, photo-curable monomers or oligomers described in *Nippon Secchaku Kyokaishi* (*Journal of Japan Adhesion Society*), Vol. 20, No. 7, pages 300 to 308 (1984) can also be used.

Details of the method of using the polymerizable compound, for example, selection of the structure, individual or combination use, or an amount added, can be appropriately arranged depending on the characteristic design of the final lithographic printing plate precursor. For instance, the compound is selected from the following standpoints.

In view of the sensitivity, a structure having a large content of unsaturated groups per molecule is preferred and in many cases, a bifunctional or more functional compound is preferred. In order to increase the strength of image area, that is, hardened layer, a trifunctional or more functional compound is preferred. A combination use of compounds different in the functional number or in the kind of polymerizable group (for example, an acrylic acid ester, a methacrylic acid ester, a styrene compound or a vinyl ether compound) is an effective method for controlling both the sensitivity and the strength.

The selection and use method of the polymerizable compound are also important factors for the compatibility and dispersibility with other components (for example, a binder polymer, a polymerization initiator or a coloring agent) in the photopolymerizable layer. For instance, the compatibility may be improved in some cases by using the compound of low purity or using two or more kinds of the compounds in combination. A specific structure may be selected for the purpose of improving an adhesion property to a support or a protective layer described hereinafter.

The polymerizable compound is preferably used in an amount from 5 to 80% by weight, more preferably from 25 to 75% by weight, based on the total solid content of the photopolymerizable layer. The polymerizable compounds may be used individually or in combination of two or more thereof. In the method of using the polymerizable compound, the structure, blend and amount added can be appropriately selected by taking account of the extent of polymerization inhibition due to oxygen, resolution, fogging property, change in refractive index, surface adhesion and the like. Further, depending on the case, a layer construction, for example, an undercoat layer or an overcoat layer, and a coating method, may also be considered.

<(D) Binder Polymer>

As the binder polymer for use in the invention, those heretofore known can be used without restriction, and a polymer having a film forming property is preferred. Examples of the binder polymer include acrylic resins, polyvinyl acetal resins, polyurethane resins, polyurea resins, polyimide resins, polyamide resins, epoxy resins, methacrylic resins, polystyrene resins, novolac type phenolic resins, polyester resins, synthesis rubbers and natural rubbers.

The binder polymer may have a crosslinkable property in order to improve the film strength of the image area. In order to impart the crosslinkable property to the binder polymer, a crosslinkable functional group, for example, an ethylenically unsaturated bond is introduced into a main chain or side chain of the polymer. The crosslinkable functional group may be introduced by copolymerization.

Examples of the polymer having an ethylenically unsaturated bond in the main chain thereof include poly-1,4-butadiene and poly-1,4-isoprene.

Examples of the polymer having an ethylenically unsaturated bond in the side chain thereof include a polymer of an ester or amide of acrylic acid or methacrylic acid, which is a polymer wherein the ester or amido residue (R in —COOR or —CONHR) has an ethylenically unsaturated bond.

Examples of the residue (R described above) having an ethylenically unsaturated bond include $-(CH^2)_nCR^1=CR^2R^3$, $-(CH_2O)_nCH_2CR^1=CR^2R^3$, $-(CH_2CH_2O)_nCH_2CR^1=CR^2R^3$, $-(CH_2)_nNH-CO-O-CH_2CR^1=CR^2R^3$, $-(CH_2)_n-O-CO-CR^1=CR^2R^3$ and $-(CH_2CH_2O)_2-X$ (wherein $R^1$ to $R^3$ each represents a hydrogen atom, a halogen atom or an alkyl group having from 1 to 20 carbon atoms, an aryl group, alkoxy group or aryloxy group, or $R^1$ and $R^2$ or $R^1$ and $R^3$ may be combined with each other to form a ring. n represents an integer of 1 to 10. X represents a dicyclopentadienyl residue).

Specific examples of the ester residue include $-CH_2CH=CH_2$ (described in JP-B-7-21633), $-CH_2CH_2O-CH_2CH=CH_2$, $-CH_2C(CH_3)=CH_2$, $-CH_2CH=CH-C_6H_5$, $-CH_2CH_2OCOCH=CH-C_6H_5$, $-CH_2CH_2-NHCOO-CH_2CH=CH_2$ and $-CH_2CH_2O-X$ (wherein X represents a dicyclopentadienyl residue).

Specific examples of the amido residue include $-CH_2CH=CH_2$, $-CH_2CH_2-Y$ (wherein Y represents a cyclohexene residue) and $-CH_2CH_2-OCO-CH=CH_2$.

The binder polymer having a crosslinkable property is hardened, for example, by adding a free radical (a polymerization initiating radical or a growing radical of a polymerizable compound during polymerization) to the crosslinking functional group of the polymer and undergoing addition polymerization between the polymers directly or through a polymerization chain of the polymerizable compound to form crosslinkage between the polymer molecules. Alternately, it is hardened by generation of a polymer radical upon extraction of an atom (for example, a hydrogen atom on a carbon atom adjacent to the functional crosslinking group) in the polymer by a free radial and connecting the polymer radicals with each other to form cross-linkage between the polymer molecules.

A content of the crosslinkable group in the binder polymer (content of the radical polymerizable unsaturated double bond determined by iodine titration) is preferably from 0.1 to 10.0 mmol, more preferably from 1.0 to 7.0 mmol and most preferably from 2.0 to 5.5 mmol, based on 1 g of the binder polymer. In the above-described range, preferable sensitivity and good preservation stability can be obtained.

From the standpoint of improvement in the on-machine developing property of the unexposed area in the photopolymerizable layer, it is preferred that the binder polymer has high solubility or dispersibility in ink and/or dampening water.

In order to improve the solubility or dispersibility in the ink, the binder polymer is preferably oleophilic and in order to improve the solubility or dispersibility in the dampening water, the binder polymer is preferably hydrophilic. Therefore, it is also effective in the invention that an oleophilic binder polymer and a hydrophilic binder polymer are used in combination.

The hydrophilic binder polymer preferably includes, for example, a polymer having a hydrophilic group, for example, a hydroxy group, a carboxy group, a carboxylate group, a hydroxyethyl group, a polyoxyethyl group, a hydroxypropyl group, a polyoxypropyl group, an amino group, an aminoethyl group, an aminopropyl group, an ammonium group, an amido group, a carboxymethyl group, a sulfonic acid group or a phosphoric acid group.

Specific examples thereof include gum arabic, casein, gelatin, a starch derivative, carboxy methyl cellulose and a sodium salt thereof, cellulose acetate, sodium alginate, vinyl acetate-maleic acid copolymer, styrene-maleic acid copolymer, polyacrylic acid and a salt thereof, polymethacrylic acid and a salt thereof, a homopolymer or copolymer of hydroxyethyl methacrylate, a homopolymer or copolymer of hydroxyethyl acrylate, a homopolymer or copolymer of hydroxypropyl methacrylate, a homopolymer or copolymer of hydroxypropyl acrylate, a homopolymer or copolymer of hydroxybutyl methacrylate, a homopolymer or copolymer of hydroxybutyl acrylate, a polyethylene glycol, a hydroxypropylene polymer, a polyvinyl alcohol, a hydrolyzed polyvinyl acetate having a hydrolysis degree of 60% by mole or more, preferably 80% by mole or more, a polyvinyl formal, a polyvinyl butyral, a polyvinyl pyrrolidone, a homopolymer or copolymer of acrylamide, a homopolymer or polymer of methacrylamide, a homopolymer or copolymer of N-methylolacrylamide, a polyvinyl pyrrolidone, an alcohol-soluble nylon, a polyether of 2,2-bis-(4-hydroxyphenyl)propane and epichlorohydrin.

According to the invention, a binder polymer containing an ether group represented by $—[CH_2—(CHR)_m—O]_n—$ in its molecule can also be used. In the formula, R represents a hydrogen atom or a methyl group, m represents 1, 3 or 5, and n represents an integer from 1 to 20. n is preferably an integer from 1 to 8, more preferably an integer from 1 to 7, and most preferably an integer from 1 to 4.

Specifically, a homopolymer or copolymer of acrylate or methacrylate having the above-described ether group in a side chain is exemplified. Examples of the monomer copolymerized include the monomers having a crosslinkable group described above and the other monomers described hereinbefore with respect to the specific copolymer.

The hydrophilicity of the ether group is effective to achieve good on-machine developing property.

A weight average molecular weight of the binder polymer is preferably 5,000 or more, more preferably from 10,000 to 300,000. A number average molecular weight of the binder polymer is preferably 1,000 or more, more preferably from 2,000 to 250,000. The polydispersity (weight average molecular weight/number average molecular weight) thereof is preferably from 1.1 to 10.

A content of the binder polymer (D) is preferably from 5 to 90% by weight, more preferably from 5 to 80% by weight, still more preferably from 10 to 70% by weight, based on the total solid content of the photopolymerizable layer. In the above-described range, good strength of the image area and good image-forming property can be obtained.

A weight ratio of the polymerizable compound (C) to the binder polymer (D) used is preferably from 0.5/1 to 4/1.

<Microcapsule>

In the invention, several embodiments can be employed in order to incorporate the above-described constituting components (A) to (D) of the photopolymerizable layer and other constituting components described hereinafter into the photopolymerizable layer. One embodiment is a photopolymerizable layer of molecular dispersion type prepared by dissolving the constituting components in an appropriate solvent to coat as described, for example, in JP-A-2002-287334. Another embodiment is a photopolymerizable layer of microcapsule type prepared by encapsulating all or a part of the constituting components into microcapsules to incorporate into the photopolymerizable layer as described, for example, in JP-A-2001-277740 and JP-A-2001-277742. In the photopolymerizable layer of microcapsule type, the constituting components may be present outside the microcapsules. It is a more preferred embodiment of the photopolymerizable layer of microcapsule type that the hydrophobic constituting components is encapsulated in microcapsules and the hydrophilic components are present outside the microcapsules. In order to achieve more preferred on-machine developing property, the photopolymerizable layer is preferably the photopolymerizable layer of microcapsule type.

As a method of microencapsulating the constituting components of the photopolymerizable layer, known methods can be used. Methods of manufacturing microcapsules include, for example, a method of utilizing coacervation described in U.S. Pat. Nos. 2,800,457 and 2,800,458, a method of using interfacial polymerization described in U.S. Pat. No. 3,287,154, JP-B-38-19574 and JP-B-42-446, a method of using deposition of polymer described in U.S. Pat. Nos. 3,418,250 and 3,660,304, a method of using an isocyanate polyol wall material described in U.S. Pat. No. 3,796,669, a method of using an isocyanate wall material described in U.S. Pat. No. 3,914,511, a method of using a urea-formaldehyde-type or urea-formaldehyde-resorcinol-type wall-forming material described in U.S. Pat. Nos. 4,001,140, 4,087,376 and 4,089,802, a method of using a wall material, for example, a melamine-formaldehyde resin or hydroxycellulose described in U.S. Pat. No. 4,025,445, an in-situ method by monomer polymerization described in JP-B-36-9163 and JP-B-51-9079, a spray drying method described in British Patent 930,422 and U.S. Pat. No. 3,111,407, and an electrolytic dispersion cooling method described in British Patents 952,807 and 967,074, but the invention should not be construed as being limited thereto.

A preferred microcapsule wall used in the invention has three-dimensional crosslinking and has a solvent-swellable property. From this point of view, a preferred wall material of the microcapsule includes polyurea, polyurethane, polyester, polycarbonate, polyamide and a mixture thereof, and particularly polyurea and polyurethane are preferred. Further, a compound having a crosslinkable functional group, for example, an ethylenically unsaturated bond, capable of being introduced into the binder polymer (D) described above may be introduced into the microcapsule wall.

An average particle size of the microcapsule is preferably from 0.01 to 3.0 μm, more preferably from 0.05 to 2.0 μm, and particularly preferably from 0.10 to 1.0 μm. In the above-described range, preferable resolution and good preservation stability can be achieved.

<Surfactant>

In the invention, it is preferred to use a surfactant in the photopolymerizable layer in order to promote the on-machine developing property at the start of printing and to improve the state of coated surface. The surfactant includes, for example, a nonionic surfactant, an anionic surfactant, a cationic surfactant, an amphoteric surfactant and a fluorine-based surfactant. The surfactants may be used individually or in combination of two or more thereof.

The nonionic surfactant used in the invention is not particular restricted, and those hitherto known can be used. Examples of the nonionic surfactant include polyoxyethylene alkyl ethers, polyoxyethylene alkyl phenyl ethers, polyoxyethylene polystyryl phenyl ethers, polyoxyethylene polyoxypropylene alkyl ethers, glycerin fatty acid partial esters, sorbitan fatty acid partial esters, pentaerythritol fatty acid partial esters, propylene glycol monofatty acid esters, sucrose fatty acid partial esters, polyoxyethylene sorbitan fatty acid partial esters, polyoxyethylene sorbitol fatty acid partial esters, polyethylene glycol fatty acid esters, polyglycerol fatty acid partial esters, polyoxyethylenated castor oils, polyoxyethylene glycerol fatty acid partial esters, fatty acid diethanolamides, N,N-bis-2-hydroxyalkylamines, polyoxyethylene alkylamines, triethanolamine fatty acid esters, trialylamine oxides, polyethylene glycols, and copolymers of polyethylene glycol and polypropylene glycol.

The anionic surfactant used in the invention is not particularly restricted and those hitherto known can be used. Examples of the anionic surfactant include fatty acid salts, abietic acid salts, hydroxyalkanesulfonic acid salts, alkanesulfonic acid salts, dialkylsulfosuccinic ester salts, straight-chain alkylbenzenesulfonic acid salts, branched alkylbenzenesulfonic acid salts, alkylnaphthalenesulfonic acid salts, alkylphenoxypolyoxy ethylene propylsulfonic acid salts, polyoxyethylene alkylsulfophenyl ether salts, N-methyl-N-oleyltaurine sodium salt, N-alkylsulfosuccinic monoamide disodium salts, petroleum sulfonic acid salts, sulfated beef tallow oil, sulfate ester slats of fatty acid alkyl ester, alkyl sulfate ester salts, polyoxyethylene alkyl ether sulfate ester salts, fatty acid monoglyceride sulfate ester salts, polyoxyethylene alkyl phenyl ether sulfate ester salts, polyoxyethylene styrylphenyl ether sulfate ester salts, alkyl phosphate ester salts, polyoxyethylene alkyl ether phosphate ester salts, polyoxyethylene alkyl phenyl ether phosphate ester salts, partial saponification products of styrene/maleic anhydride copolymer, partial saponification products of olefin/maleic anhydride copolymer and naphthalene sulfonate formalin condensates.

The cationic surfactant used in the invention is not particularly restricted and those hitherto known can be used. Examples of the cationic surfactant include alkylamine salts, quaternary ammonium salts, polyoxyethylene alkyl amine salts and polyethylene polyamine derivatives.

The amphoteric surfactant used in the invention is not particularly restricted and those hitherto known can be used. Examples of the amphoteric surfactant include carboxybetaines, aminocarboxylic acids, sulfobetaines, aminosulfuric esters and imidazolines.

In the surfactants described above, the term "polyoxyethylene" can be replaced with "polyoxyalkylene", for example, polyoxymethylene, polyoxypropylene or polyoxybutylene, and such surfactants can also be used in the invention.

Further, a preferred surfactant includes a fluorine-based surfactant containing a perfluoroalkyl group in its molecule. Examples of the fluorine-based surfactant include an anionic type, for example, perfluoroalkyl carboxylates, perfluoroalkyl sulfonates or perfluoroalkylphosphates; an amphoteric type, for example, perfluoroalkyl betaines; a cationic type, for example, perfluoroalkyl trimethyl ammonium salts; and a nonionic type, for example, perfluoroalkyl amine oxides, perfluoroalkyl ethylene oxide adducts, oligomers having a perfluoroalkyl group and a hydrophilic group, oligomers having a perfluoroalkyl group and an oleophilic group, oligomers having a perfluoroalkyl group, a hydrophilic group and an oleophilic group or urethanes having a perfluoroalkyl group and an oleophilic group. Further, fluorine-based surfactants described in JP-A-62-170950, JP-A-62-226143 and JP-A-60-168144 are also preferably exemplified.

The surfactants may be used individually or in combination of two or more thereof.

A content of the surfactant is preferably from 0.001 to 10% by weight, more preferably from 0.01 to 5% by weight, based on the total solid content of the photopolymerizable layer.

<Coloring Agent>

In the invention, other various compounds may be added to the photopolymerizable layer, if desired. For instance, a dye having a large absorption in the visible region can be used as a coloring agent of the image formed. Specifically, the dye includes Oil yellow #101, Oil yellow #103, Oil pink #312, Oil green BG, Oil blue BOS, Oil blue #603, Oil black BY, Oil black BS, Oil black T-505 (produced by Orient Chemical Industries, Ltd.), Victoria pure blue, Crystal violet (CI42555), Methyl violet (CI42535), Ethyl violet, Rhodamine B (CI45170B), Malachite green (CI42000), Methylene blue (CI52015) and dyes described in JP-A-62-293247. Further, a pigment, for example, a phthalocyanine pigment, an azo pigment, carbon black or titanium oxide can also preferably be used.

It is preferred to add the coloring agent since distinction between the image area and the non-image area is easily conducted after the formation of image. An amount of the coloring agent added is preferably from 0.01 to 10% by weight based on the total solid content of the photopolymerizable layer.

<Print-out Agent>

To the photopolymerizable layer according to the invention, a compound causing discoloration by an acid or a radical can be added in order to form a print-out image. As such a compound, various kinds of dyes, for example, dyes of diphenylmethane type, triphenylmethane type, triazine type, oxazine type, xanthene type, anthraquinone type, iminoquinone type, azo type and azomethine type are effectively used.

Specific examples thereof include dyes, for example, Brilliant green, Ethyl violet, Methyl green, Crystal violet, basic Fuchsine, Methyl violet 2B, Quinaldine red, Rose Bengal, Methanyl yellow, Thimol sulfophthalein, Xylenol blue, Methyl orange, Paramethyl red, Congo red, Benzo purpurin 4B, α-Naphthyl red, Nile blue 2B, Nile blue A, Methyl violet, Malachite green, Parafuchsine, Victoria pure blue BOH (produced by Hodogaya Chemical Co., Ltd.), Oil blue #603 (produced by Orient Chemical Industries, Ltd.), Oil pink #312 (produced by Orient Chemical Industries, Ltd.), Oil red 5B (produced by Orient Chemical Industries, Ltd.), Oil scarlet #308 (produced by Orient Chemical Industries, Ltd.), Oil red OG (produced by Orient Chemical Industries, Ltd.), Oil red RR (produced by Orient Chemical Industries, Ltd.), Oil green #502 (produced by Orient Chemical Industries, Ltd.), Spiron Red BEH special (produced by Hodogaya Chemical Co., Ltd.), m-Cresol purple, Cresol red, Rhodamine B, rhodamine 6G, Sulfo rhodamine B, Auramine, 4-p-diethylaminophenyliminonaphthoquione, 2-carboxyanilino-4-p-diethylaminophenyliminonaphthoquinone, 2-carboxystearylamino-4-p-N,N-bis(hydroxyethyl)aminophenyliminonaphthoquinone, 1-phenyl-3-methyl-4-p-diethylaminophenylimino-5-pyrazolon or 1-β-naphtyl-4-p-diethylaminophenylimino-5-pyrazolon, and a leuco dye, for example, p, p',p"-hexamethyltriaminotriphenylmethane (leuco crystal violet) or Pergascript Blue SRB (produced by Ciba Geigy Ltd.).

In addition to those described above, a leuco dye known as a material for heat-sensitive paper or pressure-sensitive paper is also preferably used. Specific examples thereof include crystal violet lactone, malachite green lactone, benzoyl leuco methylene blue, 2-(N-phenyl-N-methylamino)-6-(N-p-tolyl-N-ethyl)aminofluoran, 2-anilino-3-methyl-6-(n-ethyl-p-tolidino)fluoran, 3,6-dimethoxyfluoran, 3-(N,N-diethylamino)-5-methyl-7-(N,N-dibenzylamino)fluoran, 3-(N-cyclohexyl-N-methylamino)-6-methyl-7-anilinofluoran, 3-(N-N-diethylamino)-6-methyl-7-anilinofluoran, 3-(N,N-diethylamino)-6-methyl-7-xylidinofluoran, 3-(N,N-diethylamino)-6-methyl-7-chlorofluoran, 3-(N,N-diethylamino)-6-methoxy-7-aminofluoran, 3-(N,N-diethylamino)-7-(4-chloroanilino)fluoran, 3-(N,N-diethylamino)-7-chlorofluoran, 3-(N,N-diethylamino)-7-benzylaminofluoran, 3-(N,N-diethylamino)-7,8-benzofluoran, 3-(N,N-dibutylamino)-6-methyl-7-anilinofluoran, 3-(N,N-dibutylamino)-6-methyl-7-xylidinofluoran, 3-pipelidino-6-methyl-7-anilinofluoran, 3-pyrolidino-6-methyl-7-anilinofluoran, 3,3-bis(1-ethyl-2-methylindol-3-yl)phthalide, 3,3-bis(1-n-butyl-2-methylindol-3-yl)phthalide, 3,3-bis(p-dimethylaminophenyl)-6-dimethylaminophthalide, 3-(4-diethylamino-2-ethoxyphenyl)-3-(1-ethyl-2-methylindol-3-yl)-4-phthalide and 3-(4-diethylaminophenyl)-3-(1-ethyl-2-methylindol-3-yl) phthalide.

The dye discolored by an acid or radical is preferably added in an amount of 0.01 to 15% by weight based on the solid content of the photopolymerizable layer.

<Polymerization Inhibitor>

It is preferred to add a small amount of a thermal polymerization inhibitor to the photopolymerizable layer according to the invention in order to prevent undesirable thermal polymerization of the polymerizable compound (C) during the production or preservation of the photopolymerizable layer.

The thermal polymerization inhibitor preferably includes, for example, hydroquinone, p-methoxyphenol, di-tert-butyl-p-cresol, pyrogallol, tert-butyl catechol, benzoquinone, 4,4'-thiobis(3-methyl-6-tert-butylphenol), 2,2'-methylenebis(4-methyl-6-tert-butylphenol) and N-nitroso-N-phenylhydroxylamine aluminum salt.

The thermal polymerization inhibitor is preferably added in an amount of about 0.01 to about 5% by weight based on the total solid content of the photopolymerizable layer.

<Higher Fatty Acid Derivative>

To the photopolymerizable layer according to the invention, a higher fatty acid derivative, for example, behenic acid or behenic acid amide may be added to localize on the surface of the photopolymerizable layer during a drying step after coating in order to avoid polymerization inhibition due to oxygen. An amount of the higher fatty acid derivative added is preferably from about 0.1 to about 10% by weight based on the total solid content of the photopolymerizable layer.

<Plasticizer>

The photopolymerizable layer according to the invention may also contain a plasticizer in order to improve the on-machine developing property.

The plasticizer preferably includes, for example, a phthalic acid ester, e.g., diemthyl phthalate, diethyl phthalate, dibutyl phthalate, diisobutyl phthalate, dioctyl phthalate, octyl capryl phthalate, dicyclohexyl phthalate, ditridecyl phthalate, butyl benzyl phthalate, diisodecyl phthalate or diallyl phthalate; a glycol ester, e.g., dimethylglycol phthalate, ethyl phthalyl ethyl glycolate, methyl phthalyl ethyl glycolate, butyl phthalyl butyl glycolate or triethylene glycol dicaprylate ester; a phosphoric acid ester, e.g., tricresyl phosphate or triphenyl phosphate; an aliphatic dibasic acid ester, e.g., diisobutyl adipate, dioctyl adipate, dimethyl sebacate, dibutyl sebacate, dioctyl azelate or dibutyl maleate; polyglycidyl methacrylate, triethyl citrate, glycerin triacetyl ester and butyl laurate.

The plasticizer is preferably added in an amount of about 30% by weight or less based on the total solid content of the photopolymerizable layer.

<Fine Inorganic Particle>

The photopolymerizable layer according to the invention may contain fine inorganic particle in order to increase strength of the hardened layer in the image area and to improve the on-machine developing property in the non-image area.

The fine inorganic particle preferably includes, for example, silica, alumina, magnesium oxide, titanium oxide, magnesium carbonate, calcium alginate and a mixture thereof. Even if the fine inorganic particle has no light to heat converting property, it can be used, for example, for strengthening the film or enhancing interface adhesion due to surface roughening.

The fine inorganic particle preferably has an average particle size from 5 nm to 10 μm and more preferably from 0.5 to 3 μm. In the above-described range, it is stably dispersed in the photopolymerizable layer, sufficiently maintains the film strength of the photopolymerizable layer and can form the non-imaging area excellent in hydrophilicity and preventing from stain at the printing.

The fine inorganic particle described above is easily available as a commercial product, for example, colloidal silica dispersion.

An amount of the fine inorganic particle added is preferably 40% by weight or less and more preferably 30% by weight or less based on the total solid content of the photopolymerizable layer.

<Hydrophilic Low Molecular Weight Compound>

The photopolymerizable layer according to the invention may contain a hydrophilic low molecular weight compound in order to improve the on-machine developing property. The hydrophilic low molecular weight compound includes a water soluble organic compound, for example, a glycol compound, e.g., ethylene glycol, diethylene glycol, triethylene glycol, propylene glycol, dipropylene glycol or tripropylene glycol, or an ether or ester derivative thereof, a polyhydroxy compound, e.g., glycerine or pentaerythritol, an organic amine, e.g., triethanol amine, diethanol amine or monoethanol amine, or a salt thereof, an organic sulfonic acid, e.g., toluene sulfonic acid or benzene sulfonic acid, or a salt thereof, an organic phosphonic acid, e.g., phenyl phosphonic acid, or a salt thereof, and an organic carboxylic acid, e.g., tartaric acid, oxalic acid, citric acid, maleic acid, lactic acid, gluconic acid or an amino acid, or a salt thereof.

<Formation of Photopolymerizable Layer>

The photopolymerizable layer according to the invention is formed by dissolving or dispersing each of the necessary constituting components described above to prepare a coating solution and coating the solution. The solvent used include, for example, ethylene dichloride, cyclohexanone, methyl ethyl ketone, methanol, ethanol, propanol, ethylene glycol monomethyl ether, 1-methoxy-2-propanol, 2-methxyethyl acetat, 1-methoxy-2-propyl acetate, dimethoxyethane, methyl lactate, ethyl lactate, N,N-dimethylacetoamide, N,N-dimethylformamide, tetramethylurea, N-methylpyrrolidone, dimethylsulfoxide, sulfolane, γ-butyrolactone, toluene and water, but the invention should not be construed as being limited thereto. The solvents may be used individually or as a mixture. The solid concentration of the coating solution is preferably from 1 to 50% by weight.

The photopolymerizable layer according to the invention may also be formed by preparing plural coating solutions by dispersing or dissolving the same or different components described above into the same or different solvents and conducting repeatedly plural coating and drying.

A coating amount (solid content) of the photopolymerizable layer on the support after the coating and drying may be varied depending on the use, but ordinarily, the amount is preferably from 0.3 to 3.0 $g/m^2$. In the above-described range, the preferable sensitivity and good film property of the photopolymerizable layer can be obtained.

Various methods can be used for the coating. Examples of the method include bar coater coating, spin coating, spray coating, curtain coating, dip coating, air knife coating, blade coating and roll coating.

[Back Coat Layer]

After applying the surface treatment or forming the undercoat layer to the support, a back coat layer can be provided on the back surface of the support, if desired.

The back coat layer preferably used includes, for example, a coating layer comprising an organic polymer compound described in JP-A-5-45885 and a coating layer comprising a metal oxide obtained by hydrolysis and polycondensation of an organic metal compound or an inorganic metal compound described in JP-A-6-35174. Among them, use of an alkoxy compound of silicon, for example, $Si(OCH_3)_4$, $Si(OC_2H_5)_4$, $Si(OC_3H_7)_4$ or $Si(OC_4H_9)_4$ is preferred since the starting material is inexpensive and easily available.

[Protective Layer]

In the lithographic printing plate precursor according to the invention, a protective layer (overcoat layer) can be provided on the photopolymerizable layer, if desired, for the purpose of imparting an oxygen blocking property, preventing occurrence of scratches in the photopolymerizable layer, preventing ablation caused by exposure with a high illuminance laser beam, or the like.

The exposure process of the lithographic printing plate precursor is ordinarily conducted in the atmosphere. The image-forming reaction initiated by the exposure process in the photopolymerizable layer may be hindered with a low molecular weight compound, for example, oxygen or a basic substance present in the atmosphere. The protective layer prevents invasion of the low molecular compound, for example, oxygen or a basic substance into the photopolymerizable layer thereby inhibiting the hindrance of the image-forming reaction in the atmosphere. Accordingly, characteristics desired to the protective layer include that it reduces permeation of the low molecular compound, for example, oxygen, that it has good permeation of light used for exposure, that it is excellent in adhesion to the photopolymerizable layer and that it can be easily removed by the on-machine development processing step after exposure. The protective layer having such characteristics is described, for example, in U.S. Pat. No. 3,458,311 and JP-B-55-49729.

As a material for use in the protective layer, any water-soluble polymer and water-insoluble polymer can be appropriately selected to use. Specific examples thereof include a water-soluble polymer, for example, polyvinyl alcohol, modified polyvinyl alcohol, polyvinyl pyrrolidone, polyvinyl imidazole, polyacrylic acid, polyacrylamide, partially saponified product of polyvinyl acetate, ethylene-vinyl alcohol copolymer, water-soluble cellulose derivative, gelatin, starch derivative or gum arabic, and a polymer, for example, polyvinylidene chloride, poly(mth)acrylonitrile, polysulfone, polyvinyl chloride, polyethylene, polycarbonate, polystyrene, polyamide or cellophane. The polymers may be used in combination of two or more thereof, if desired.

Of the above-described materials, as a useful material, a water-soluble polymer compound excellent in crystallinity is exemplified. Specifically, polyvinyl alcohol, polyvinyl pyrrolidone, polyvinyl imidazole, a water-soluble acrylic resin, e.g., polyacrylic acid, gelatin or gum arabic is preferably used. Among them, in view of capability of coating with water as a solvent and easiness of removal with dampening water at the printing, polyvinyl alcohol, polyvinyl pyrrolidone and polyvinyl imidazole are preferable. Above all, polyvinyl alcohol (PVA) provides the most preferable result for the basic characteristics, for example, oxygen blocking property and removability upon development.

The polyvinyl alcohol for use in the protective layer may be partially substituted with ester, ether or acetal as long as it contains a substantial amount of unsubstituted vinyl alcohol units necessary for maintaining water solubility. Also, the polyvinyl alcohol may partially contain other copolymerization components. For instance, polyvinyl alcohols of various polymerization degrees having at random a various kind of hydrophilic modified cites, for example, an anion-modified cite modified with an anion, e.g., a carboxy group or a sulfo group, a cation-modified cite modified with a cation, e.g., an amino group or an ammonium group, a silanol-modified cite or a thiol-modified cite, and polyvinyl alcohols of various polymerization degrees having at the terminal of the polymer having a various kind of modified cites, for example, the above-described anion-modified cite, cation modified cite, silanol-modified cite or thiol-modified cite, an alkoxy-modified cite, a sulfide-modified cite, an ester modified cite of vinyl alcohol with a various kind of organic acids, an ester modified cite of the above-described anion-modified cite with an alcohol or an epoxy-modified cite are also preferably used.

As the modified polyvinyl alcohol, compounds having a hydrolysis rate of 71 to 100% by mole and a polymerization degree ranging from 300 to 2,400 are preferably used. Specific examples of the polyvinyl alcohol include PVA-105, PVA-110, PVA-117, PVA-117H, PVA-120, PVA-124, PVA-124H, PVA-CS, PVA-CST, PVA-HC, PVA-203, PVA-204, PVA-205, PVA-210, PVA-217, PVA-220, PVA-224, PVA-217EE, PVA-217E, PVA-220E, PVA-224E, PVA-405, PVA-420, PVA-613 and L-8 all produced by Kuraray Co., Ltd. Specific examples of the modified polyvinyl alcohol include that having an anion-modified cite, for example, KL-318, KL-118, KM-618, KM-118 or SK-5102, that having a cation-modified cite, for example, C-318, C-118 or CM-318, that having a terminal thiol-modified cite, for example, M-205 or M-115, that having a terminal sulfide-modified cite, for example, MP-103, MP-203, MP-102 or MP-202, that having an ester-modified cite with a higher fatty acid at the terminal, for example, HL-12E or HL-1203 and that having a reactive silane-modified cite, for example, R-1130, R-2105 or R-2130.

It is also preferred that the protective layer contains a stratiform compound. The stratiform compound is a particle having a thin tabular shape. The stratiform compound includes, for instance, mica, for example, natural mica represented by the following formula:

$$A (B, C)_{2-5} D_4 O_{10} (OH, F, O)_2$$

(wherein A represents any one of K, Na and Ca, B and C each represents any one of Fe (II), Fe(III), Mn, Al, Mg and V, and D represents Si or Al) or synthetic mica; talc represented by the following formula: $3MgO.4SiO.H_2O$; teniolite; montmorillonite; saponite; hectolite; and zirconium phosphate.

Examples of the natural mica include muscovite, paragonite, phlogopite, biotite and lepidolite. Examples of the synthetic mica include non-swellable mica, for example, fluorine phlogopite $KMg_3(AlSi_3O_{10})F_2$ or potassium tetrasilic mica $KMg_{2.5}(Si_4O_{10})F_2$, and swellable mica, for example, Na tetrasililic mica $NaMg_{2.5}(Si_4O_{10})F_2$, Na or Li teniolite $(Na, Li)Mg_2Li(Si_4O_{10})F_2$, or montmorillonit based Na or Li hectolite $(Na, Li)_{1/8}Mg_{2/5}L_{1/8}(Si_4O_{10})F_2$. Synthetic smectite is also useful.

Of the stratiform compounds, fluorine based swellable mica which is a synthetic stratiform compound is particularly useful in the invention. Specifically, the swellable clay mineral, for example, montmorillonite, saponite, hectolite or bentonite has a stratiform structure comprising a unit crystal lattice layer having thickness of approximately 10 to 15 angstroms and metallic atom substitution in the lattices is extremely large in comparison with other clay minerals. As a result, the lattice layer results in lack of positive charge and to compensate it, a cation, for example, $Li^+$, $Na^+$, $Ca^{2+}$, $Mg^{2+}$, or an organic cation, e.g., an amine salt, a quaternary ammonium salt, a phosphonium salt or a sulfonium salt is adsorbed between the lattice layers. The stratiform compound swells with water. When share is applied under such a condition, the stratiform crystal lattices are easily cleaved to form a stable sol in water. The bentnite and swellable synthetic mica have strong such tendency.

With respect to the shape of the stratiform compound, the thinner the thickness or the larger the plain size as long as smoothness of coated surface and transmission of active ray are not damaged, the better from the standpoint of control of diffusion. Therefore, an aspect ratio of the stratiform compound is ordinarily 20 or more, preferably 100 or more, and particularly preferably 200 or more. The aspect ratio is a ratio of thickness to a major axis of particle and can be determined, for example, from a projection drawing of particle by a microphotography. The larger the aspect ratio, the greater the effect obtained.

As for the particle size of the stratiform compound used in the invention, an average particle size is ordinarily from 1 to 20 μm, preferably from 1 to 10 μm, and particularly preferably from 2 to 5 μm. When the particle size is less than 1 μm, the inhibition of permeation of oxygen or water is insufficient and the effect can not be satisfactorily achieved. On the other hand, when it is larger than 20 μm, the dispersion stability of the particle in the coating solution is insufficient to cause a problem in that stable coating can not be performed. An average thickness of the particle is ordinarily 0.1 μm or less, preferably 0.05 μm or less, and particularly preferably 0.01 μm or less. For example, with respect to the swellable synthetic mica that is the representative compound of the stratiform compounds, the thickness is approximately from 1 to 50 nm and the plain size is approximately from 1 to 20 μm.

By incorporating particles of the stratiform compound having such a large aspect ratio into the protective layer, strength of the coated layer increases and the penetration of oxygen or water can be effectively inhibited, thereby preventing degradation of the protective layer due to deformation. Also, even when the lithographic printing plate precursor is stored under a high humidity condition for a long period of time, degradation of the image-forming property of the lithographic printing plate precursor due to the variation of humidity is prevented and the excellent preservation stability is obtained.

An amount of the stratiform compound contained in the protective layer is ordinarily from 5/1 to 1/100 in terms of a weight ratio of the stratiform compound to an amount of a binder used in the protective layer. When a plural kind of the stratiform compounds is used together, it is preferred that the total amount of the stratiform compounds satisfies the range of weight ratio described above.

As other composition for the protective layer, glycerine, dipropylene glycol, etc. can be added to the binder in an amount corresponding to several % by weight to impart flexibility. Further, an anionic surfactant, for example, sodium alkyl sulfate or sodium alkyl sulfonate; an amphoteric surfactant, for example, alkylamino carboxylic acid salt or alkylamino dicarboxylic acid salt; or a non-ionic surfactant, for example, polyoxyethylene alkylphenyl ether can be added. An amount of the surfactant added is ordinarily from 0.1 to 100% by weight based on the binder.

For the purpose of improving the adhesion between the photopolymerizable layer and the protective layer, for example, it is described in JP-A-49-70702 that sufficient adhesion can be obtained by mixing from 20 to 60% by weight of an acrylic emulsion, a water-insoluble vinyl pyrrolidone-vinyl acetate copolymer or the like in a hydrophilic polymer mainly comprising polyvinyl alcohol and coating the mixture on the photopolymerizable layer. In the invention, any of such known techniques can be used.

Further, other functions can also be provided to the protective layer. For example, by adding a coloring agent (for example, a water-soluble dye), which is excellent in permeability for an infrared ray used for the exposure and capable of efficiently absorbing light at other wavelengths, a safe light adaptability can be improved without decreasing the sensitivity.

An example of ordinary dispersing methods of the stratiform compound used in the protective layer is described below. Specifically, at first, from 5 to 10 parts by weight of a swellable stratiform compound that is exemplified as a preferred stratiform compound is added to 100 parts by weight of water to adapt thoroughly the compound to water and to be swollen, and then the mixture is dispersed using a dispersing machine. The dispersing machine used include, for example, a variety of mills conducting dispersion by directly applying mechanical power, a high-speed agitation type dispersing machine providing a large shear force and a dispersing machine providing ultrasonic energy of high intensity. Specific examples thereof include a ball mill, a sand grinder mill, a visco mill, a colloid mill, a homogenizer, a dissolver, a Polytron, a homomixer, a homoblender, a Keddy mill, a jet agitor, a capillary emulsifying device, a liquid siren, an electromagnetic strain type ultrasonic generator and an emulsifying device having a Polman whistle. The dispersion containing 5 to 10% by weight of the inorganic stratiform compound thus prepared is highly viscous or in the form of gel and exhibits extremely good preservation stability. In the preparation of a coating solution for protective layer using the dispersion, it is preferred that the dispersion is diluted with water, thoroughly stirred and then blended with a binder solution.

To the coating solution for protective layer can be added known additives, for example, an anionic surfactant, a nonionic surfactant, a cationic surfactant, a fluorine-based surfactant for improving a coating property or a water-soluble plasticizer for improving physical properties of a coated layer. Examples of the water-soluble plasticizer include propionamide, cyclohexanediol, glycerin or sorbitol. Also, a water-soluble (meth)acrylic polymer may be added. Further, to the coating solution may be added known additives for improving adhesion to the photopolymerizable layer or preservation stability of the coating solution.

The thus-prepared coating solution for protective layer is coated on the photopolymerizable layer provided on a support and dried to form a protective layer. A coating solvent can be appropriately selected in the relationship with the binder used. When a water-soluble polymer is used, it is preferred to employ distilled water or purified water as the coating solvent. A coating method of the protective layer is not particularly restricted and known methods, for example, methods described in U.S. Pat. No. 3,458,311 and JP-B-55-49729 can be used. Specifically, the protective layer is coated, for example, by a blade coating method, an air knife coating method, a gravure coating method, a roll coating method, a spray coating method, a dip coating method or a bar coating method.

A coating amount of the protective layer is preferably in a range from 0.01 to 10 $g/m^2$, more preferably in a range from 0.02 to 3 $g/m^2$, and most preferably in a range from 0.02 to 1 $g/m^2$, in terms of coating amount after drying.

[Support]

The support for use in the lithographic printing plate precursor according to the invention is not particularly restricted as long as it is a dimensionally stable plate-like material. The support includes, for example, paper, paper laminated with plastic (for example, polyethylene, polypropylene or polystyrene), a metal plate (for example, aluminum, zinc or copper plate), a plastic film (for example, cellulose diacetate, cellulose triacetate, cellulose propionate, cellulose butyrate, cellulose acetatebutyrate, cellulose nitrate, polyethylene terephthalate, polyethylene, polystyrene, polypropylene, polycarbonate or polyvinyl acetal film) and paper or a plastic film laminated or deposited with the metal described above. A preferred support includes, a polyester film and an aluminum plate. Among them, the aluminum plate is preferred since it has good dimensional stability and is relatively inexpensive.

The aluminum plate includes a pure aluminum plate, an alloy plate comprising aluminum as a main component and containing a trace amount of hetero elements and a thin film of aluminum or aluminum alloy laminated with plastic. The hetero element contained in the aluminum alloy includes, for example, silicon, iron, manganese, copper, magnesium, chromium, zinc, bismuth, nickel and titanium. The content of the hetero element in the aluminum alloy is preferably 10% by weight or less. Although a pure aluminum plate is preferred in the invention, since completely pure aluminum is difficult to be produced in view of the refining technique, the aluminum plate may slightly contain the hetero element. The composition is not specified for the aluminum plate and those materials conventionally known and used can be appropriately utilized.

The thickness of the support is preferably from 0.1 to 0.6 mm, and more preferably from 0.15 to 0.4 mm.

Prior to the use of aluminum plate, a surface treatment, for example, roughening treatment or anodizing treatment is preferably performed. The surface treatment facilitates improvement in the hydrophilic property and ensure for adhesion between the photopolymerizable layer and the support. Prior to the roughening treatment of the aluminum plate, a degreasing treatment, for example, with a surfactant, an organic solvent or an aqueous alkaline solution is conducted for removing rolling oil on the surface thereof, if desired.

The roughening treatment of the surface of the aluminum plate is conducted by various methods and includes, for example, mechanical roughening treatment, electrochemical roughening treatment (roughening treatment of electrochemically dissolving the surface) and chemical roughening treatment (roughening treatment of chemically dissolving the surface selectively).

As the method of the mechanical roughening treatment, a known method, for example, ball grinding, brush grinding, blast grinding or buff grinding can be used. Also, a transfer method may be employed wherein concavo-convex shape of a roll having concavo-convex shape is transferred to the surface of aluminum plate during a rolling step of aluminum plate.

The electrochemical roughening treatment method includes, for example, a method of conducting by passing alternating current or direct current in an electrolyte containing an acid, for example, hydrochloric acid or nitric acid. Also, a method of using a mixed acid described in JP-A-54-63902 can be used.

The aluminum plate subjected to the roughening treatment is subjected, if desired, to an alkali etching treatment using an aqueous solution, for example, of potassium hydroxide or sodium hydroxide and further subjected to a neutralizing treatment, and then subjected to an anodizing treatment for increasing the abrasion resistance, if desired.

As the electrolyte used for the anodizing treatment of the aluminum plate, various electrolytes capable of forming porous oxide film can be used. Ordinarily, sulfuric acid, hydrochloric acid, oxalic acid, chromic acid or a mixed acid thereof is used. The concentration of the electrolyte can be appropriately determined depending on the kind of the electrolyte.

Since the conditions for the anodizing treatment are varied depending on the electrolyte used, they cannot be defined commonly. However, it is ordinarily preferred that electrolyte concentration in the solution is from 1 to 80% by weight, liquid temperature is from 5 to 70° C., current density is from 5 to 60 $A/dm^2$, voltage is from 1 to 100 V, and electrolysis time is from 10 seconds to 5 minutes. The amount of the anodized film formed is preferably from 1.0 to 5.0 $g/m^2$ and more preferably from 1.5 to 4.0 $g/m^2$. In the above-described range, good printing durability and good scratch resistance in the non-image area of lithographic printing plate can be achieved.

The aluminum plate subjected to the surface treatment and having the anodized film is used as it is as the support in the invention. However, in order to more improve adhesion to a layer provided thereon, hydrophilisity, resistance to stain, heat insulating property or the like, other treatment, for example, a treatment for enlarging micropores or a sealing treatment of micropores of the anodized film described in JP-A-2001-253181 and JP-A-2001-322365, or a surface hydrophilizing treatment by immersing in an aqueous solution containing a hydrophilic compound, may be appropriately conducted. Needless to say, the enlarging treatment and sealing treatment of micropores are not limited to those described in JP-A-2001-253181 and JP-A-2001-322365 and any conventionally known method may be employed.

As the sealing treatment, for example, as well as a sealing treatment with steam, a sealing treatment with fluorozirconic acid alone, a sealing treatment with sodium fluoride, a sealing treatment with steam having added thereto lithium chloride may be employed.

<Sealing Treatment>

The sealing treatment for use in the invention is not particularly limited and conventionally known methods can be employed. Among them, a sealing treatment with an aqueous solution containing an inorganic fluorine compound, a sealing treatment with water vapor and a sealing treatment with hot water are preferred. The sealing treatments are described in more detail below.

<Sealing Treatment with Aqueous Solution Containing Inorganic Fluorine Compound>

As the inorganic fluorine compound used in the sealing treatment with an aqueous solution containing an inorganic fluorine compound, a metal fluoride is preferably exemplified.

Specific examples thereof include sodium fluoride, potassium fluoride, calcium fluoride, magnesium fluoride, sodium fluorozirconate, potassium fluorozirconate, sodium fluorotitanate, potassium fluorotitanate, ammonium fluorozirconate, ammonium fluorotitanate, potassium fluorotitanate, fluorozirconic acid, fluorotitanic acid, hexafluorosilicic acid, nickel fluoride, iron fluoride, fluorophosphoric acid and ammonium fluorophosphate. Among them, sodium fluorozirconate, sodium fluorotitanate, fluorozirconic acid and fluorotitanic acid are preferred.

The concentration of the inorganic fluorine compound in the aqueous solution is preferably 0.01% by weight or more, more preferably 0.05% by weight or more, in view of the satisfactory sealing of micropores of the anodized film, and it is preferably 1% by weight or less, more preferably 0.5% by weight or less in view of the stain resistance.

The aqueous solution containing an inorganic fluorine compound preferably further contains a phosphate compound. When the phosphate compound is contained, the hydrophilicity on the anodized film surface is increased and thus, the on-machine developing property and stain resistance can be improved.

Preferred examples of the phosphate compound include phosphates of metal, for example, an alkali metal or an alkaline earth metal.

Specific examples thereof include zinc phosphate, aluminum phosphate, ammonium phosphate, diammonium hydrogen phosphate, ammonium dihydrogen phosphate, monoammonium phosphate, monopotassium phosphate, monosodium phosphate, potassium dihydrogen phosphate, dipotassium hydrogen phosphate, calcium phosphate, sodium ammonium hydrogen phosphate, magnesium hydrogen phosphate, magnesium phosphate, ferrous phosphate, ferric phosphate, sodium dihydrogen phosphate, sodium phosphate, disodium hydrogen phosphate, lead phosphate, diammonium phosphate, calcium dihydrogen phosphate, lithium phosphate, phosphotungstic acid, ammonium phosphotungstate, sodium phosphotungstate, ammonium phosphomolybdate, sodium phosphomolybdate, sodium phosphite, sodium tripolyphosphate and sodium pyrophosphate. Among them, sodium dihydrogen phosphate, disodium hydrogen phosphate, potassium dihydrogen phosphate and dipotassium hydrogen phosphate are preferred.

The combination of the inorganic fluorine compound and the phosphate compound is not particularly limited, but it is preferred that the aqueous solution contains at least sodium fluorozirconate as the inorganic fluorine compound and at least sodium dihydrogen phosphate as the phosphate compound.

The concentration of the phosphate compound in the aqueous solution is preferably 0.01% by weight or more, more preferably 0.1% by weight or more, in view of improvement in the on-machine developing property and stain resistance, and it is preferably 20% by weight or less, more preferably 5% by weight or less, in view of the solubility.

The ratio of respective compounds in the aqueous solution is not particularly limited, and the weight ratio between the inorganic fluorine compound and the phosphate compound is preferably from 1/200 to 10/1, more preferably from 1/30 to 2/1.

The temperature of the aqueous solution is preferably 20° C. or more, more preferably 40° C. or more, and it is preferably 100° C. or less, more preferably 80° C. or less.

The pH of the aqueous solution is preferably 1 or more, more preferably 2 or more, and it is preferably 11 or less, more preferably 5 or less.

A method of the sealing treatment with the aqueous solution containing an inorganic fluorine compound is not particularly limited, and examples thereof include a dipping method and a spray method. One of the treatments may be used alone once or multiple times, or two or more thereof may be used in combination.

In particular, a dipping method is preferred. In the case of performing the treatment using the dipping method, the treating time is preferably one second or more, more preferably 3 seconds or more, and it is preferably 100 seconds or less, more preferably 20 seconds or less.

<Sealing Treatment with Water Vapor>

Examples of the sealing treatment with water vapor include a method of continuously or discontinuously bringing water vapor under applied pressure or normal pressure into contact with the anodized film.

The temperature of the water vapor is preferably 80° C. or more, more preferably 95° C. or more, and it is preferably 105° C. or less.

The pressure of the water vapor is preferably from (atmospheric pressure −50 mmAq) to (atmospheric pressure +300 mmAq) (from $1.008\times10^5$ to $1.043\times10^5$ Pa).

The time period for which water vapor is contacted is preferably one second or more, more preferably 3 seconds or more, and it is preferably 100 seconds or less, more preferably 20 seconds or less.

<Sealing Treatment with Hot Water>

Examples of the sealing treatment with hot water include a method of dipping the aluminum plate having formed thereon the anodized film in hot water.

The hot water may contain an inorganic salt (for example, a phosphate) or an organic salt.

The temperature of the hot water is preferably 80° C. or more, more preferably 95° C. or more, and it is preferably 100° C. or less.

The time period for which the aluminum plate is dipped in hot water is preferably one second or more, more preferably 3 seconds or more, and it is preferably 100 seconds or less, more preferably 20 seconds or less.

<Hydrophilizing Treatment>

The hydrophilizing treatment includes an alkali metal silicate method described in U.S. Pat. Nos. 2,714,066, 3,181,461, 3,280,734 and 3,902,734. In the method, the support is subjected to immersion treatment or electrolytic treatment in an aqueous solution, for example, of sodium silicate. In addition, the hydrophilizing treatment includes, for example, a method of treating with potassium fluorozirconate described in JP-B-36-22063 and a method of treating with polyvinylphosphonic acid described in U.S. Pat. Nos. 3,276,868, 4,153,461 and 4,689,272.

In the case of using a support having insufficient hydrophilicity, for example, a polyester film, in the invention, it is desirable to coat a hydrophilic layer thereon to make the surface sufficiently hydrophilic. The hydrophilic layer preferably used includes a hydrophilic layer formed by coating a coating solution containing a colloid of an oxide or hydroxide of at least one element selected from beryllium, magnesium, aluminum, silicon, titanium, boron, germanium, tin, zirconium, iron, vanadium, antimony and a transition metal described in JP-A-2001-199175, a hydrophilic layer containing an organic hydrophilic matrix obtained by crosslinking or pseudo-crosslinking of an organic hydrophilic polymer described in JP-A-2002-79772, a hydrophilic layer containing an inorganic hydrophilic matrix obtained by sol-gel conversion comprising hydrolysis and condensation reaction of polyalkoxysilane with titanate, zirconate or aluminate and a hydrophilic layer comprising an inorganic thin layer having a surface containing metal oxide. Among them, the hydrophilic layer formed by coating a coating solution containing a colloid of an oxide or hydroxide of silicon is preferred.

Further, in the case of using, for example, a polyester film as the support in the invention, it is preferred to provide an antistatic layer on the hydrophilic layer side, opposite side to the hydrophilic layer or both sides. When the antistatic layer is provided between the support and the hydrophilic layer, it also contributes to improve the adhesion of the hydrophilic layer to the support. As the antistatic layer, a polymer layer having fine particles of metal oxide or a matting agent dispersed therein described in JP-A-2002-79772 may be used.

The support preferably has a center line average roughness of 0.10 to 1.2 μm. In the above-described range, good adhesion to the photopolymerizable layer, good printing durability, and good stain resistance can be achieved.

[Exposure]

As a light source for exposure of the lithographic printing plate precursor according to the invention, known light sources can be used without limitation. A preferred wavelength of the light source is from 300 to 1,200 nm. Specifically, various kinds of lasers preferably used as the light source, and among them, a semiconductor laser emitting an infrared ray having a wavelength of from 760 to 1,200 nm is preferably used.

The exposure mechanism used may be any of inner drum type, outer drum type and flat bed type can be used.

Further, other exposure light sources used for the lithographic printing plate precursor of the invention include, for example, a super-high pressure, high pressure, medium pressure or low pressure mercury lamp, a chemical lamp, a carbon arc lamp, a xenon lamp, a metal halide lamp, a variety of visible or ultraviolet laser lamps, a fluorescent lamp, a tungsten lamp and sunlight.

[Printing]

A lithographic printing method using the lithographic printing plate precursor according to the invention is not particularly limited. For instance, a method is exemplified wherein the lithographic printing plate precursor of the invention is exposed imagewise by a laser, for example, an infrared laser, and then without undergoing the development processing step, supplied with oily ink and an aqueous component to conduct printing.

More specifically, there are illustrated a method wherein the lithographic printing plate precursor is exposed by a laser and without undergoing the development processing step, mounted on a printing machine to perform printing and a method wherein the lithographic printing plate precursor is mounted on a printing machine, exposed by a laser on the printing machine to perform printing without undergoing the development processing step.

After imagewise exposure of the lithographic printing plate precursor by a laser, when an aqueous component and oily ink are supplied to perform printing without undergoing the development processing step, for example, a wet development processing step, the photopolymerizable layer hardened by the exposure forms the oily ink receptive area having an oleophilic surface in the exposed area of the photopolymerizable layer. On the other hand, in the unexposed area, the unhardened photopolymerizable layer is removed by dissolution or dispersion with the aqueous component and/or oily ink supplied to reveal a hydrophilic surface in the area. As a result, the aqueous component is adhered on the revealed hydrophilic surface, the oily ink is adhered to the exposed area of the photopolymerizable layer, and thus printing is initiated. While either the aqueous component or the oily ink may be supplied at first to the plate surface, it is preferred to supply the oily ink at first in view of preventing the aqueous component from contamination with the photopolymerizable layer in the unexposed area. For the aqueous component and oily ink, dampening water and printing ink for conventional lithographic printing are used, respectively.

Thus, the lithographic printing plate precursor is subjected to the on-machine development on an offset printing machine and used as it is for printing a plurality of sheets.

The lithographic printing plate precursor of the invention may be subjected to development processing using as a developer, a non-alkali aqueous solution having pH of 10 or lower after the imagewise exposure. The non-alkali aqueous solution used preferably includes, for example, water alone or an aqueous solution containing water as a main component (containing 60% by weight or more of water). Particularly, an aqueous solution having the same composition as conventionally known dampening water or an aqueous solution containing a surfactant (for example, an anionic, nonionic or cationic surfactant) is preferred. The pH of the developer is preferably from 2 to 10, more preferably from 3 to 9, and still more preferably from 5 to 9.

The non-alkali aqueous solution used as the developer may contain, for example, an organic acid, an inorganic acid and an inorganic salt.

Examples of the organic acid include citric acid, acetic acid, oxalic acid, malonic acid, salicylic acid, caprylic acid, tartaric acid, malic acid, lactic acid, levulinic acid, p-toluenesulfonic acid, xylenesulfonic acid, phytic acid and an organic phosphonic acid. The organic acid can also be used in the form of an alkali metal salt or an ammonium salt. A content of the organic acid is preferably from 0.01 to 5% by weight in the developer.

Examples of the inorganic acid and inorganic salt include phosphoric acid, methaphosphoric acid, ammonium primary phosphate, ammonium secondary phosphate, sodium primary phosphate, sodium secondary phosphate, potassium primary phosphate, potassium secondary phosphate, sodium tripolyphosphate, potassium pyrophosphate, sodium hexamethaphosphate, magnesium nitrate, sodium nitrate, potassium nitrate, ammonium nitrate, sodium sulfate, potassium sulfate, ammonium sulfate, sodium sulfite, ammonium sulfite, sodium hydrogen sulfate and nickel sulfate. A content of the inorganic acid or inorganic salt is preferably from 0.01 to 5% by weight in the developer.

The anionic surfactant for use in the developer employed in the invention includes, for example, fatty acid salts, abietic acid salts, hydroxyalkanesulfonic acid salts, alkanesulfonic acid salts, dialkylsulfosuccinic ester salts, straight-chain alkylbenzenesulfonic acid salts, branched alkylbenzenesulfonic acid salts, alkylnaphthalenesulfonic acid salts, alkylphenoxypolyoxy ethylene propylsulfonic acid salts, polyoxyethylene alkylsulfophenyl ether salts, N-methyl-N-oleyltaurine sodium salt, N-alkylsulfosuccinic acid monoamide disodium salts, petroleum sulfonic acid salts, sulfated caster oil, sulfated beef tallow oil, sulfate ester slats of fatty acid alkyl ester, alkyl sulfate ester salts, polyoxyethylene alkyl ether sulfate ester salts, fatty acid monoglyceride sulfate ester salts, polyoxyethylene alkyl phenyl ether sulfate ester salts, polyoxyethylene styryl phenyl ether sulfate ester salts, alkyl phosphate ester salts, polyoxyethylene alkyl ether phosphate ester salts, polyoxyethylene alkyl phenyl ether phosphate ester salts, partially saponified products of styrene/maleic anhydride copolymer, partially saponified products of olefin/maleic anhydride copolymer and naphthalene sulfonate formalin condensates. Of the compounds, dialkylsulfosuccinic ester salts, alkyl sulfate ester salts and alkylnaphthalenesulfonic acid salts are particularly preferably used.

The cationic surfactant for use in the developer used in the invention is not particularly limited and conventionally known cationic surfactants can be used. Examples of the cationic surfactant include alkylamine salts, quaternary ammonium salts, polyoxyethylene alkyl amine salts and polyethylene polyamine derivatives.

The nonionic surfactant for use in the developer used in the invention includes, for example, polyethylene glycol type higher alcohol ethylene oxide addacts, alkylphenol ethylene oxide addacts, fatty acid ethylene oxide addacts, polyhydric alcohol fatty acid ester ethylene oxide addacts, higher alkylamine ethylene oxide addacts, fatty acid amide ethylene oxide addacts, ethylene oxide addacts of fat, polypropylene glycol ethylene oxide addacts, dimethylsiloxane-ethylene oxide block copolymers, dimethylsiloxane-(propylene oxide-ethylene oxide) block copolymers, fatty acid esters of polyhydric alcohol type glycerol, fatty acid esters of pentaerythritol, fatty acid esters of sorbitol and sorbitan, fatty acid esters of sucrose, alkyl ethers of polyhydric alcohols and fatty acid amides of alkanolamines.

The nonionic surfactants may be used individually or as a mixture of two or more thereof. In the invention, ethylene oxide addacts of sorbitol and/or sorbitan fatty acid esters, polypropylene glycol ethylene oxide addacts, dimethylsiloxane-ethylene oxide block copolymers, dimethylsiloxane-(propylene oxide-ethylene oxide) block copolymers and fatty acid esters of polyhydric alcohols are more preferred.

Further, from the standpoint of stable solubility in water or opacity, with respect to the nonionic surfactant used in the developer according to the invention, the HLB (hydrophile-lipophile balance) value thereof is preferably 6 or more, and more preferably 8 or more.

Moreover, an amount of the nonionic surfactant contained in the developer is preferably from 0.01 to 10% by weight, and more preferably from 0.01 to 5% by weight.

Furthermore, surfactants, for example, oxyethylene adducts of acetylene glycol type or acetylene alcohol type, fluorine-based surfactants and silicon-based surfactants are also used.

Of the surfactants used in the developer according to the invention, the nonionic surfactant is particularly preferred in view of foam preventing property.

The developer used in the invention may contain an organic solvent. The organic solvent that can be included in the developer include, for example, aliphatic hydrocarbons (e.g., hexane, heptane, Isopar E, Isopar H, Isopar G (produced by Esso Chemical Co., Ltd.), gasoline or kerosene), aromatic hydrocarbons (e.g., toluene or xylene), halogenated hydrocarbons (methylene dichloride, ethylene dichloride, trichlene or nomochlorobenzene) and polar solvents shown below.

Examples of the polar solvent include alcohols (e.g., methanol, ethanol, propanol, isopropanol, benzyl alcohol, ethylene glycol monomethyl ether, 2-ethyoxyethanol, diethylene glycol monoethyl ether, diethylene glycol monohexyl ether, triethylene glycol monomethyl ether, propylene glycol monoethyl ether, dipropylene glycol monomethyl ether, polyethylene glycol monomethyl ether, polypropylene glycol, tetraethylene glycol, ethylene glycol monobutyl ether, ethylene glycol monobenzyl ether, ethylene glycol monophenyl ether, methyl phenyl carbinol, n-amyl alcohol or methyamyl alcohol), ketones (e.g., acetone, methyl ethyl ketone, ethyl butyl ketone, methyl isobutyl ketone or cyclohexanone), esters (e.g., ethyl acetate, propyl acetate, butyl acetate, amyl acetate, benzyl acetate, methyl lactate, butyl lactate, ethylene glycol monobutyl acetate, polyethylene glycol monomethyl ether acetate, diethylene glycol acetate, diethyl phthalate or butyl levulinate) and others (e.g., triethyl phosphate, tricresyl phosphate, N-phenylethanolamine or N-phenyldiethanolamine).

Further, when the organic solvent is insoluble in water, it may be used by being solubilized in water using a surfactant or the like. In the case where the developer contains the organic solvent, the concentration of the organic solvent is desirably less than 40% by weight in view of safety and inflammability.

Moreover, the developer used in the invention may contain a water-soluble polymer compound, for example, soybean polysaccharide, modified starch, gum Arabic, dextrin, cellulose derivatives (for example, carboxymethyl cellulose, carboxyethyl cellulose or methyl cellulose) and modified products thereof, pllulan, polyvinyl alcohol and derivatives thereof, polyvinyl pyrrolidone, polyacrylamide, acrylamide copolymer, vinyl methyl ether/maleic anhydride copolymer, vinyl acetate/maleic anhydride copolymer and styrene/maleic anhydride copolymer.

As the soybean polysaccharide, a known soybean polysaccharide can be used. For example, as a commercial product, Soyafive (trade name, produced by Fuji Oil Co., Ltd.) is available and various grade products can be used. The soybean polysaccharide preferably used has viscosity of from 10 to 100 mPa/sec in a 10% by weight aqueous solution thereof.

As the modified starch, those known can be used. The modified starch can be prepared, for example, by a method wherein starch of, for example, corn, potato, tapioca, rice or wheat is decomposed, for example, with an acid or an enzyme to an extent that a number of glucose residue per molecule is from 5 to 30 and then oxypropylene is added thereto in an alkali.

Two or more of the water-soluble polymer compounds may be used in combination. The content of the water-soluble polymer compound is preferably from 0.1 to 20% by weight, and more preferably from 0.5 to 10% by weight in the developer.

Into the developer used in the invention, an antiseptic agent, a chelating agent, a defoaming agent or the like may be incorporated in addition to the above components.

As the antiseptic agent, for example, phenol or a derivative thereof, formalin, an imidazole derivative, sodium dehydroacetate, a 4-isothiazolin-3-one derivative, benzisotiazolin-3-one, a benzotriazole derivative, an amidine guanidine derivative, a quaternary ammonium salt, a pyridine derivative, a quinoline derivative, a guanidine derivative, diazine, a triazole derivative, oxazole, an oxazine derivative and a nitro bromo alcohol, e.g., 2-bromo-2-nitropropane-1,3-diol, 1,1-dibromo-1-nitro-2-ethanol or 1,1-dibromo-1-nitro-2-propanol are preferably used.

As the chelating agent, for example, ethylenediaminetetraacetic acid, potassium salt thereof or sodium salt thereof, diethylenetriaminepentaacetic acid, potassium salt thereof or sodium salt thereof, triethylenetetraminehexaacetic acid, potassium salt thereof or sodium salt thereof, hydroxyethylethylenediaminetriacetic acid, potassium salt thereof or sodium salt thereof, nitrilotriacetic acid or sodium salt thereof, organic phosphonic acids, for example, 1-hydroxyethane-1,1-diphosphonic acid, potassium salt thereof or sodium salt thereof, aminotri(methylenephosphonic acid), potassium salt thereof or sodium salt thereof, and phophonoalkanetricarboxylic acids are illustrated. A salt of an organic amine is also useful in place of the sodium salt or potassium salt in the above-described chelating agents.

As the defoaming agent, a conventional silicone-based self-emulsifying type or emulsifying type defoaming agent, and a nonionic surfactant having HLB of 5 or less are used. The silicone defoaming agent is preferably used. Any of emulsifying dispersing type and solubilizing type can be used.

The development processing using the non-alkali aqueous solution in the invention is preferably performed by an automatic developing machine equipped with supplying means for a developer and a rubbing member. As the automatic developing machine, there are illustrated an automatic developing machine in which a lithographic printing plate precursor after image-recording is subjected to rubbing treatment while it is transporting as described in JP-A-2-220061 and JP-A-60-59351, and an automatic developing machine in which a lithographic printing plate precursor after image-recording placed on a cylinder is subjected to rubbing treatment while rotating the cylinder as described in U.S. Pat. Nos. 5,148,746 and 5,568,768 and British Patent 2,297,719. Among them, an automatic developing machine using a rotating brush roll as the rubbing member is particularly preferred. The lithographic printing plate precursor after the rubbing treatment may be successively subjected to washing with water, drying treatment and oil-desensitizing treatment, if desired.

The temperature of the developer can be appropriately determined and it is preferably from 10 to 50° C.

EXAMPLES

The present invention will be described in more detail with reference to the following examples, but the invention should not be construed as being limited thereto.

Preparation of Support

An aluminum plate (material: JIS 1050) having a thickness of 0.3 mm was subjected to a degreasing treatment at 50° C. for 30 seconds using a 10% by weight aqueous sodium aluminate solution in order to remove rolling oil on the surface thereof and then grained the surface thereof using three nylon brushes embedded with bundles of nylon bristle having a diameter of 0.3 mm and an aqueous suspension (specific gravity: 1.1 g/cm$^3$) of pumice having a median size of 25 μm, followed by thorough washing with water. The plate was etched by immersing in a 25% by weight aqueous sodium hydroxide solution of 45° C. for 9 seconds, washed with water, then immersed in a 20% by weight aqueous nitric acid solution at 60° C. for 20 seconds, and washed with water. The etching amount of the grained surface was about 3 g/m$^2$.

Then, using an alternating current of 60 Hz, an electrochemical roughening treatment was continuously carried out on the plate. The electrolyte used was a 1% by weight aqueous nitric acid solution (containing 0.5% by weight of aluminum ion) and the electrolyte temperature was 50° C. The electrochemical roughening treatment was conducted using an alternating current source, which provides a rectangular alternating current having a trapezoidal waveform such that the time TP necessary for the current value to reach the peak from zero was 0.8 msec and the duty ratio was 1:1, and using a carbon electrode as a counter electrode. A ferrite was used as an auxiliary electrode. The current density was 30 A/dm$^2$ in terms of the peak value of the electric current, and 5% of the electric current flowing from the electric source was divided to the auxiliary anode. The quantity of electricity in the nitric acid electrolysis was 175 C/dm$^2$ in terms of the quantity of electricity when the aluminum plate functioned as an anode. The plate was then washed with water by spraying.

The plate was further subjected to an electrochemical roughening treatment in the same manner as in the nitric acid electrolysis above using as an electrolyte, a 0.5% by weight aqueous hydrochloric acid solution (containing 0.5% by weight of aluminum ion) having temperature of 50° C. and under the condition that the quantity of electricity was 50 C/dm$^2$ in terms of the quantity of electricity when the aluminum plate functioned as an anode. The plate was then washed with water by spraying. The plate was subjected to an anodizing treatment using as an electrolyte, a 15% by weight aqueous sulfuric acid solution (containing 0.5% by weight of aluminum ion) at a current density of 15 A/dm$^2$ to form a direct current anodized film of 2.5 g/m$^2$, washed with water and dried to obtain a support. The center line average roughness (Ra) of the support was measured using a stylus having a diameter of 2 μm and it was found to be 0.51 μm.

Synthesis Example of Specific Copolymer (I-1)

In a 1 liter three-necked flask equipped with a condenser and a stirrer was charged 120 g of 1-methyl-2-pyrrolidone, followed by heating to 80° C. under nitrogen stream. To the solution was added dropwise a solution containing 30 g of M-1 having the structure shown below, 65 g of acrylamido-2-methylpropanesulfonic acid, 6 g of 2-hydroxyethyl methacrylate, 0.73 g of V-601 (produced by Wako Pure Chemical Industries, Ltd.) and 120 g of 1-methyl-2-pyrrolidone over a period of 2 hours. After the completion of the dropwise addition, the solution was further stirred for 2 hours. After stopping the nitrogen stream, the reaction solution was cooled to room temperature and 40 g of 2-methacryloyloxyethyl isocyanate, 0.3 g of p-methoxyphenol and 0.6 g of dibutyl tin dilaurate were added thereto, followed by heating at 60° C. with stirring. After a lapse of 6 hours, 70 g of methanol was added to the reaction solution to deactivate the unreacted 2-methacryloyloxyethyl isocyanate, and the reaction solution was cooled to room temperature.

The introduction of a double bond into a side chain upon the polymer reaction was confirmed by $^1$H-NMR spectrum. As a result of measurement of a weight average molecular weight by a gel permeation chromatography method (GPC) using polyacrylic acid as a standard substance, the weight average molecular weight of the copolymer was 20,000.

Structure of M-1

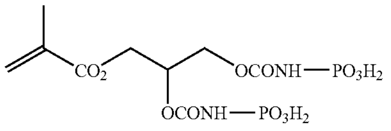

Example 1

<Formation of Undercoat Layer>

Undercoat solution (1) shown below was coated on the support described above by a bar and dried in an oven at 100° C. for 60 seconds to form an undercoat layer having a dry coating amount of 10 mg/m$^2$.

Undercoat Solution (1)

| | |
|---|---|
| Specific copolymer (I-1) | 0.017 g |
| Methanol | 9.00 g |
| Water | 1.00 g |

<Formation of Photopolymerizable Layer and Protective Layer)

Coating solution (1) for photopolymerizable layer having the composition shown below was coated on the above-described support provided with the undercoat layer by a bar and dried in an oven at 100° C. for 60 seconds to form a photopolymerizable layer having a dry coating amount of 1.0 g/m$^2$. Subsequently, Coating solution (1) for protective layer having the composition shown below was coated on the photopolymerizable layer by a bar and dried in an oven at 120° C. for 60 seconds to form a protective layer having a dry coating amount of 0.15 g/m$^2$, thereby preparing a lithographic printing plate precursor.

Coating solution (1) for photopolymerizable layer was prepared by mixing and stirring Photosensitive solution (1) shown below with Microcapsule solution (1) shown below just before coating.

| | |
|---|---|
| Photosensitive solution (1) | |
| Binder polymer (1) shown below | 0.162 g |
| Polymerization initiator (1) shown below | 0.100 g |
| Infrared absorbing agent (1) shown below | 0.020 g |
| Polymerizable compound: isocyanuric acid EO modified | 0.385 g |

-continued

| | |
|---|---|
| diacrylate (Aronics M-215, produced by Toagosei Co., Ltd.) | |
| Fluorine-based surfactant (1) shown below | 0.044 g |
| Methyl ethyl ketone | 1.091 g |
| 1-Methoxy-2-propanol | 8.609 g |
| Microcapsule solution (1) | |
| Microcapsule (1) prepared below | 2.640 g |
| Water | 2.425 g |
| Coating solution (1) for protective layer | |
| Dispersion of inorganic particle (1) shown below | 1.5 g |
| Polyvinyl alcohol (PVA-105, saponification degree: 98.5% by mole, polymerization degree: 500, produced by Kuraray Co., Ltd.) | 0.06 g |
| Polyvinylpyrrolidone (K30, molecular weight Mw: 40,000, produced by Tokyo Chemical Industry Co., Ltd.) | 0.01 g |
| Copolymer of vinylpyrrolidone and vinyl acetate (LUVITEC VA64W, copolymerization ratio =6/4, produced by ISP Co., Ltd.) | 0.01 g |
| Nonionic surfactant (EMALEX 710, produced by Nihon-Emulsion Co., Ltd.) | 0.01 g |
| Ion-exchanged water | 6.0 g |

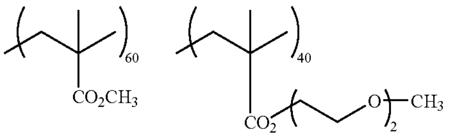

Binder polymer (1):

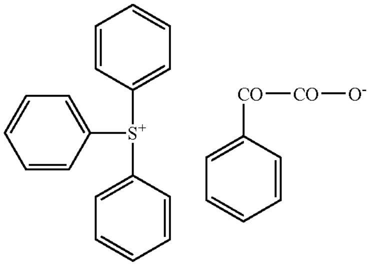

Polymerization initiator (1)

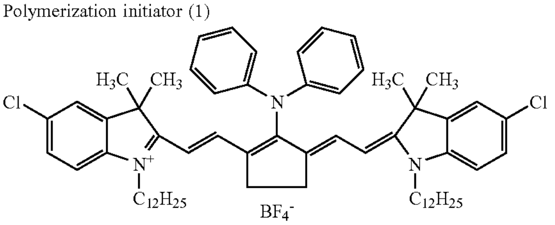

Infrared absorbing agent (1)

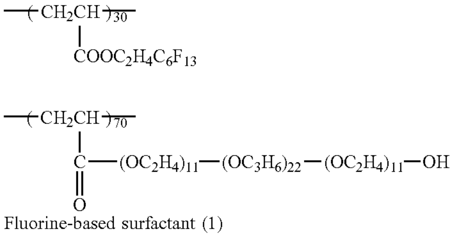

Fluorine-based surfactant (1)

Preparation of Microcapsule (1)

An oil phase component was prepared by dissolving 10 g of adduct of trimethylol propane and xylene diisocyanate (Takenate D-110N, produced by Mitsui Takeda Chemical Co., Ltd., 75% by weight ethyl acetate solution), 6.00 g of Aronix M-215 (produced by Toagosei Co., Ltd.) and 0.12 g of Pionine A-41C (produced by Takemoto Oil and Fat Co., Ltd.) in 16.67 g of ethyl acetate. As an aqueous phase component, 37.5 g of a 4% by weight aqueous solution of PVA-205 was prepared. The oil phase component and the aqueous phase component were mixed and emulsified using a homogenizer at 12,000 rpm for 10 minutes. The resulting emulsion was added to 25 g of distilled water and stirred at room temperature for 30 minutes and then at 40° C. for 2 hours. The thus-obtained microcapsule solution was diluted using distilled water so as to have the solid concentration of 15% by weight. The average particle size of the fine particle was 0.2 μm.

Preparation of Dispersion of Inorganic Particle (1)

To 193.6 g of ion-exchanged water was added 6.4 g of synthetic mica (Somasif ME-100, produced by CO-OP Chemical Co., Ltd.) and the mixture was dispersed using a homogenizer until an average particle size (according to a laser scattering method) became 3 μm to obtain a dispersion of inorganic particle. An aspect ratio of the inorganic particle thus-obtained was 100 or more.

Examples 2 to 5

An undercoat layer was formed in the same manner as in Example 1 except for changing Specific copolymer (I-1) in Undercoat solution (1) to the specific copolymer shown in Table 1 below and the same photopolymerizable layer and protective layer as in Example 1 were formed on the undercoat layer to prepare each lithographic printing plate precursor.

TABLE 1

| | Specific Copolymer |
|---|---|
| Example 2 | I-2 |
| Example 3 | I-5 |
| Example 4 | I-10 |
| Example 5 | I-20 |

Comparative Example 1

For Comparative Example 1, a lithographic printing plate precursor was prepared in the same manner as in Example 1 except for not providing the undercoat layer.

Example 6

<Formation of Undercoat Layer>

Undercoat solution (2) shown below was coated on the support described above by a bar and dried in an oven at 100° C. for 60 seconds to form an undercoat layer having a dry coating amount of 10 mg/$m^2$.

Undercoat Solution (2)

| | |
|---|---|
| Specific copolymer (I-8) | 0.017 g |
| Methanol | 9.00 g |
| Water | 1.00 g |

<Formation of Photopolymerizable Layer and Protective Layer>

Coating solution (2) for photopolymerizable layer having the composition shown below was coated on the above-described support provided with the undercoat layer by a bar and dried in an oven at 100° C. for 60 seconds to form a photopolymerizable layer having a dry coating amount of 1.0 g/$m^2$. Subsequently, the same protective as in Example 1 was formed on the photopolymerizable layer, thereby preparing a lithographic printing plate precursor.

| Coating solution (2) for photopolymerizable layer | |
|---|---|
| Infrared absorbing agent (2) shown below | 0.05 g |
| Polymerization initiator (1) shown above | 0.20 g |
| Binder polymer (2) (average molecular weight: 80,000) shown below | 0.50 g |
| Polymerizable compound (Aronics M-21 5, produced by Toagosei Co., Ltd.) | 1.00 g |
| Naphthalenesulfonate of Victoria Pure Blue | 0.02 g |
| Fluorine-based surfactant (1) shown above | 0.10 g |
| Methyl ethyl ketone | 18.0 g |

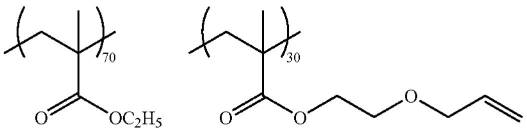

Binder polymer (2)

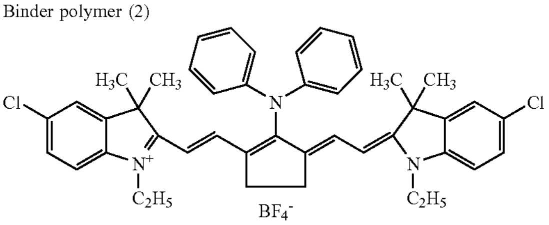

Infrared absorbing agent (2)

Examples 7 to 10

An undercoat layer was formed in the same manner as in Example 1 except for changing Specific copolymer (I-1) in Undercoat solution (1) to the specific copolymer shown in Table 2 below and the same photopolymerizable layer and protective layer as in Example 6 were formed on the undercoat layer to prepare each lithographic printing plate precursor.

TABLE 2

| | Specific Copolymer |
|---|---|
| Example 7 | I-11 |
| Example 8 | I-12 |
| Example 9 | I-21 |
| Example 10 | I-23 |

Comparative Example 2

For Comparative Example 2, a lithographic printing plate precursor was prepared in the same manner as in Example 6 except for not providing the undercoat layer.

<Exposure and Printing>

Each of the lithographic printing plate precursors obtained in the examples and comparative examples described above was exposed by Trendsetter 3244VX (produced by Creo Co.) equipped with a water-cooled 40 W infrared semiconductor laser under the conditions of power of 9 W, a rotational number of an outer surface drum of 210 rpm and resolution of 2,400 dpi. The exposed image contained a fine line chart.

The exposed lithographic printing plate precursor was mounted without conducting development processing on a plate cylinder of a printing machine (SOR-M, produced by Hyderberg Co.). After supplying dampening water (EU-3 (etching solution, produced by Fuji Photo Film Co., Ltd.)/water/isopropyl alcohol=1/89/10 (volume ratio)) and ink (TRANS-G (N) black ink (produced by Dainippon Ink and Chemicals, Inc.), 100 sheets of printing was conducted at a printing speed of 6,000 sheets per hour.

A number of printing papers required until on-machine development of the unexposed area of the photopolymerizable layer on the printing machine was completed to reach a state where the ink was not transferred to the printing paper in the non-image area was measured as on-machine developing property. As a result, in the case of using any of the lithographic printing plate precursors, prints without stain in the non-image area were obtained within the printing of 100 sheets.

<Evaluation of Lithographic Printing Plate Precursor>

With the lithographic printing plate precursors obtained above, the stain-preventing property, stain-preventing property after being left, fine line reproducibility and printing durability were evaluated in the manner described below.

(1) Stain-preventing Property

After printing of 10,000 sheets, stain on a blanket was visually evaluated. The stain-preventing property was evaluated on 10 grades according to the degree of the stain on a blanket. As the value is larger, the stain-preventing property is more preferable.

(2) Stain-preventing Property After Being Left

After printing of 10,000 sheets in the evaluation of stain-preventing property, the printing plate was left for one hour. Then, printing was restarted, and after printing of 500 sheets, stain on the blanket in the non-image area was visually evaluated. The stain-preventing property after being left was evaluated on 4 grades of A, B, C and D in the order of increasing the stain on a blanket. Specifically, the grade A means that the stain on a blanket is least.

(3) Fine Line Reproducibility

After the confirmation that prints without ink stain in the non-image area were obtained by the printing of 100 sheets as described above, 500 sheets were successively printed. The fine line chart (a chart including fine lines having 10, 12, 14, 16, 18, 20, 25, 30, 35, 40, 60, 80, 100 and 200 μm in width) on the $600^{th}$ printed material was observed by a 25-power magnifier and the fine line reproducibility was evaluated from the width of fine line reproduced by ink without interruption.

(4) Printing Durability

After the printing for the evaluation of fine line reproducibility as described above, the printing was further continued. As increase in a number of printing sheets, the photopolymerizable layer was gradually abraded to cause decrease in the ink receptivity, resulting in decrease of ink density on printing paper. A number of prints obtained until the ink density (reflection density) decreased by 0.1 from that at the initiation of printing was determined to evaluate the printing durability.

The results of the evaluations are shown in Table 3 below.

TABLE 3

| | Stain-Preventing Property | Stain-Preventing Property After Being Left | Fine Line Reproducibility (μm) | Printing Durability (number of sheets) |
|---|---|---|---|---|
| Example 1 | 10 | A | 16 | 45,000 |
| Example 2 | 9 | A | 20 | 35,000 |
| Example 3 | 8 | B | 16 | 45,000 |
| Example 4 | 8 | B | 18 | 40,000 |
| Example 5 | 7 | B | 16 | 45,000 |
| Example 6 | 10 | A | 16 | 45,000 |
| Example 7 | 10 | A | 16 | 45,000 |
| Example 8 | 9 | A | 18 | 40,000 |
| Example 9 | 7 | B | 16 | 45,000 |
| Example 10 | 9 | A | 16 | 45,000 |
| Comparative Example 1 | 3 | C | 40 | 5,000 |
| Comparative Example 2 | 1 | D | 60 | 2,000 |

Examples 11 to 15

<Formation of Undercoat Layer>

Undercoat solution (3) shown below was coated on the support described above by a bar and dried in an oven at 100° C. for 60 seconds to form an undercoat layer having a dry coating amount of 10 $mg/m^2$.

Undercoat Solution (3)

| | |
|---|---|
| Specific copolymer (shown in Table 4 below) | 0.017 g |
| Methanol | 9.00 g |
| Water | 1.00 g |

TABLE 4

| | Specific Copolymer |
|---|---|
| Example 11 | I-1 |
| Example 12 | I-3 |
| Example 13 | I-6 |
| Example 14 | I-16 |
| Example 15 | I-28 |

<Formation of Photopolymerizable Layer and Protective Layer>

Coating solution (3) for photopolymerizable layer having the composition shown below was coated by a bar on the undercoat layer described above and dried in an oven at 100° C. for 60 seconds to form an photopolymerizable layer having a dry coating amount of 1.0 $g/m^2$, and on the photopolymerizable layer, Coating solution (2) for protective layer having the composition shown below was coated so as to have a dry coating amount of 0.5 $g/m^2$ and dried at 120° C. for one minute to form a protective layer, thereby preparing a lithographic printing plate precursor.

| Coating solution (3) for photopolymerizable layer | |
|---|---|
| Polymerization initiator (2) shown below | 0.2 g |
| Sensitizing dye (1) shown below | 0.5 g |
| Binder polymer (1) shown above | 6.0 g |

-continued

| | |
|---|---|
| Polymerizable compound: Isocyanuric acid EO modified triacrylate (M-3 15, produced by Toa Gosei Co., Ltd.) | 12.4 g |
| Leuco Crystal Violet | 3.0 g |
| Thermal polymerization inhibitor: N-nitrosophenylhydroxylamine aluminum salt | 0.1 g |
| Tetraethylammonium chloride | 0.1 g |
| Fluorine-based surfactant (1) shown above | 0.1 g |
| Methyl ethyl ketone | 70.0 g |
| Polymerization initiator (2): | |

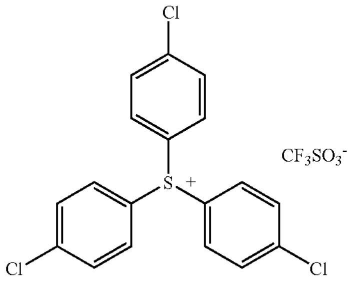

Sensitizing dye (1):

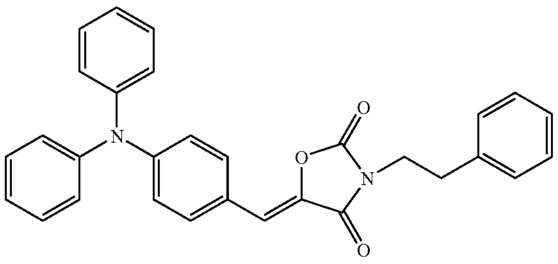

| Coating solution (2) for protective layer | |
|---|---|
| Polyvinyl alcohol (saponification degree: 95 mol%, polymerization degree: 800) | 40 g |
| Polyvinyl pyrrolidone (molecular weight: 50,000) | 5 g |
| Poly(vinyl pyrrolidone/vinyl acetate (1/1)) (molecular weight: 70,000) | 5 g |
| Water | 950 g |

Comparative Example 3

For Comparative Example 3, a lithographic printing plate precursor was prepared in the same manner as in Example 11 except for not providing the undercoat layer.

Examples 16 to 20

<Formation of Undercoat Layer>

Undercoat solution (4) shown below was coated on the support described above by a bar and dried in an oven at 100° C. for 60 seconds to form an undercoat layer having a dry coating amount of 10 mg/$m^2$.

Undercoat Solution (4)

| | |
|---|---|
| Specific copolymer (shown in Table 5 below) | 0.017 g |
| Methanol | 9.00 g |
| Water | 1.00 g |

TABLE 5

| | Specific Copolymer |
|---|---|
| Example 16 | I-2 |
| Example 17 | I-7 |
| Example 18 | I-12 |
| Example 19 | I-15 |
| Example 20 | I-27 |

<Formation of Photopolymerizable Layer and Protective Layer>

Lithographic printing plate precursors were prepared in the same manner as in Examples 11 to 15 except for changing Coating solution (3) for photopolymerizable layer to Coating solution (4) for photopolymerizable layer having the composition shown below, respectively.

| Coating solution (4) for photopolymerizable layer | |
|---|---|
| Polymerization initiator (3) shown below | 0.2 g |
| Binder polymer (2) shown above | 3.0 g |
| Polymerizable compound: Isocyanuric acid EO modified triacrylate (M-315, produced by Toa Gosei Co., Ltd.) | 6.2 g |
| Leuco Crystal Violet | 3.0 g |
| Thermal polymerization inhibitor: N-nitrosophenylhydroxylamine aluminum salt | 0.1 g |
| Fluorine-based surfactant (1) shown above | 0.1 g |
| Microcapsule (1) shown above (in terms of solid content) | 10.0 g |
| Methyl ethyl ketone | 35.0 g |
| 1-Methoxy-2-propanol | 35.0 g |
| Water | 10.0 g |

Polymerization initiator (3):

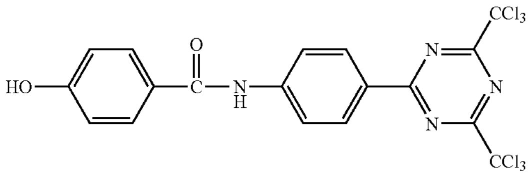

Comparative Example 4

For Comparative Example 4, a lithographic printing plate precursor was prepared in the same manner as in Example 16 except for not providing the undercoat layer.

<Exposure and Printing>

The lithographic printing plate precursor was exposed by a semiconductor laser of 375 nm or 405 nm under the conditions of power of 2 mW, a circumferential length of an outer surface drum of 900 mm, a rotational number of the outer surface drum of 800 rpm and resolution of 2,400 dpi. The drawing time per pixel is shown in Table 6 below.

The exposed lithographic printing plate precursor was mounted without conducting development processing on a plate cylinder of a printing machine (SOR-M, produced by Hyderberg Co.). After supplying dampening water (EU-3 (etching solution, produced by Fuji Photo Film Co., Ltd.)/water/isopropyl alcohol=1/89/10 (volume ratio)) and ink (TRANS-G (N) black ink, produced by Dainippon Ink and Chemicals, Inc.), 100 sheets of printing was conducted at a printing speed of 6,000 sheets per hour. As a result, removal of the unexposed area of the photopolymerizable layer was completed on the printing machine and prints without stain in the non-image area were obtained <Evaluation of Lithographic Printing Plate Precursor>

The stain-preventing property, stain-preventing property after being left, fine line reproducibility and printing durability were evaluated in the same manner as in Examples 1 to 10. Sensitivity and white lamp safety were evaluated in the manner described below. The results of evaluations are shown in Table 6 below.

(5) Sensitivity

After the confirmation that prints without ink stain in the non-image area were obtained by the printing of 100 sheets, 500 sheets were successively printed. On the $600^{th}$ print, unevenness of ink density in the image area was observed and an exposure amount necessary for providing the unevenness of ink density in the image area was determined to evaluate the sensitivity.

(6) White Lamp Safety

An unexposed lithographic printing plate precursor was placed under a white fluorescent lamp to expose under the conditions that the light intensity on the surface of the lithographic printing plate precursor became 400 lux while changing the exposure time. The lithographic printing plate precursor exposed under the white lamp was mounted without conducting development processing on a plate cylinder of a printing machine (SOR-M, produced by Hyderberg Co.) and printing of 100 sheets was conducted in the same manner as above. Then, the exposure time under the white fluorescent lamp that did not cause ink stain was determined. As the time is longer, the white lamp safety is better.

acrylamido-2-methylpropanesulfonic acid, 7 g of Blenmer GLM (produced by NOF Corp.), 0.73 g of V-601 (produced by Wako Pure Chemical Industries, Ltd.) and 120 g of 1-methyl-2-pyrrolidone over a period of 2 hours. After the completion of the dropwise addition, the solution was further stirred for 2 hours. After stopping the nitrogen stream, the reaction solution was cooled to room temperature and 40 g of 2-methacryloyloxyethyl isocyanate, 0.3 g of p-methoxyphenol and 0.6 g of dibutyl tin dilaurate were added thereto, followed by heating at 60° C. with stirring. After a lapse of 6 hours, 70 g of methanol was added to the reaction solution to deactivate the unreacted 2-methacryloyloxyethyl isocyanate, and the reaction solution was cooled to room temperature.

The introduction of a double bond into a side chain upon the polymer reaction was confirmed by $^1$H-NMR spectrum. As a result of measurement of a weight average molecular weight by a gel permeation chromatography method (GPC) using polyacrylic acid as a standard substance, the weight average molecular weight of the polymer was 20,000.

Synthesis Example of Specific Copolymer (II-16)

In a 1 liter three-necked flask equipped with a condenser and a stirrer was charged 120 g of 1-methyl-2-pyrrolidone, followed by heating to 80° C. under nitrogen stream. To the solution was added dropwise a solution containing 33 g of Phosmer PE (produced by Uni-Chemical Co., Ltd.), 65 g of methacrylic acid-3-sulfopropyl ester potassium salt, 14 g of M-2 having the structure shown below, 7 g of Blenmer GLM (produced by NOF Corp.), 0.73 g of V-601 (produced by Wako Pure Chemical Industries, Ltd.) and 120 g of 1-methyl-2-pyrrolidone over a period of 2 hours. After the completion of the dropwise addition, the solution was further stirred for 2 hours. The reaction solution was cooled to room temperature to obtain Specific copolymer (II-16).

The introduction of a double bond into a side chain was confirmed by $^1$H-NMR spectrum. As a result of measurement of a weight average molecular weight by a gel permeation chromatography method (GPC) using polyacrylic acid as a standard substance, the weight average molecular weight of the copolymer was 25,000.

TABLE 6

| | Wavelength of Light Source (nm) | Drawing Time per Pixel (μsec) | Sensitivity (mJ/cm$^2$) | Stain-Preventing Property | Stain-Preventing Property After Being Left | Fine Line Reproducibility (μm) | Printing Durability (number of sheets) | White Lamp Safety (min) |
|---|---|---|---|---|---|---|---|---|
| Example 11 | 405 | 0.9 | 0.18 | 10 | A | 12 | 42,000 | 240 |
| Example 12 | | 0.9 | 0.2 | 9 | A | 12 | 42,000 | 240 |
| Example 13 | | 0.9 | 0.2 | 8 | B | 16 | 30,000 | 240 |
| Example 14 | | 0.9 | 0.23 | 8 | B | 16 | 30,000 | 240 |
| Example 15 | | 0.9 | 0.22 | 8 | B | 12 | 42,000 | 240 |
| Example 16 | 375 | 0.9 | 0.05 | 10 | A | 12 | 42,000 | 240 |
| Example 17 | | 0.9 | 0.07 | 9 | A | 18 | 30,000 | 240 |
| Example 18 | | 100 | 0.07 | 10 | A | 12 | 42,000 | 240 |
| Example 19 | | 100 | 0.15 | 8 | B | 12 | 42,000 | 240 |
| Example 20 | | 1,000 | 0.15 | 8 | B | 12 | 42,000 | 240 |
| Comparative Example 3 | 405 | 0.9 | 0.2 | 3 | C | 20 | 5,000 | 240 |
| Comparative Example 4 | 375 | 0.9 | 0.2 | 1 | D | 20 | 4,000 | 180 |

From the results shown above, it can be seen that all of the fine line reproducibility, printing durability, stain resistance and on-machine developing property are excellent according to the lithographic printing plate precursor and lithographic printing method according to the invention.

Synthesis Example of Specific Copolymer (II-2)

In a 1 liter three-necked flask equipped with a condenser and a stirrer was charged 120 g of 1-methyl-2-pyrrolidone, followed by heating to 80° C. under nitrogen stream. To the solution was added dropwise a solution containing 33 g of Phosmer PE (produced by Uni-Chemical Co., Ltd.), 65 g of Structure of M-2

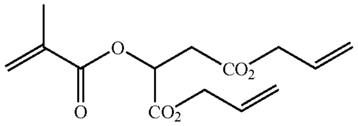

Example 21

<Formation of Undercoat Layer>

Undercoat solution (5) shown below was coated on the support described above by a bar and dried in an oven at 100° C. for 60 seconds to form an undercoat layer having a dry coating amount of 10 mg/$m^2$.

Undercoat Solution (5)

| | |
|---|---|
| Specific copolymer (II-2) | 0.017 g |
| Methanol | 9.00 g |
| Water | 1.00 g |

<Formation of Photopolymerizable Layer and Protective Layer)

The photopolymerizable layer and protective layer were formed on the above-described support provided with the undercoat layer in the same manner as in Example 1 to prepare a lithographic printing plate precursor.

Examples 22 to 25

An undercoat layer was formed in the same manner as in Example 21 except for changing Specific copolymer (II-2) in Undercoat solution (5) to the specific copolymer shown in Table 7 below and the same photopolymerizable layer and protective layer as in Example 21 were formed on the undercoat layer to prepare each lithographic printing plate precursor.

TABLE 7

| | Specific Copolymer |
|---|---|
| Example 22 | II-3 |
| Example 23 | II-6 |
| Example 24 | II-16 |
| Example 25 | II-22 |

Comparative Example 5

For Comparative Example 5, a lithographic printing plate precursor was prepared in the same manner as in Example 21 except for not providing the undercoat layer.

Example 26

<Formation of Undercoat Layer>

Undercoat solution (6) shown below was coated on the support described above by a bar and dried in an oven at 100° C. for 60 seconds to form an undercoat layer having a dry coating amount of 10 mg/$m^2$.

Undercoat Solution (6)

| | |
|---|---|
| Specific copolymer (II-1) | 0.017 g |
| Methanol | 9.00 g |
| Water | 1.00 g |

<Formation of Photopolymerizable Layer and Protective Layer>

The photopolymerizable layer and protective layer were formed on the above-described support provided with the undercoat layer in the same manner as in Example 6 to prepare a lithographic printing plate precursor.

Examples 27 to 30

An undercoat layer was formed in the same manner as in Example 21 except for changing Specific copolymer (II-2) in Undercoat solution (5) to the specific copolymer shown in Table 8 below and the same photopolymerizable layer and protective layer as in Example 21 were formed on the undercoat layer to prepare each lithographic printing plate precursor.

TABLE 8

| | Specific Copolymer |
|---|---|
| Example 27 | II-7 |
| Example 28 | II-9 |
| Example 29 | II-18 |
| Example 30 | II-25 |

Comparative Example 6

For Comparative Example 6, a lithographic printing plate precursor was prepared in the same manner as in Example 26 except for not providing the undercoat layer.

<Exposure and Printing>

Each of the lithographic printing plate precursors obtained in the examples and comparative examples described above was exposed by Trendsetter 3244VX (produced by Creo Co.) equipped with a water-cooled 40 W infrared semiconductor laser under the conditions of power of 9 W, a rotational number of an outer surface drum of 210 rpm and resolution of 2,400 dpi. The exposed image contained a fine line chart.

The exposed lithographic printing plate precursor was mounted without conducting development processing on a plate cylinder of a printing machine (SOR-M, produced by Hyderberg Co.). After supplying dampening water (EU-3 (etching solution, produced by Fuji Photo Film Co., Ltd.)/water/isopropyl alcohol=1/89/10 (volume ratio)) and ink (TRANS-G (N) black ink, produced by Dainippon Ink and Chemicals, Inc.), 100 sheets of printing was conducted at a printing speed of 6,000 sheets per hour.

A number of printing papers required until on-machine development of the unexposed area of the photopolymerizable layer on the printing machine was completed to reach a state where the ink was not transferred to the printing paper in the non-image area was measured as on-machine developing property. As a result, in the case of using any of the lithographic printing plate precursors, prints without stain in the non-image area were obtained within the printing of 100 sheets.

<Evaluation of Lithographic Printing Plate Precursor>

With the lithographic printing plate precursors obtained above, the stain-preventing property, stain-preventing property after being left, fine line reproducibility and printing durability were evaluated in the same manner as in Example 1.

The results are shown in Table 9 below.

TABLE 9

| | Stain-Preventing Property | Stain-Preventing Property After Being Left | Fine Line Reproducibility (μm) | Printing Durability (number of sheets) |
|---|---|---|---|---|
| Example 21 | 10 | A | 16 | 45,000 |
| Example 22 | 10 | A | 16 | 45,000 |
| Example 23 | 9 | A | 18 | 35,000 |
| Example 24 | 10 | A | 16 | 38,000 |
| Example 25 | 8 | B | 18 | 42,000 |
| Example 26 | 10 | A | 25 | 28,000 |
| Example 27 | 10 | A | 30 | 15,000 |
| Example 28 | 10 | A | 25 | 25,000 |
| Example 29 | 9 | A | 16 | 30,000 |
| Example 30 | 10 | A | 20 | 20,000 |
| Comparative Example 5 | 3 | C | 40 | 5,000 |
| Comparative Example 6 | 1 | D | 60 | 5,000 |

Examples 31 to 35

<Formation of Undercoat Layer>

Undercoat solution (7) shown below was coated on the support described above by a bar and dried in an oven at 100° C. for 60 seconds to form an undercoat layer having a dry coating amount of 10 mg/m$^2$.

Undercoat Solution (7)

| | |
|---|---|
| Specific copolymer (shown in Table 10 below) | 0.017 g |
| Methanol | 9.00 g |
| Water | 1.00 g |

TABLE 10

| | Specific Copolymer |
|---|---|
| Example 31 | II-2 |
| Example 32 | II-3 |
| Example 33 | II-11 |
| Example 34 | II-16 |
| Example 35 | II-22 |

<Formation of Photopolymerizable Layer and Protective Layer>

The photopolymerizable layer and protective layer were formed using Coating solution (3) for photopolymerizable layer and Coating solution (2) for protective layer on the above-described undercoat layer in the same manner as in Example 11 to prepare a lithographic printing plate precursor.

Comparative Example 7

For Comparative Example 7, a lithographic printing plate precursor was prepared in the same manner as in Example 31 except for not providing the undercoat layer.

Examples 36 to 40

<Formation of Undercoat Layer>

Undercoat solution (8) shown below was coated on the support described above by a bar and dried in an oven at 100° C. for 60 seconds to form an undercoat layer having a dry coating amount of 10 mg/m$^2$.

Undercoat Solution (8)

| | |
|---|---|
| Specific copolymer (shown in Table 11 below) | 0.017 g |
| Methanol | 9.00 g |
| Water | 1.00 g |

TABLE 11

| | Specific Copolymer |
|---|---|
| Example 36 | II-1 |
| Example 37 | II-7 |
| Example 38 | II-22 |
| Example 39 | II-24 |
| Example 40 | II-26 |

<Formation of Photopolymerizable Layer and Protective Layer>

Lithographic printing plate precursors were prepared in the same manner as in Examples 31 to 35 except for changing Coating solution (3) for photopolymerizable layer to Coating solution (4) for photopolymerizable layer described in Example 16, respectively.

Comparative Example 8

For Comparative Example 8, a lithographic printing plate precursor was prepared in the same manner as in Example 36 except for not providing the undercoat layer.

<Exposure and Printing>

The lithographic printing plate precursor was exposed by a semiconductor laser of 375 nm or 405 nm under the conditions of power of 2 mW, a circumferential length of an outer surface drum of 900 mm, a rotational number of the outer surface drum of 800 rpm and resolution of 2,400 dpi. The drawing time per pixel is shown in Table 12 below.

The exposed lithographic printing plate precursor was mounted without conducting development processing on a plate cylinder of a printing machine (SOR-M, produced by Hyderberg Co.). After supplying dampening water (EU-3 (etching solution, produced by Fuji Photo Film Co., Ltd.)/water/isopropyl alcohol=1/89/10 (volume ratio)) and ink (TRANS-G (N) black ink, produced by Dainippon Ink and Chemicals, Inc.), 100 sheets of printing was conducted at a printing speed of 6,000 sheets per hour. As a result, removal of the unexposed area of the photopolymerizable layer was completed on the printing machine and prints without stain in the non-image area were obtained <Evaluation of Lithographic Printing Plate Precursor>

The stain-preventing property, stain-preventing property after being left, fine line reproducibility, printing durability, sensitivity and white lamp safety were evaluated in the same manner as in Examples 11. The results of evaluations are shown in Table 12 below.

TABLE 12

| | Wavelength of Light Source (nm) | Drawing Time per Pixel (μsec) | Sensitivity ($mJ/cm^2$) | Stain-Preventing Property | Stain-Preventing Property After Being Left | Fine Line Reproducibility (μm) | Printing Durability (number of sheets) | White Lamp Safety (min) |
|---|---|---|---|---|---|---|---|---|
| Example 31 | 405 | 0.9 | 0.18 | 10 | A | 12 | 42,000 | 240 |
| Example 32 | | 0.9 | 0.2 | 9 | A | 12 | 42,000 | 240 |
| Example 33 | | 0.9 | 0.2 | 7 | B | 14 | 31,000 | 240 |
| Example 34 | | 0.9 | 0.23 | 8 | A | 14 | 36,000 | 240 |
| Example 35 | | 0.9 | 0.22 | 7 | B | 12 | 42,000 | 240 |
| Example 36 | 375 | 0.9 | 0.05 | 10 | A | 14 | 30,000 | 240 |
| Example 37 | | 0.9 | 0.07 | 9 | A | 12 | 35,000 | 180 |
| Example 38 | | 100 | 0.07 | 7 | B | 14 | 30,000 | 180 |
| Example 39 | | 100 | 0.15 | 9 | A | 12 | 40,000 | 180 |
| Example 40 | | 1,000 | 0.15 | 10 | A | 16 | 25,000 | 180 |
| Comparative Example 7 | 405 | 0.9 | 0.2 | 3 | C | 20 | 5,000 | 240 |
| Comparative Example 8 | 375 | 0.9 | 0.2 | 1 | D | 20 | 4,000 | 180 |

From the results shown above, it can be seen that all of the fine line reproducibility, printing durability, stain resistance and on-machine developing property are excellent according to the lithographic printing plate precursor and lithographic printing method according to the invention.

This application is based on Japanese Patent application JP 2005-53542, filed Feb. 28, 2005, and Japanese Patent application JP 2005-54293, filed Feb. 28, 2005, the entire contents of which are hereby incorporated by reference, the same as if set forth at length.

What is claimed is:

1. A lithographic printing plate precursor capable of forming an image without alkali development, comprising a hydrophilic support and a laser-sensitive photopolymerizable layer, wherein the photopolymerizable layer or other layer included in the lithographic printing plate precursor contains a copolymer containing at least a repeating unit having at least one ethylenically unsaturated bond and a repeating unit having at least two functional groups capable of interacting with a surface of the support or a copolymer containing at least a repeating unit having at least two ethylenically unsaturated bonds and a repeating unit having at least one functional group capable of interacting with a surface of the support.

2. The lithographic printing plate precursor as claimed in claim 1, wherein the copolymer further contains a repeating unit having at least one hydrophilic functional group.

3. The lithographic printing plate precursor as claimed in claim 1, wherein the photopolymerizable layer contains an infrared absorbing agent.

4. The lithographic printing plate precursor as claimed in claim 2, wherein the photopolymerizable layer contains an infrared absorbing agent.

5. The lithographic printing plate precursor as claimed in claim 1, wherein the photopolymerizable layer contains a microcapsule.

6. The lithographic panting plate precursor as claimed in claim 2, wherein the photopolymerizable layer contains a microcapsule.

7. The lithographic printing plate precursor as claimed in claim 1, wherein the photopolymerizable layer contains a surfactant.

8. The lithographic printing plate precursor as claimed in claim 5, wherein the microcapsule has an average particle size of from 0.01 to 3.0 μm.

9. The lithographic printing plate precursor as claimed in claim 1, wherein the other layer is an undercoat layer provided between the support and the photopolymerizable layer and the undercoat layer contains the copolymer.

10. A lithographic printing method comprising:

loading the lithographic printing plate precursor as claimed in claim 1 on a printing machine and conducting imagewise laser exposure to the loaded lithographic printing plate precursor, or conducting imagewise laser exposure to the lithographic printing plate precursor as claimed in claim 1 and loading the exposed lithographic printing plate precursor on a printing machine; and supplying printing ink and dampening water to the lithographic printing plate precursor to remove a laser unexposed area of the photopolymerizable layer of the lithographic printing plate precursor and conducting printing.

11. A lithographic printing plate precursor capable of forming an image without alkali development, comprising a hydrophilic support and a laser-sensitive photopolymerizable layer, wherein the photopolymerizable layer or other layer included in the lithographic printing plate precursor contains a copolymer containing at least a repeating unit having at least one ethylenically unsaturated bond, a repeating unit having at least two functional groups capable of interacting with a surface of the support, and a repeating unit having at least one hydrophilic group or a copolymer containing at least a repeating unit having at least two ethylenically unsaturated bonds, a repeating unit having at least one functional group capable of interacting with a surface of the support, and a repeating unit having at least one hydrophilic group.

* * * * *